(12) United States Patent
Yano et al.

(10) Patent No.: US 8,285,954 B2
(45) Date of Patent: Oct. 9, 2012

(54) MEMORY SYSTEM MANAGING A PLURALITY OF LOGS

(75) Inventors: Junji Yano, Minato-ku (JP); Hidenori Matsuzaki, Minato-ku (JP); Kosuke Hatsuda, Minato-ku (JP); Toshikatsu Hida, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/530,467

(22) PCT Filed: Feb. 10, 2009

(86) PCT No.: PCT/JP2009/052597
§ 371 (c)(1),
(2), (4) Date: Nov. 17, 2009

(87) PCT Pub. No.: WO2009/110303
PCT Pub. Date: Sep. 11, 2009

(65) Prior Publication Data
US 2010/0138591 A1  Jun. 3, 2010

(30) Foreign Application Priority Data

Mar. 1, 2008 (JP) ................................. 2008-051459
Mar. 1, 2008 (JP) ................................. 2008-051466
Mar. 1, 2008 (JP) ................................. 2008-051468

(51) Int. Cl.
*G06F 12/02* (2006.01)
(52) U.S. Cl. .. 711/162; 711/156; 711/203; 711/E12.008
(58) Field of Classification Search .................. 711/161, 711/162, 165, 203, 202, 154, 112, 113, 114, 711/E12.002, E12.001, E12.008, 156
See application file for complete search history.

(56) References Cited

U.S. PATENT DOCUMENTS
6,591,329 B1    7/2003   Kakinuma et al.
(Continued)

FOREIGN PATENT DOCUMENTS
JP           5-94356          4/1993
(Continued)

OTHER PUBLICATIONS

Extended Search Report issued Nov. 17, 2010 in European Patent Application No. 09716194.7-1233/2118756.

(Continued)

*Primary Examiner* — Pierre-Michel Bataille
(74) *Attorney, Agent, or Firm* — Oblon, Spivak, McClelland, Maier & Neustadt, L.L.P.

(57) ABSTRACT

A memory system includes a nonvolatile memory including a plurality of blocks, a volatile memory storing management information including a storage position of data stored in the nonvolatile memory, a management information writing unit, and a management information storing unit. The management information writing unit is configured to update, when the storage position of data is changed in the nonvolatile memory, the management information stored in the volatile memory. The management information storing unit is configured to, before writing data to the nonvolatile memory, store a first log including an update schedule of the management information in the nonvolatile memory and, after writing data to the nonvolatile memory, store a second log including an update result of the management information in the nonvolatile memory, wherein the management information storing unit is configured to store the first log and the second log in the same-numbered page of the different two blocks.

20 Claims, 33 Drawing Sheets

U.S. PATENT DOCUMENTS

| | | | |
|---|---|---|---|
| 6,665,815 B1 | 12/2003 | Goldstein et al. | |
| 8,195,713 B2 * | 6/2012 | Miyazaki et al. | 707/803 |
| 2005/0050271 A1 * | 3/2005 | Honda et al. | 711/114 |
| 2005/0097288 A1 * | 5/2005 | Holzmann | 711/162 |
| 2005/0240813 A1 | 10/2005 | Okada et al. | |
| 2006/0224636 A1 | 10/2006 | Kathuria et al. | |
| 2008/0104361 A1 | 5/2008 | Ippongi | |
| 2010/0169551 A1 * | 7/2010 | Yano et al. | 711/103 |
| 2010/0205353 A1 * | 8/2010 | Miyamoto et al. | 711/103 |

FOREIGN PATENT DOCUMENTS

| | | |
|---|---|---|
| JP | 2004 192789 | 7/2004 |
| JP | 2005-242897 | 9/2005 |
| JP | 2006 285600 | 10/2006 |
| WO | WO 99/32977 | 7/1999 |

OTHER PUBLICATIONS

U.S. Appl. No. 12/555,274, filed Sep. 8, 2009, Kanno, et al.
U.S. Appl. No. 12/559,893, filed Sep. 15, 2009, Miyamoto, et al.
U.S. Appl. No. 12/563,624, filed Sep. 21, 2009, Miyamoto.
U.S. Appl. No. 12/563,856, filed Sep. 21, 2009, Yano, et al.
U.S. Appl. No. 12/566,236, filed Sep. 24, 2009, Yano, et al.
U.S. Appl. No. 12/646,100, filed Dec. 23, 2009, Yonezawa, et al.
U.S. Appl. No. 13/238,675, filed Sep. 21, 2011, Norimatsu, et al.
U.S. Appl. No. 13/326,872, filed Dec. 15, 2011, Hirao, et al.
U.S. Appl. No. 13/328,420, filed Dec. 16, 2011, Yonezawa, et al.

* cited by examiner

AFTER LOWER ORDER PAGE WRITING AND BEFORE HIGHER ORDER PAGE WRITING

BEFORE HIGHER ORDER PAGE WRITING AND AFTER ADJACENT CELL WRITING

AFTER HIGHER ORDER PAGE WRITING

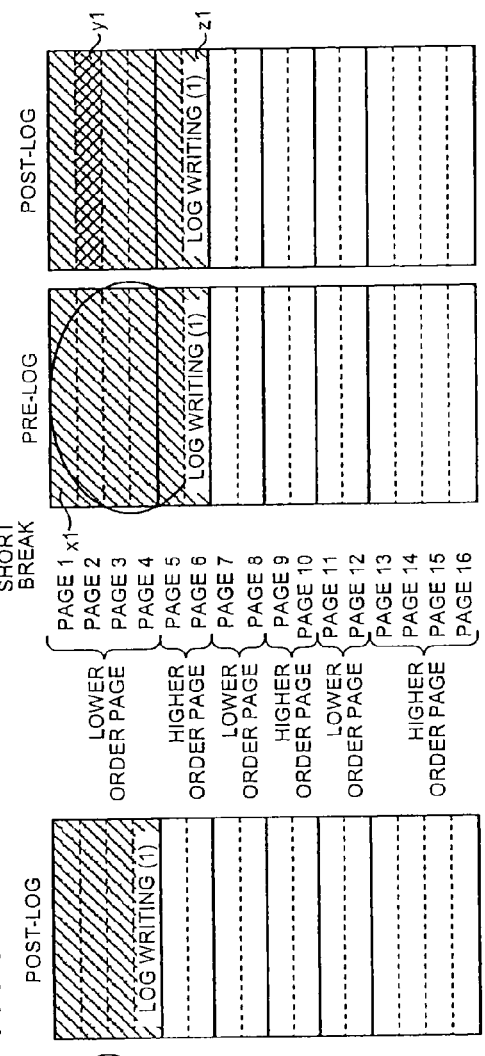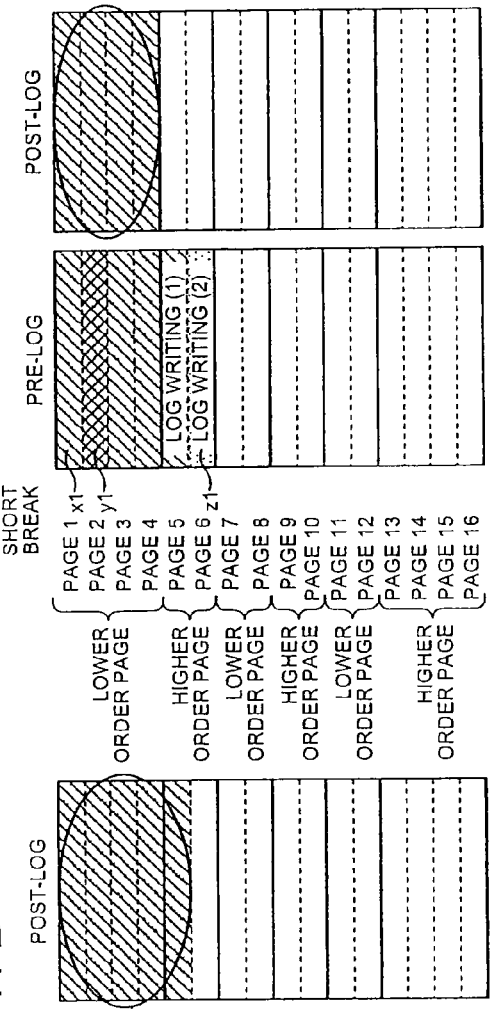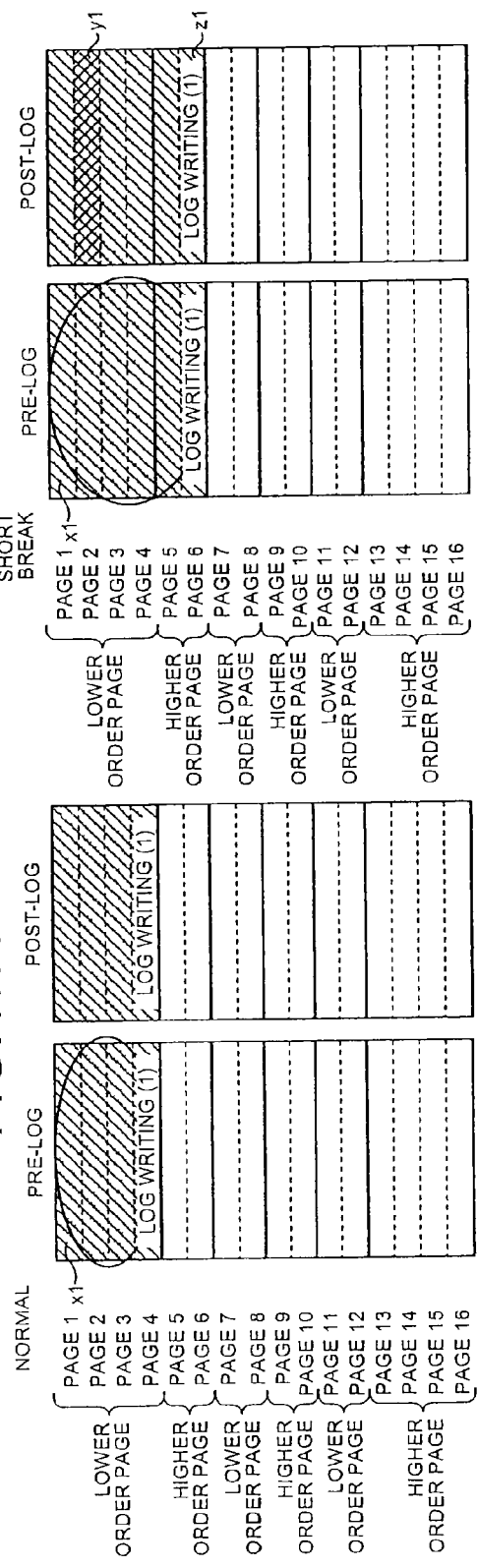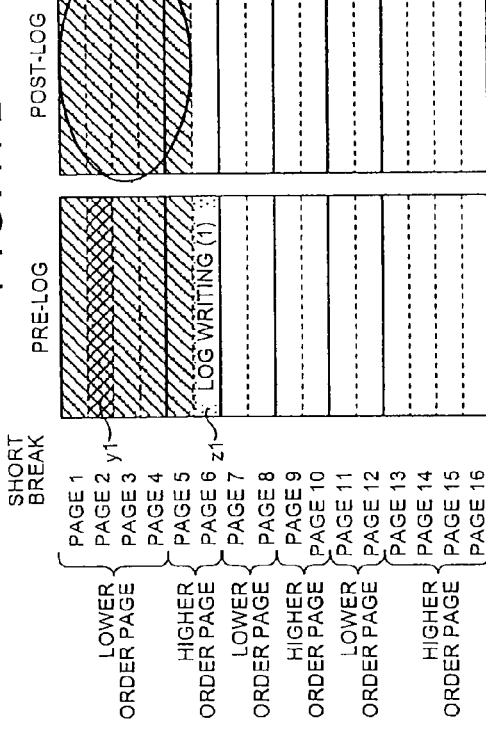

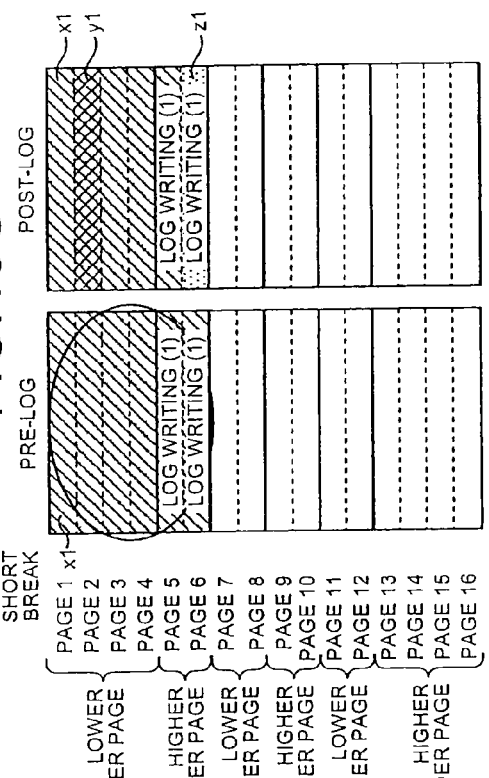
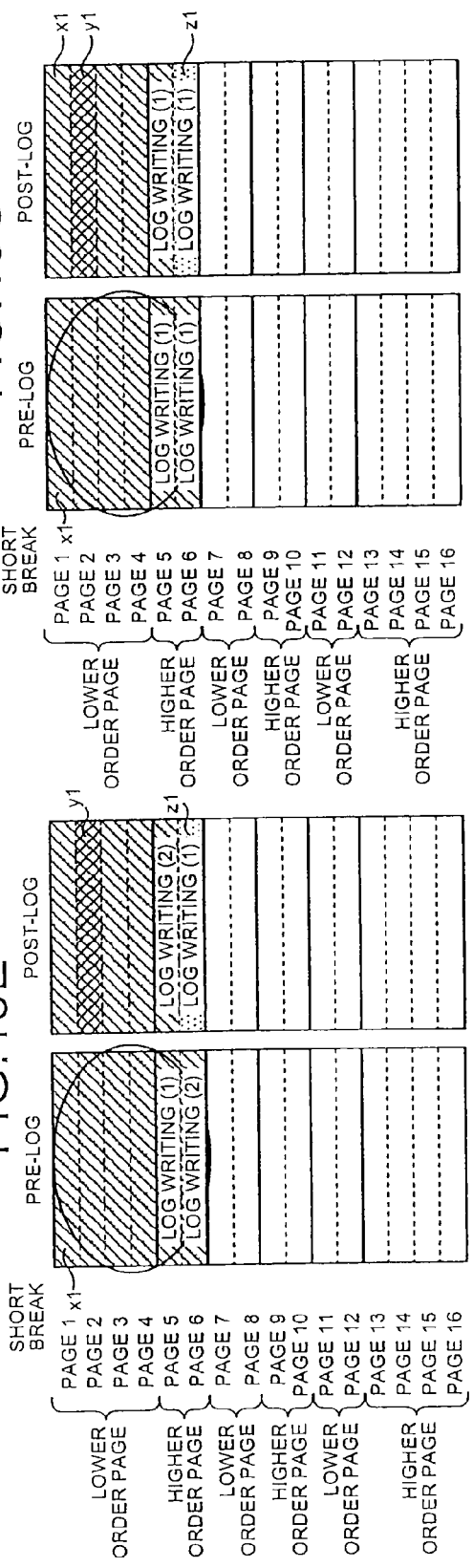
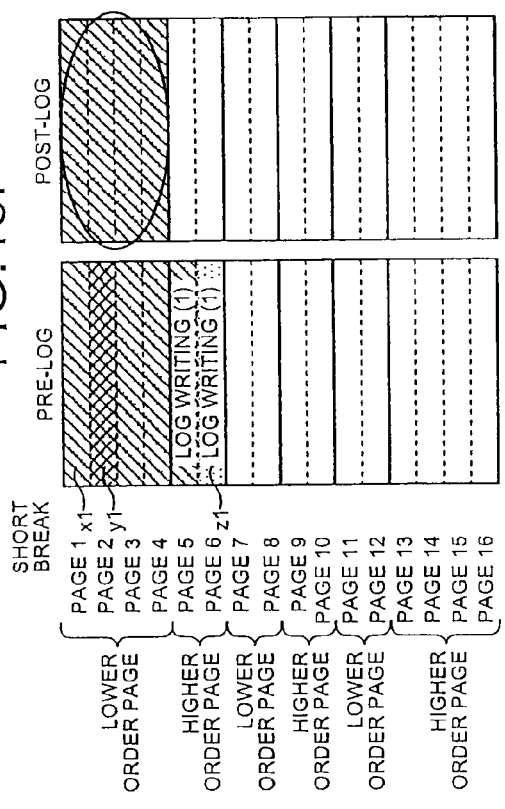

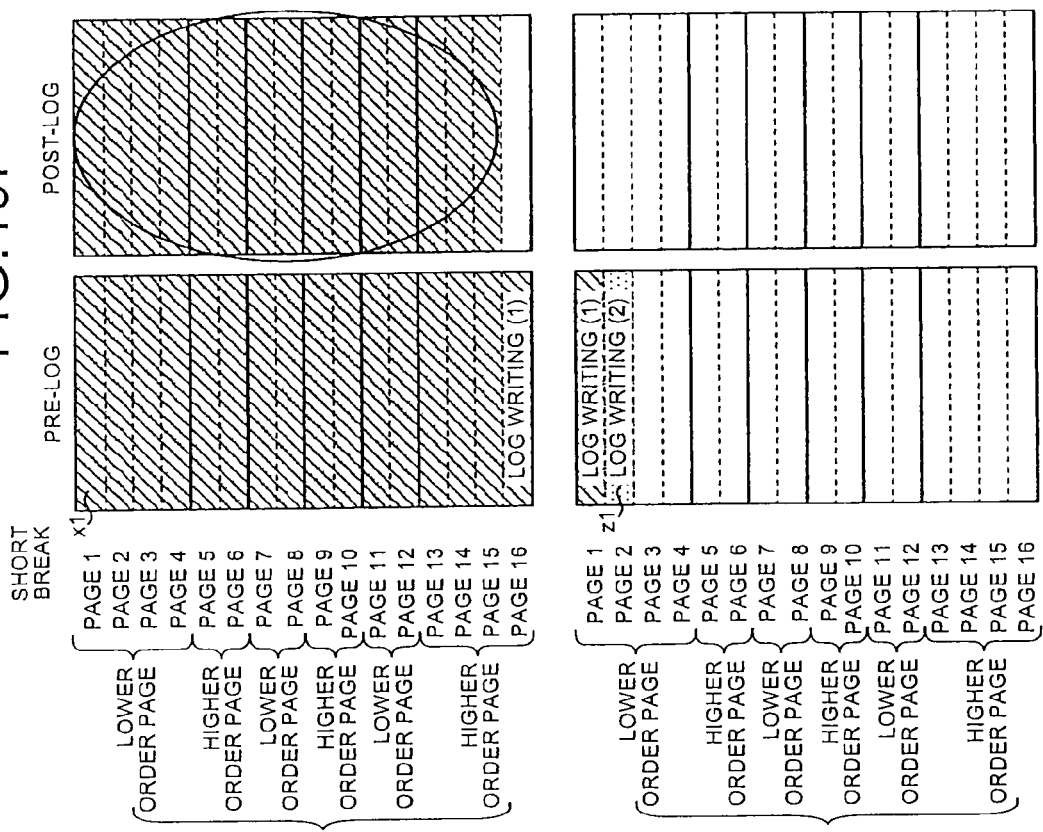
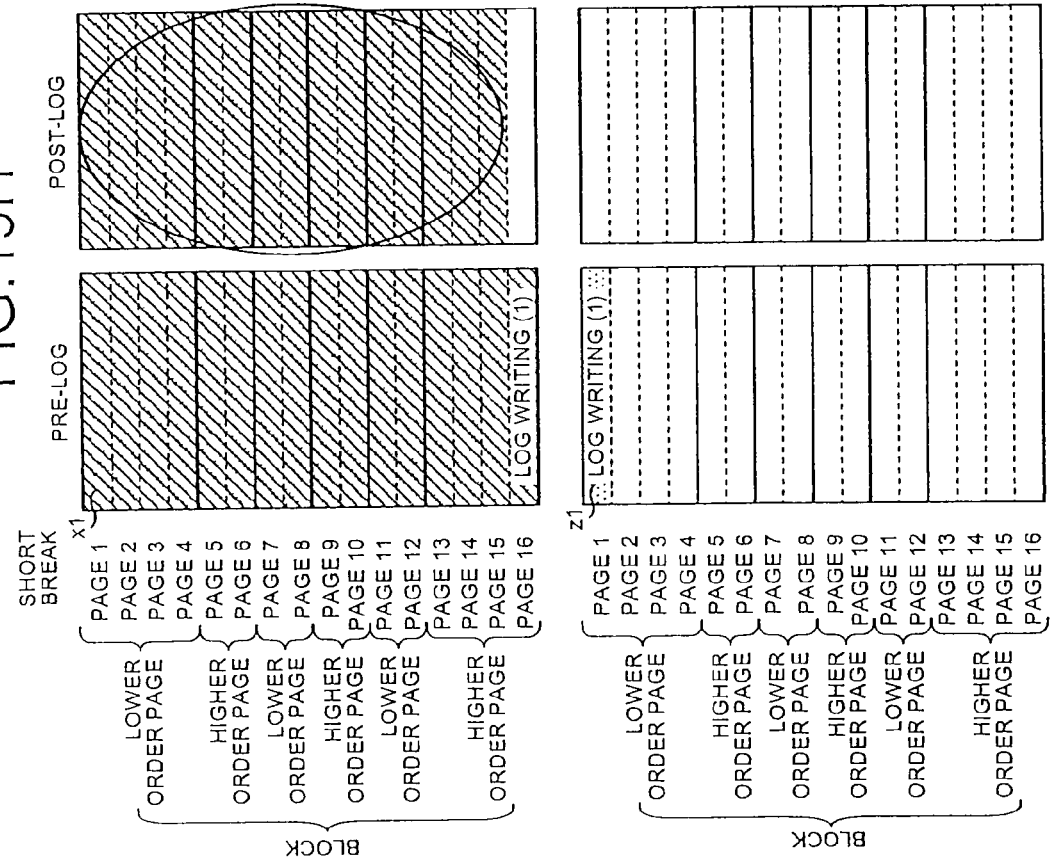

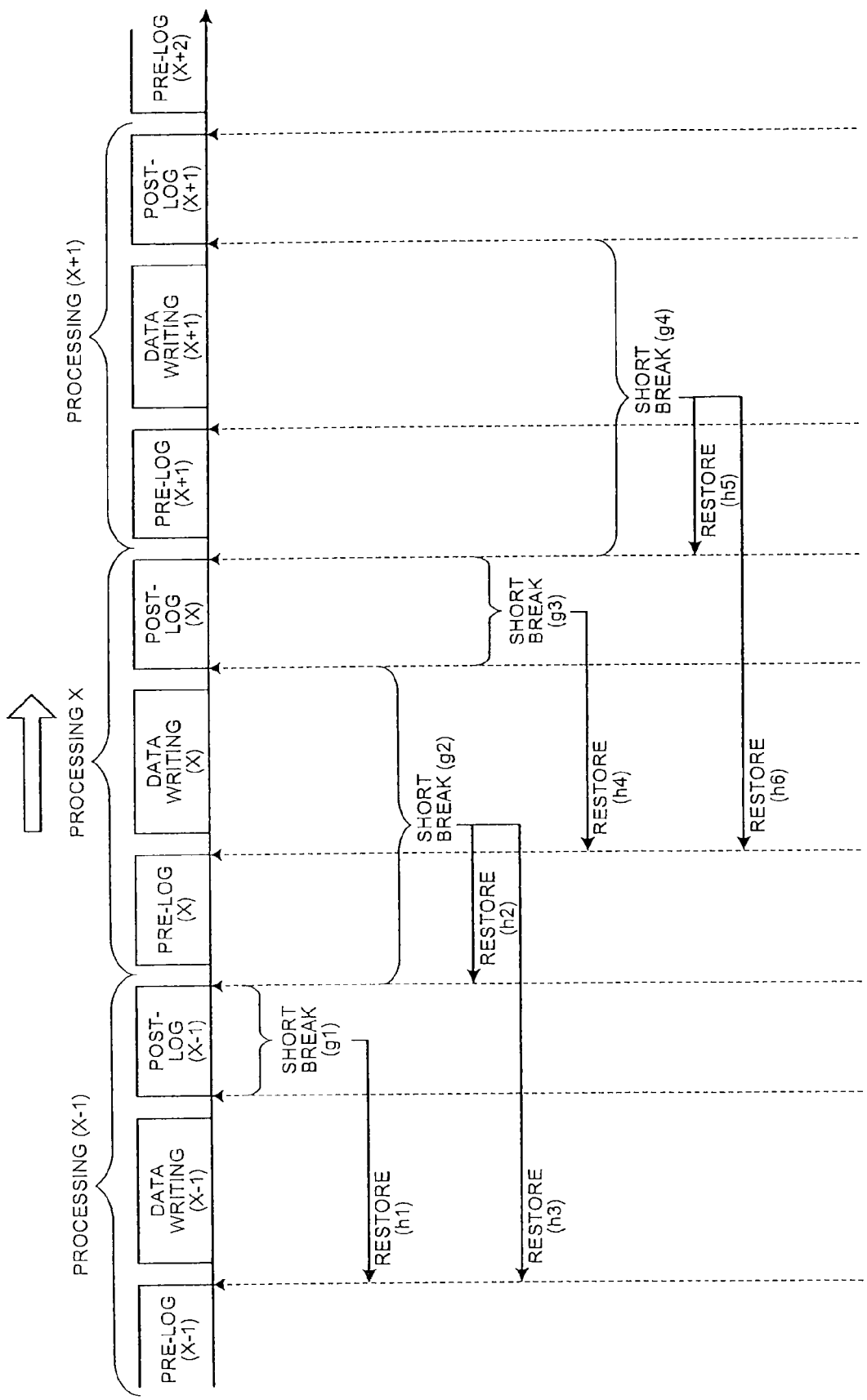

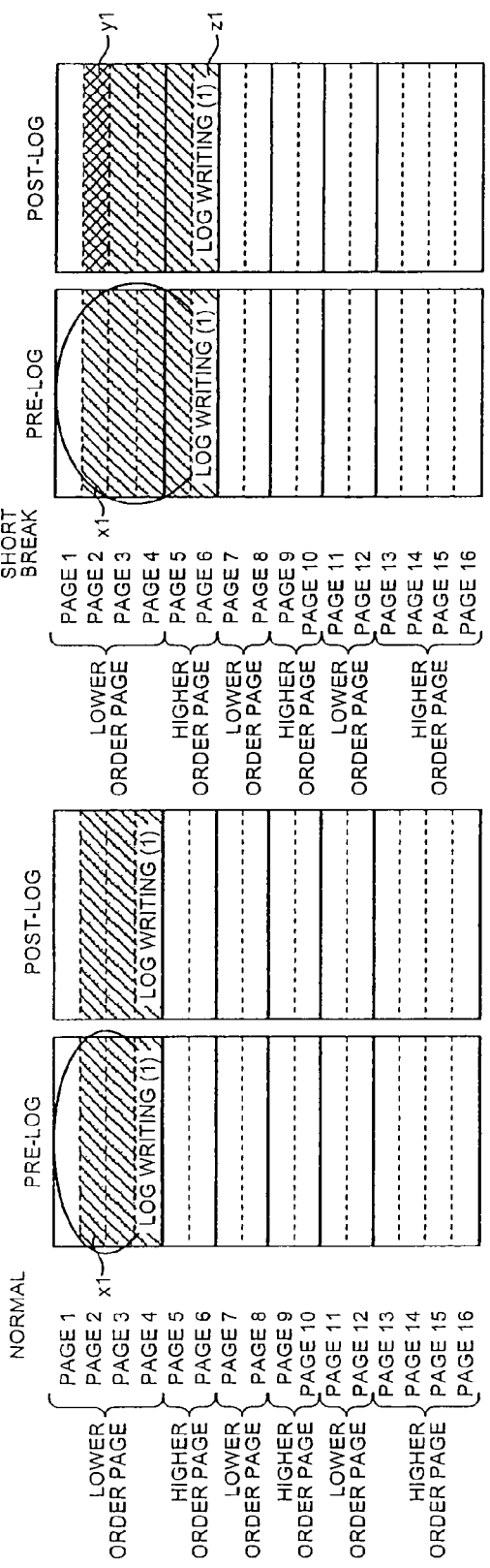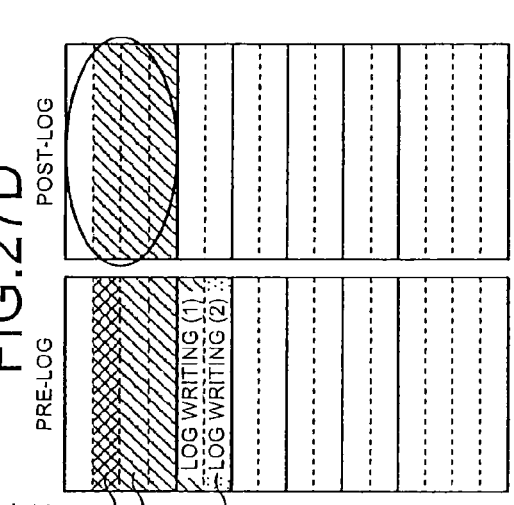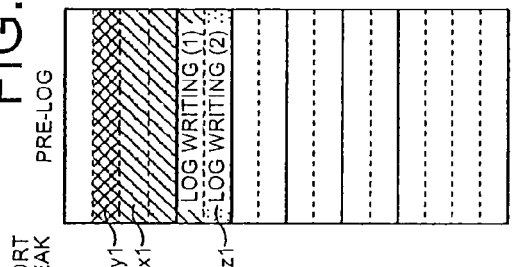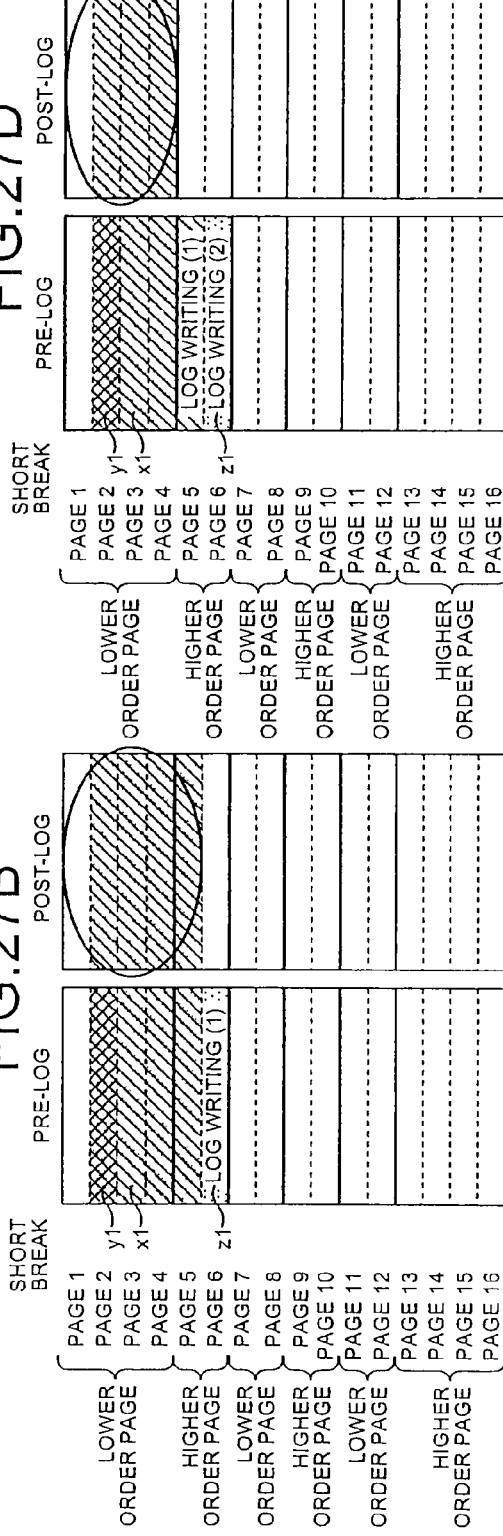

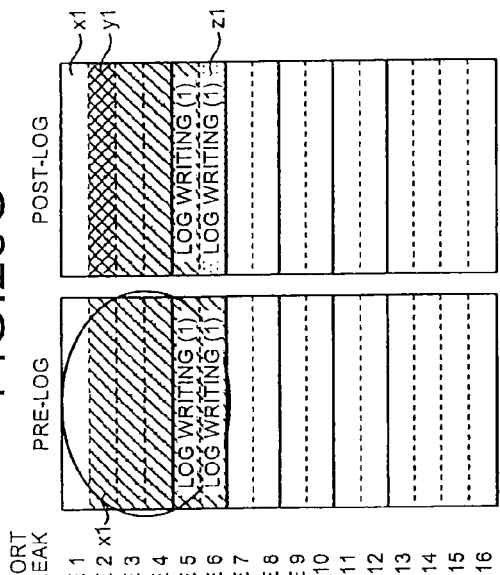
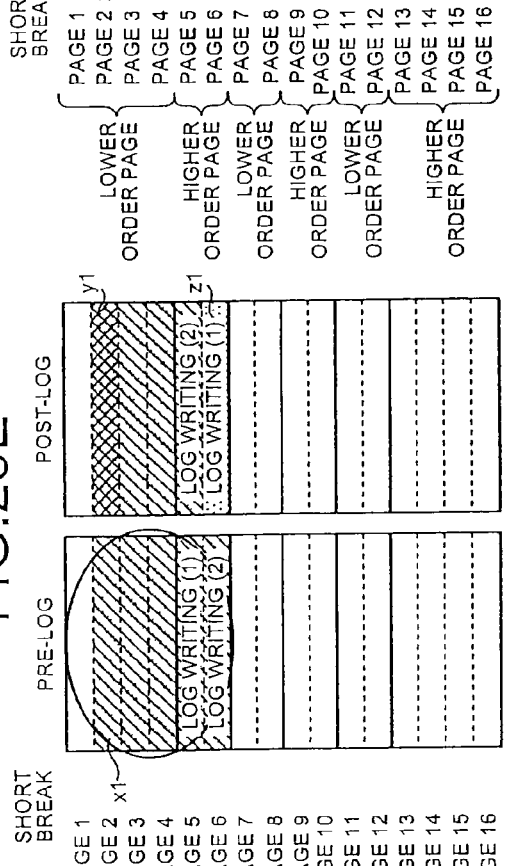
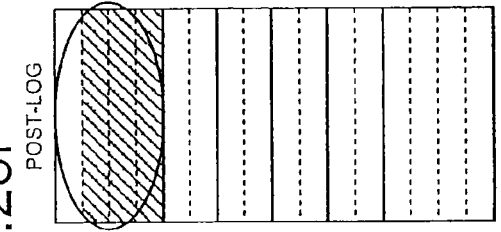
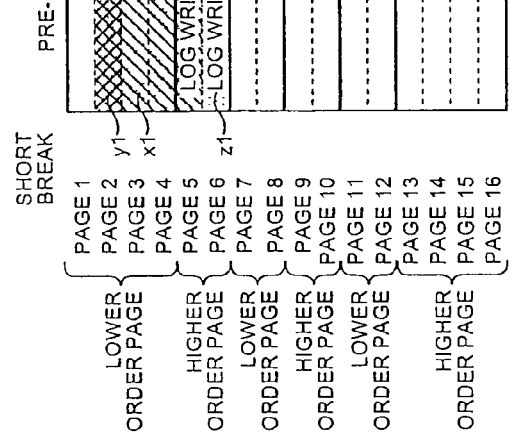

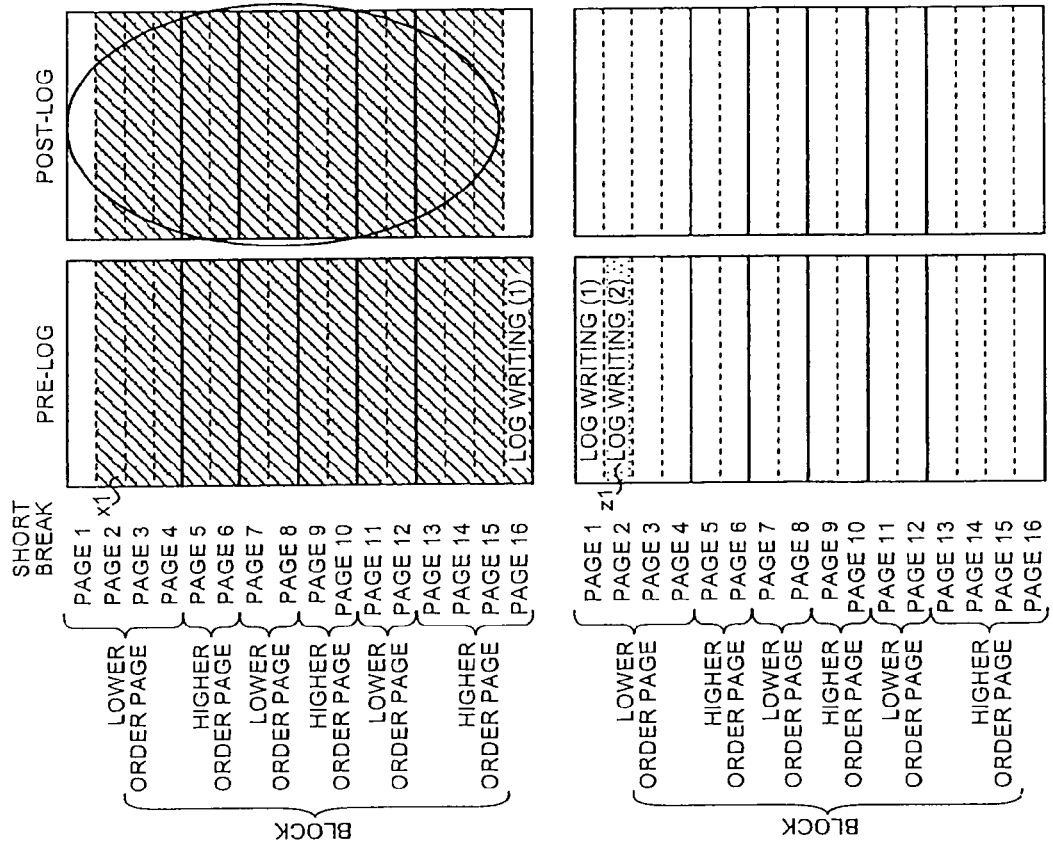
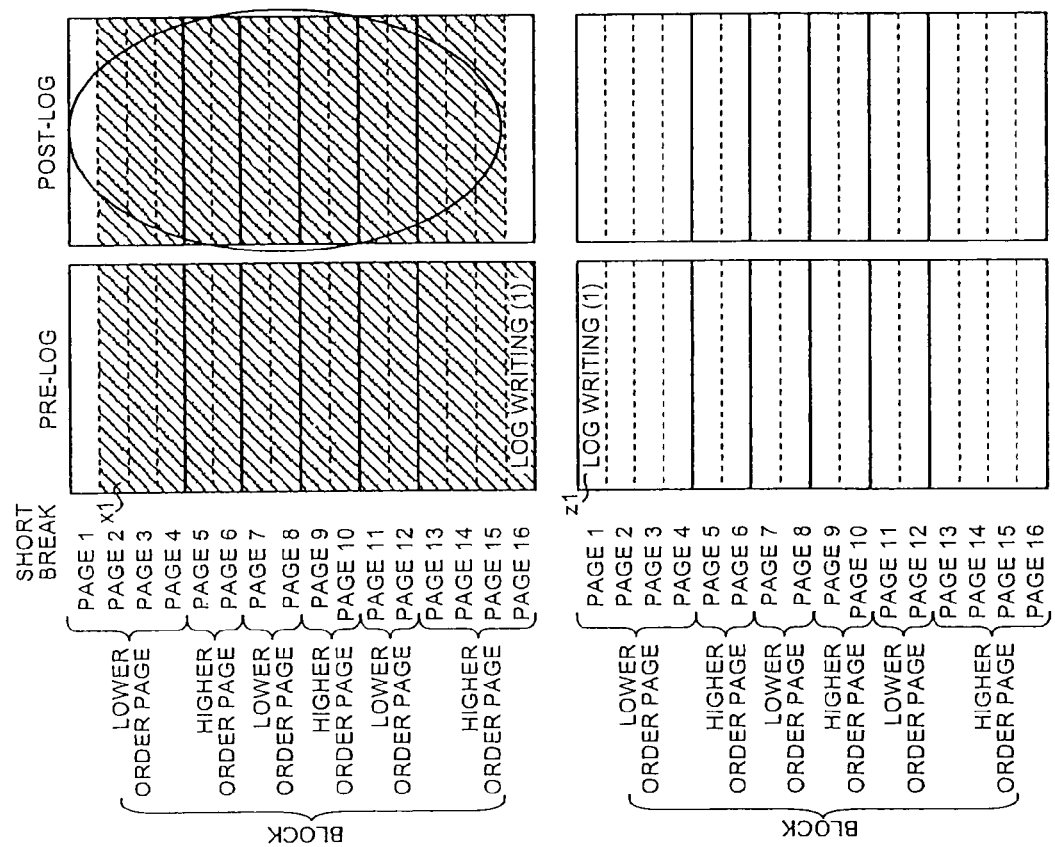

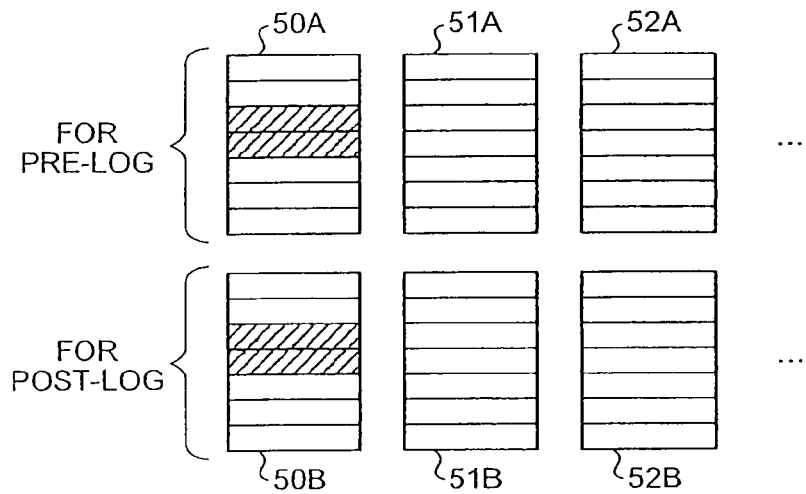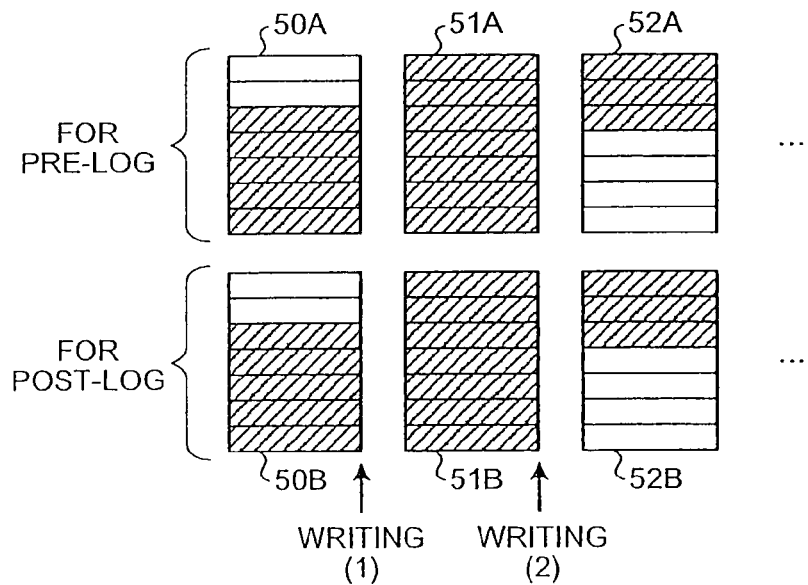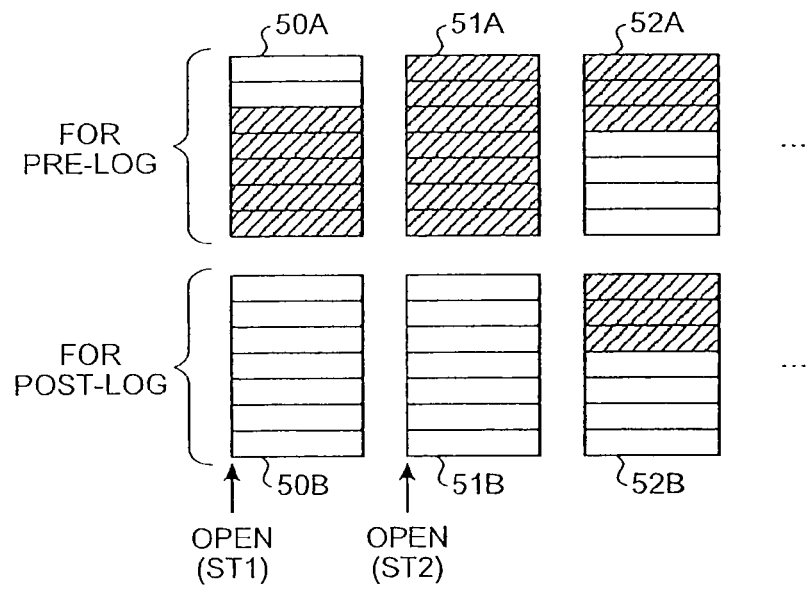

MEMORY SYSTEM MANAGING A PLURALITY OF LOGS

CROSS-REFERENCE TO RELATED APPLICATIONS

This application is based upon and claims the benefit of priority from International Application No. PCT/JP2009/052597, filed on Feb. 10, 2009, Japanese Patent Application No. 2008-51466, filed on Mar. 1, 2008, Japanese Patent Application No. 2008-51468, filed on Mar. 1, 2008, and Japanese Patent Application No. 2008-51459, filed on Mar. 1, 2008; the entire contents of all of which are incorporated herein by reference.

TECHNICAL FIELD

The present invention relates to a memory system employing a nonvolatile semiconductor storage device.

BACKGROUND ART

Some personal computers (PC) employ a hard disk device as a secondary storage device. In such PCs, a technology is known for backing up data that has been stored in the hard disk device to prevent the data from becoming invalid because of some failure. For example, when act of changing data in the hard disk device is detected, a snapshot as a backup copy of the data before the change is taken and a log of changes made to the data is generated. Then, processing for taking a new snapshot, invalidating a log taken in the past before the new snapshot was taken, and generating a new log is repeated at every predetermined time (see, for example, US Patent Application Publication No. 2006/0224636). In case data becomes invalid due to some reason, the data can be restored by referring to the snapshot and the log. There are typically two types of logs: pre-log and post-log. The pre-log is a log that is generated, before update of data, as an update plan indicating how the data is going to be updated. On the other hand, the post-log is a log for approving, after the data is actually updated, updating of the data.

In recent years, a capacity of a NAND flash memory as a nonvolatile semiconductor storage device has been increased dramatically. As a result, PCs including a memory system having the NAND flash memory as a secondary storage device have been put to practical use. For example, in the NAND flash memory, data writing and readout are performed in page size units and data erasing is performed in block size units. Therefore, in the NAND flash memory, the pre-log and the post-log are written in various pages of various blocks, respectively. A technique for storing a plurality of data (multi-value data) equal to or larger than 2 bits in one memory cell (a multi-value memory technology) is sometimes employed to the NAND flash memory (see, for example, JP-A 2004-192789 (KOKAI)). Therefore, in PCs that incorporate a NAND flash memory, processing for resetting the PC from abnormal isolation or the like of a power supply is difficult or data cannot be restored.

DISCLOSURE OF INVENTION

According to an aspect of the present invention, there is provided a memory system comprises a volatile first storing unit; a nonvolatile second storing unit including a memory cell that can store therein data; and a controller that performs data transfer between a host apparatus and the second storing unit via the first storing unit, stores management information including a storage position of the data stored in the second storing unit during a startup operation into the first storing unit, and performs, while updating stored management information, data management in the first and second storing units based on the stored management information. The management information in a latest state stored in the first storing unit is also stored in the second storing unit and read from the second storing unit by the controller during the startup operation. The management information includes a snapshot in which the first management information of the first storing unit is stored when a predetermined condition is satisfied, a pre-log as difference information before and after the management information is changed, the pre-log being generated before a change occurs in the management information, and a post-log concerning the change in the management information, the post-log being generated after the change occurs in the management information. The second storing unit stores therein the pre-log and the post-log in a same area in the respective erasing unit areas.

According to another aspect of the present invention, there is provided a memory system including a volatile first storing unit; a nonvolatile second storing unit including a memory cell that can store data; and a controller that performs data transfer between a host apparatus and the second storing unit via the first storing unit, stores management information including a storage position of the data stored in the second storing unit during a startup operation into the first storing unit, and performs, while updating stored management information, data management in the first and second storing units based on the stored management information. The management information in a latest state stored in the first storing unit is also stored in the second storing unit and read from the second storing unit by the controller during the startup operation. The management information includes a snapshot in which the first management information of the first storing unit is stored when a predetermined condition is satisfied, a pre-log as difference information before and after the management information is changed, the pre-log being generated before a change occurs in the management information, and a post-log concerning the change in the management information, the post-log being generated after the change occurs in the management information. The second storing unit stores therein, in order from a continuous area of the pre-log and a continuous area of the post-log respectively already stored before the snapshot in different erasing unit areas in the second storing unit are stored, the pre-log and the post-log in a same area in the respective erasing unit areas.

According to still another aspect of the present invention, there is provided a memory system including a volatile first storing unit; a nonvolatile second storing unit including a memory cell that can store multi-value data; and a controller that performs data transfer between a host apparatus and the second storing unit via the first storing unit, stores management information including a storage position of the data stored in the second storing unit during a startup operation into the first storing unit, and performs, while updating the stored management information, data management in the first and second storing units based on the stored management information. The second storing unit also stores therein the management information that has been stored in a latest state into the first storing unit. The management information in the latest state is read by the controller during the startup operation and includes a snapshot in which the first management information of the first storing unit is stored when a predetermined condition is satisfied, a pre-log as difference information before and after the management information is changed, the pre-log being acquired before a change occurs in the management information, and a post-log as difference information before and after the change of the management information, the post-log being acquired after the change occurs in the management information.

BRIEF DESCRIPTION OF DRAWINGS

FIGS. 17A to 17D are diagrams (1) for explaining a selection method for logs used for restoration of management information;

FIGS. 18E to 18G are diagrams (2) for explaining the selection method for logs used for restoration of management information;

FIGS. 19H and 19I are diagrams (3) for explaining the selection method for logs used for restoration of management information;

FIG. 20 is a diagram for explaining a pre-log or a post-log to be extracted;

FIGS. 27A to 27D are diagrams (1) for explaining a selection method for logs used for restoration of management information;

FIGS. 28E to 28G are diagrams (2) for explaining the selection method for logs used for restoration of management information;

FIGS. 29H and 29I are diagrams (3) for explaining the selection method for logs used for restoration of management information;

FIGS. 30A to 30C is a diagram for explaining the order of storing pre and post logs and order of opening the post-log of a data managing unit according to a fifth embodiment of the present invention;

BEST MODE(S) FOR CARRYING OUT THE INVENTION

Exemplary embodiments of memory systems according to the present invention are explained in detail below with reference to the accompanying drawings. The present invention is not limited by these embodiments.

First Embodiment

A memory system according to a first embodiment of the present invention is a system that stores data using a memory cell transistor (a NAND memory 12 explained later) that is a multi-value memory. Moreover, this memory system stores logs before data writing processing and after the data writing processing as logs for the data writing processing (difference information for management information of the memory system). The log stored before the data writing processing is referred to as pre-log and the log stored after the data writing processing is referred to as post-log. In the first embodiment, the pre-log and the post-log are created in the same size and they are stored in the same page (position) of different blocks. The pre-log and the post-log are stored in order from a top page of the blocks and contain the same information. When abnormal isolation (e.g., a short break) of a power supply or the like occurs, management information is restored to a state before the abnormal isolation of the power supply by using the pre-log or the post-log. In the first embodiment, the abnormal isolation of the power supply is assumed to be a short break.

Figure 1:
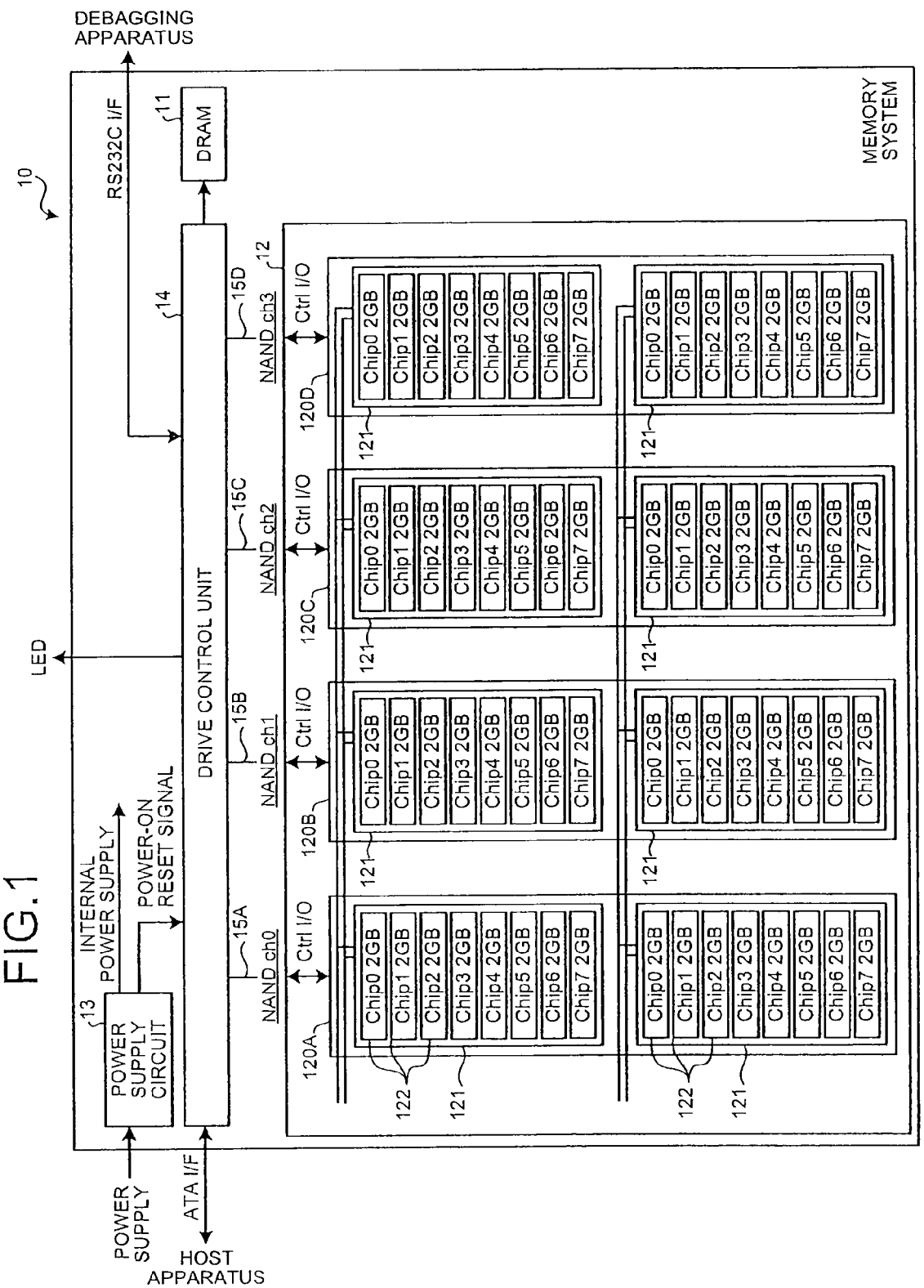
FIG. 1 is a block diagram of an example of a configuration of a memory system according to a first embodiment of the present invention.

An overview of the memory system according to the first embodiment is given first. Thereafter, characteristics and modifications of the memory system are explained. The memory system includes a nonvolatile semiconductor storage device and is used as a secondary storage device (SSD: Solid State Drive) of a host apparatus such as a personal computer. The memory system has a function of storing data requested by a host apparatus to be written and reading out data requested by the host apparatus to be read out and outputting the data to the host apparatus. FIG. 1 is a block diagram of an example of a configuration of a memory system 10 according to the first embodiment. This memory system 10 includes a DRAM (Dynamic Random Access Memory) 11 as a first storing unit, a NAND flash memory (hereinafter, "NAND memory") 12 as a second storing unit, a power supply circuit 13, and a drive control unit 14 as a controller.

The DRAM 11 is used as a storing unit for data transfer, management information recording, or a work area. Specifically, when the DRAM 11 is used as a storing unit for data transfer, the DRAM 11 is used for temporarily storing data requested by the host apparatus to be written before the data is written in the NAND memory 12, and the DRAM 11 is used to read out data requested by the host apparatus to be read out from the NAND memory 12 and temporarily storing the read data. When the DRAM 11 is used as a storing unit for management information recording, the DRAM 11 is used for storing management information for managing storage positions of data stored in the DRAM 11 and the NAND memory 12. When the DRAM 11 is used as a storing unit for a work area, the DRAM 11 is used, for example, during expansion of pre and post logs (a pre-log and a post-log) used when management information is restored.

The NAND memory 12 is used as a storing unit for storing therein data. Specifically, the NAND memory 12 stores therein data designated by the host apparatus and stores therein, for backup, management information managed by the DRAM 11. In FIG. 1, the NAND memory 12 that includes four channels 120A to 120D has been shown as an example. Each of the channels 120A to 120D includes two packages 121 each including eight chips 122 having a storage capacity of a predetermined size (e.g., 2 GB). The channels 120A to 120D are connected via the drive control unit 14 and buses 15A to 15D.

The power supply circuit 13 receives external power supply and generates a plurality of internal power supplies to be supplied to respective units of the memory system 10 from the external power supply. The power supply circuit 13 detects a state of the external power supply, i.e., a rising edge or a falling edge, and generates a power-on reset signal based on the detected state, and outputs the power-on reset signal to the drive control unit 14.

The drive control unit 14 controls the DRAM 11 and the NAND memory 12. As explained in detail later, for example, the drive control unit 14 performs restoration processing for management information and storage processing for management information according to the power-on reset signal from the power supply circuit 13. The drive control unit 14 transmits and receives data to and from a host apparatus via an ATA interface (I/F) and transmits and receives data to and from a debugging apparatus via an RS232C I/F. Furthermore, the drive control unit 14 outputs a control signal for controlling on/off of an LED for state display provided on the outside of the memory system 10.

Figure 2:
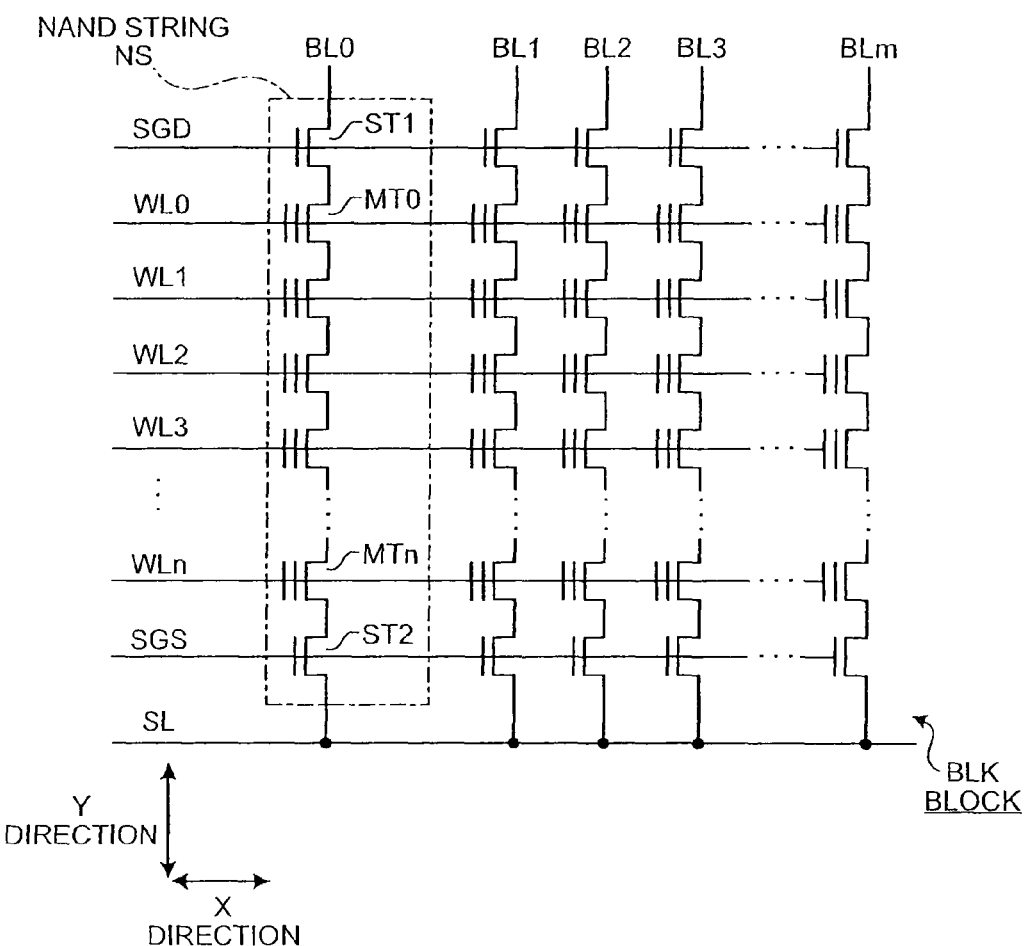
FIG. 2 is a circuit diagram of an example of a configuration of an arbitrary block of a NAND memory.

A configuration of the NAND memory 12 is explained in detail below. The NAND memory 12 is configured by arraying a plurality of blocks (erasing unit areas), which are units of data erasing, on a substrate. FIG. 2 is a circuit diagram of an example of a configuration of an arbitrary block of the NAND memory 12. In FIG. 2, left-right direction is set as an X direction and a direction perpendicular to the X direction is set as a Y direction.

Each block BLK of the NAND memory 12 includes (m+1) (m is an integer equal to or larger than 0) NAND strings NS arrayed in order along the X direction. Each NAND string NS has (n+1) (n is an integer equal to or larger than 0) memory cell transistors MT0 to MTn that share a diffusion region (a source region or a drain region) between memory cell transistors MT adjacent to each other in the Y direction. Moreover, the memory cell transistors MT0 to MTn are connected in series in the Y direction. In addition, selection transistors ST1 and ST2 arranged at both ends of a row of the (n+1) memory transistors MT0 to MTn.

Each memory cell transistors MT0 to MTn is a MOSFET (Metal Oxide Semiconductor Field Effect Transistor) having a stacked gate structure formed on a semiconductor substrate. The stacked gate structure includes a charge accumulation layer (a floating gate electrode) formed on the semiconductor substrate via a gate insulating film and a control gate electrode formed on the charge accumulating layer via an inter-gate insulating film. Moreover, the memory cell transistors MT0 to MTn are multi-value memories in which a threshold voltage changes according to the number of electrons accumulated in the floating gate electrode and 2 or more bit data can be stored depending on the difference in the threshold voltage.

Although the memory cell transistors MT0 to MTn are explained to be multi-value memories, the memory cell transistors MT0 to MTn can be binary memories that store 1-bit data. It is assumed in following explanation that memory cell transistors MT0 to MTn are multi-value memories that can store quaternary values. However, the memory cell transistors MT0 to MTn can be multi-value memories that can store values larger than the quaternary values.

Word lines WL0 to WLn are respectively connected to the control gate electrodes of the memory cell transistors MT0 to MTn of each NAND string NS. Memory cell transistors MTi (i=0 to n) in each of the NAND strings NS are connected in common by the same word lines (i=0 to n). In other words, the control gate electrodes of the memory cell transistors MTi present on the same row in the block BLK are connected to the same word line WLi. (m+1) memory cell transistors MT1 connected to the same word line WLi are treated as one page. In the NAND memory 12, writing and readout of data are performed in units of a page. Specifically, a group of the (m+1) memory cell transistors MT1 connected to the same word line WLi is a unit that forms one page. In the case of the multi-value memory that can store quaternary values, a group of the memory cell transistors MT1 connected to the same word line WLi forms two pages. When a page in which data is written first is set as a lower order page and a page in which data is written next is set as a higher order page, in the NAND memory 12, writing and readout of data is performed in units of the pages.

Bit lines BL0 to BLm are respectively connected to drains of the (m+1) selection transistors ST1 in one block BLK. A selection gate line SGD is connected in common to gates of the selection transistors ST1 of each NAND string NS.

Sources of the selection transistors ST1 are connected to drains of the memory cell transistors MT0. Similarly, a source line SL is connected in common to sources of the (m+1) selection transistors ST2 in one block BLK. A selection gate line SGS is connected in common to gates of the selection transistors ST2 of each NAND string NS. Drains of the selection transistors ST2 are connected to sources of the memory cell transistors MTn.

Although not shown in the figure, bit lines BLj (j=0 to m) in one block BLK connect drains of the selection transistors ST1 in common between bit lines BLj of other blocks BLK. In other words, the NAND strings NS in the same column in the blocks BLK are connected by the same bit line BLj.

Figure 3A:
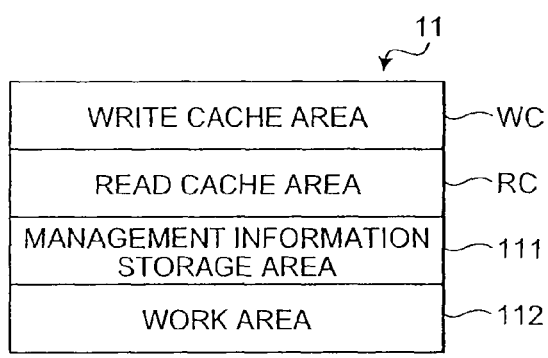
FIG. 3A is a schematic diagram of a functional configuration of a DRAM and FIG. 3B is a schematic diagram of a functional configuration of the NAND memory.
Figure 3B:
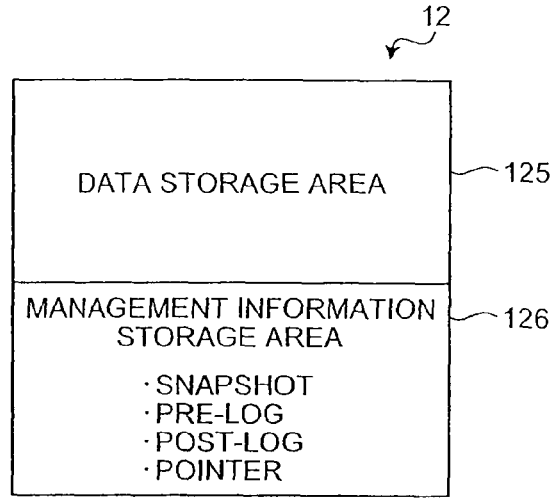

Functional configurations of the DRAM 11 and the NAND memory 12 are explained next. FIG. 3A is a schematic diagram of a functional configuration of the DRAM 11 and FIG. 3B is a schematic diagram of a functional configuration of the NAND memory 12. As shown in FIG. 3A, the DRAM 11 includes a write cache area in which data requested by the host apparatus to be written is stored, a read cache area RC in which data requested by the host apparatus to be read out is stored, a management information storage area 111 in which management information for managing storage positions of data stored in the DRAM 11 and the NAND memory 12 is stored, and a work area 112 used when the management information is restored.

As shown in FIG. 3B, the NAND memory 12 includes a data storage area 125 in which data requested by the host apparatus to be written is stored and a management information storage area 126 in which the management information managed in the management information storage area 111 of the DRAM 11 is stored. In the management information storage area 126, as the management information, a snapshot explained later, a pre-log, a post-log, a pointer 230 explained later, and the like are stored. In this example, a data writing and readout unit in the NAND memory 12 is set as a page size unit. An erasing unit is set as a block size unit (e.g., 512 KB). Therefore, an area for storing respective blocks of the NAND memory 12 managed in block size units is further divided into areas of page size units. When the page size is 4 KB and the block size is 512 KB, then a block contains 128 pages.

Figure 4:
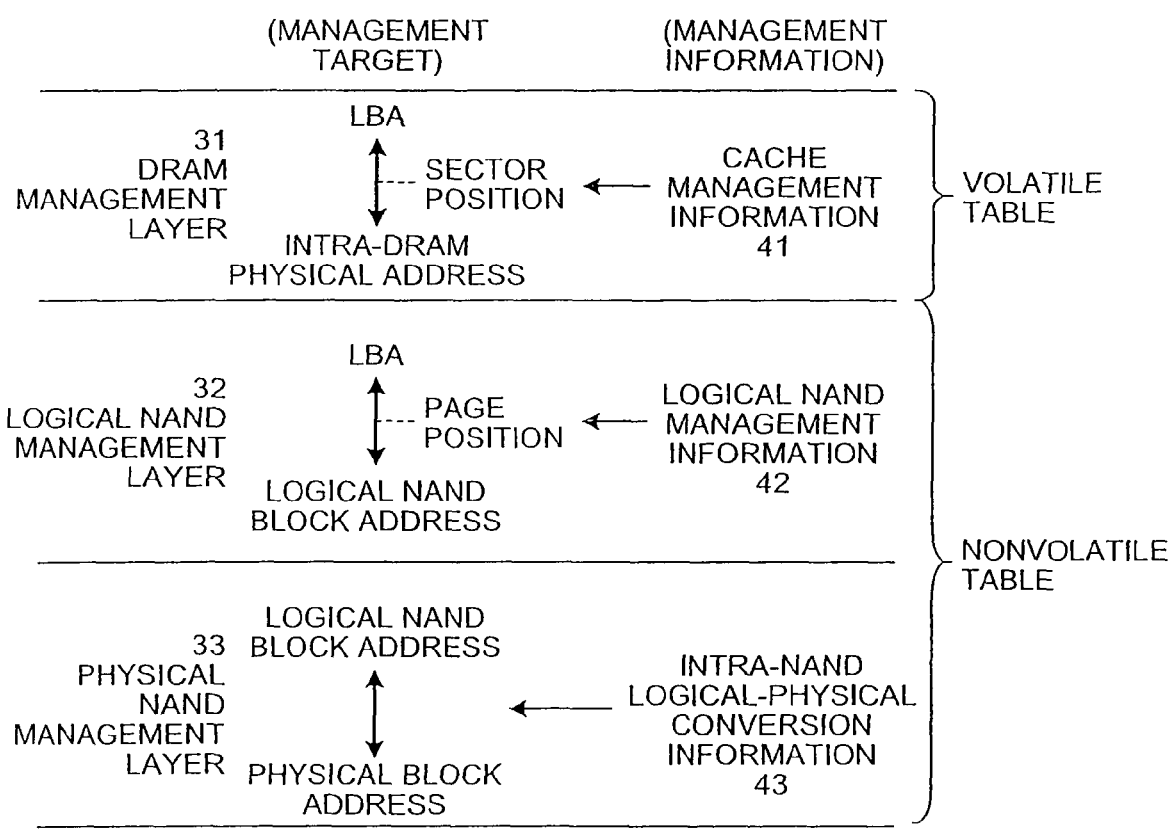
FIG. 4 is a diagram of an example of a layer structure for managing data stored in the memory system.

The management information managed in the management information storage area 111 of the DRAM 11 is explained below. FIG. 4 is a diagram of an example of a layer structure for managing data stored in the memory system 10. It is assumed here that this data is the data requested by the host apparatus to be written or read out. In the memory system 10, data management is performed by a three-layer structure: a DRAM management layer 31, a logical NAND management layer 32, and a physical NAND management layer 33. The DRAM management layer 31 performs data management in the DRAM 11 that plays a role of a cache. The logical NAND management layer 32 performs logical data management in the NAND memory 12. The physical NAND management layer 33 performs physical data management in the NAND memory 12, life extension processing for the NAND memory 12, and the like.

In the write cache area WC and the read cache area RC of the DRAM 11, data designated by a logical address (hereinafter, "LBA (Logical Block Address)") managed by an address managing method of the host apparatus is stored in a physical address in a predetermined range on the DRAM 11 (hereinafter, "intra-DRAM physical address"). Data in the DRAM management layer 31 is managed by cache management information 41 including a correspondence relation between an LBA of data to be stored and the intra-DRAM physical address and a sector flag indicating presence or absence of data in sector size units in a page.

Figure 5:
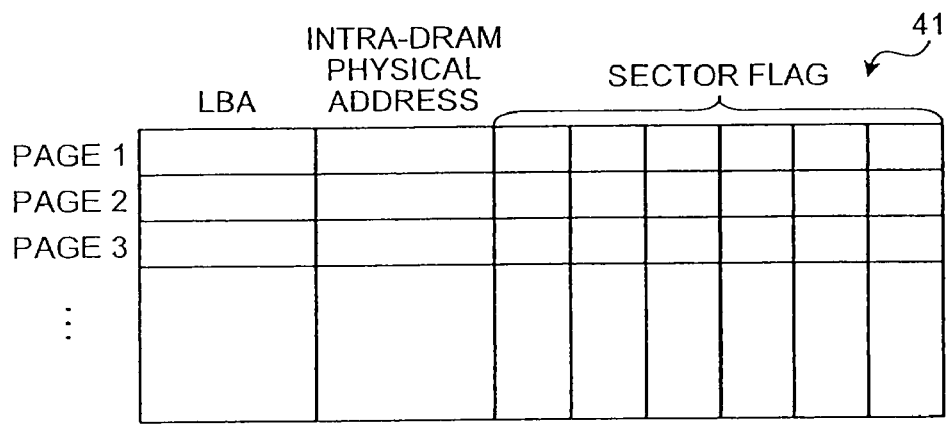
FIG. 5 illustrates an example of a cache management information table.

FIG. 5 illustrates an example of the cache management information 41 in tabular manner. The cache management information 41 is one entry for one area of a one page size of the DRAM 11. The number of entries is equal to or smaller than the number of pages that fit in the write cache area WC and the read cache area RC. In each of the entries, the LBA of data of a page size, the intra-DRAM physical address, and a sector flag indicating a position of valid data in each of areas obtained by dividing this page by a sector size are associated.

In the NAND memory 12, data from the DRAM 11 is stored in a physical address in a predetermined range (hereinafter, "intra-NAND physical address") on the NAND memory 12. In the NAND memory 12 formed by the multi-value memory, because the number of rewritable times is limited, the numbers of times of rewriting among the blocks configuring the NAND memory 12 are controlled by the drive control unit 14 to be equalized. In other words, when update of data written in a certain intra-NAND physical address in the NAND memory 12 is performed, the drive control unit 14 performs control to equalize the numbers of times of rewriting among the blocks configuring the NAND memory 12 to write, in a block different from the original block, data reflecting a portion required to be updated of a block in which the data to be updated is included and invalidate the original block.

As explained above, in the NAND memory 12, processing units are different in the writing and readout processing for data and the erasing processing for data. In the update processing for data, a position (a block) of data before update and a position (a block) of data after update are different. Therefore, in the first embodiment, an intra-NAND logical address used independently in the NAND memory 12 (hereinafter, "intra-NAND logical address") is provided besides the intra-NAND physical address.

Therefore, data in the logical NAND management layer 32 is managed by logical NAND management information 42 indicating a relation between an LBA of data in page size units received from the DRAM 11 and an intra-NAND logical address indicating a logical page position of the NAND memory 12 in which the received data is stored and a relation indicating an address range of a logical block having a size coinciding with that of a block as an erasing unit in the NAND memory 12. A collection of a plurality of the logical blocks can be set as a logical block. Data in the physical NAND management layer 33 is managed by intra-NAND logical address-physical address conversion information (hereinafter, "logical-physical conversion information) including a correspondence relation between the intra-NAND logical address and the intra-NAND physical address in the NAND memory 12.

Figure 6:
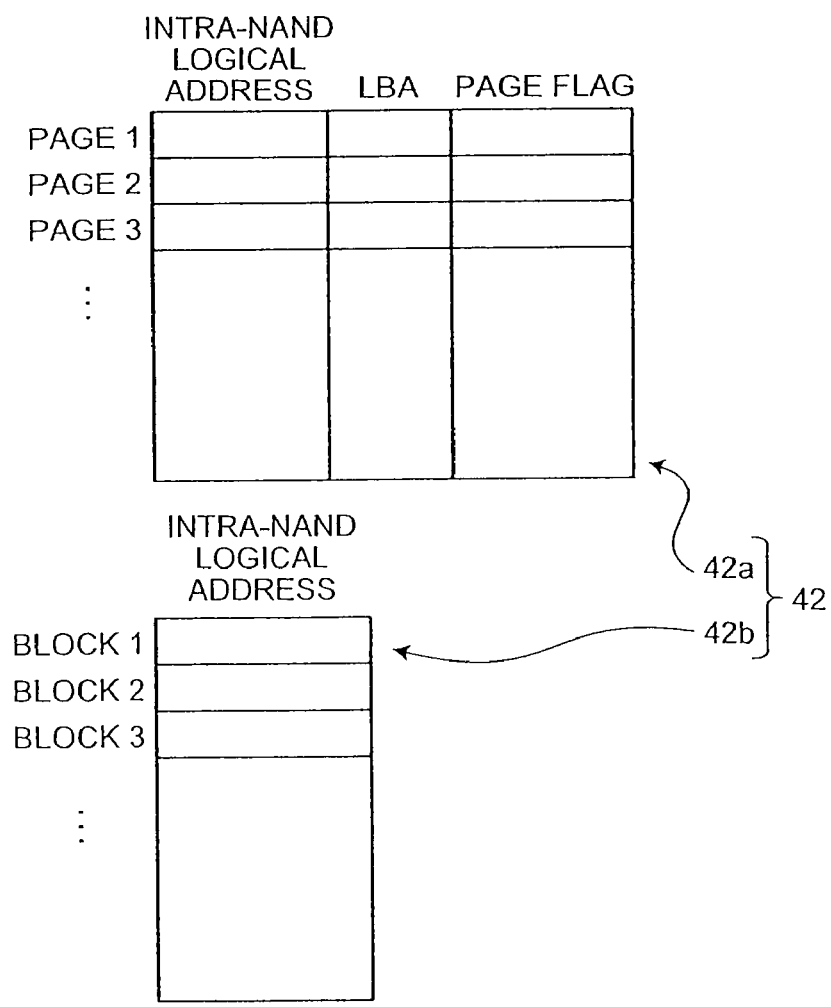
FIG. 6 illustrates an example of a logical NAND management information table.
Figure 7:
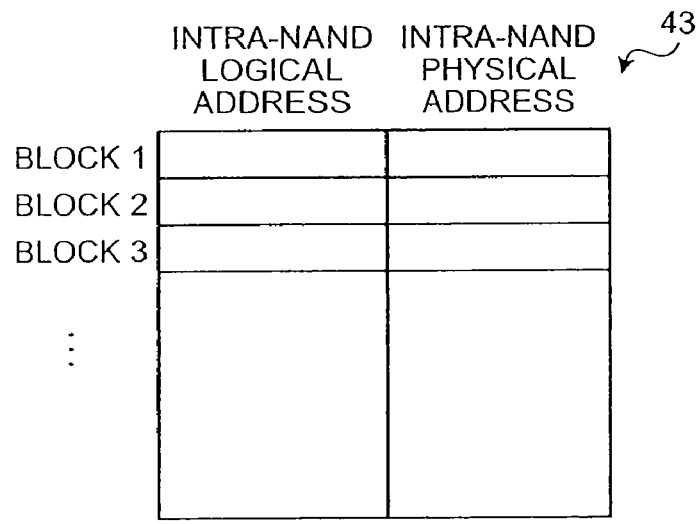
FIG. 7 illustrates an example of an intra-NAND logical-physical conversion information table.

FIG. 6 illustrates an example of the logical NAND management information 42 in tabular manner. FIG. 7 illustrates an example of intra-NAND logical-physical conversion information 43 in tabular manner. As shown in FIG. 6, the logical NAND management information 42 includes logical page management information 42a and logical block management information 42b. The logical page management information 42a has one entry for one logical area of a one page size. Each of entries includes an LBA of data of the one page size, an intra-NAND logical address (a logical NAND block address), and a page flag indicating whether this page is valid. The logical block management information 42b includes an intra-NAND physical address (a physical block address) set for a physical area of the one block size of the NAND memory 12. As shown in FIG. 7, in the intra-NAND logical-physical conversion information 43, the intra-NAND physical address and the inter-NAND logical address of the NAND memory 12 are associated.

By using these kinds of management information, a correspondence of the LBA used in the host apparatus, the intra-NAND logical address used in the NAND memory 12, and the intra-NAND physical address used in the NAND memory 12 can be established. This makes it is possible to exchange data between the host apparatus and the memory system 10.

The management information managed by the DRAM management layer 31 is lost because of power-off or the like so that this management information can be called a volatile table. On the contrary, if the management information managed by the logical NAND management layer 32 and the physical NAND management layer 33 is lost because of power-off or the like, the lost management information hinders successful startup of the memory system 10 so that measures are required to be taken such that the management information is stored even in the event of power-off or the like. Therefore, this management information can be called a nonvolatile table.

This nonvolatile table manages data stored in the NAND memory 12. If the nonvolatile table is not present, information stored in the NAND memory 12 cannot be accessed or data stored in an area is erased. Therefore, the nonvolatile table needs to be stored as latest information in preparation for sudden power-off. Therefore, in the first embodiment, management information including at least the nonvolatile table is stored in the latest state in the management information storage area 126 of the NAND memory 12. The management information storage information stored in the management information storage area 126 of the NAND memory 12 is explained below. The following explanation assumes that only the nonvolatile table is stored in the management information storage area 126.

Figure 8:
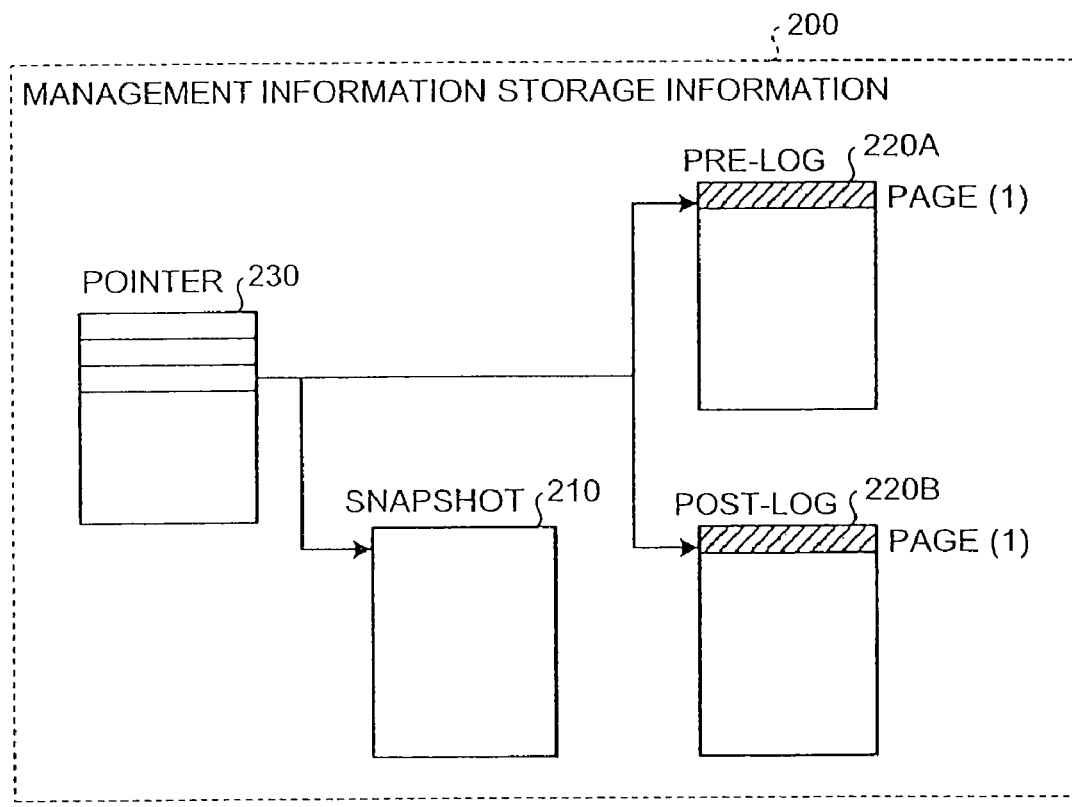
FIG. 8 is a schematic diagram of an example of contents of management information storage information stored in a management information storage area according to the first embodiment.

FIG. 8 is a schematic diagram of an example of contents of the management information storage information 200 stored in the management information storage area 126. The management information storage information 200 contains a snapshot 210 as contents of the nonvolatile table at a certain point, a pre-log 220A, a post-log 220B, and a pointer (management information storage position indication information) 230.

The snapshot 210 is information obtained by storing management information including at least the nonvolatile table at a predetermined point among the kinds of management information stored in the management information storage area 111 of the DRAM 11.

The pre-log 220A and the post-log 220B are difference information between the nonvolatile table after contents are changed when there is a change in contents of the nonvolatile table and the snapshot 210 (or the snapshot 210 and a log already generated). Specifically, a first pre-log 220A and a first post-log 220B after the snapshot 210 is taken are difference information between the nonvolatile table and the snapshot 210. A second or subsequent pre-log 220A after the snapshot 210 is taken is difference information between a combination of the pre-log 220A already generated and the snapshot 210 and the nonvolatile table. A second or subsequent post-log 220B after the snapshot 210 is taken is difference information between a combination of the post-log 220B already generated and the snapshot 210 and the nonvolatile table.

The pre-log 220A is information generated before the management information is actually updated. Therefore, before the management information is actually updated by the execution of data writing processing or the like, the pre-log 220A is generated based on an update schedule concerning how the management information is updated.

The post-log 220B is information generated after the management information is actually updated. Therefore, the post-log 220B is generated after the management information is actually updated according to the execution of data writing processing or the like. In the first embodiment, a data size of the pre-log 220A and a data size of the post-log 220B are the same. The pre-log 220A and the post-log 220B are stored in order from top pages of different blocks, respectively. Consequently, the pre-log 220A and the post-log 220B are stored in the same page of the different blocks. The post-log 220B can be information obtained by copying the pre-log 220A or, like the pre-log 220A, can be difference information between the nonvolatile table and the snapshot 210 calculated based on the nonvolatile table and the snapshot 210 (or the snapshot 210 and a log previously generated).

The pointer 230 indicates the position of the snapshot 210, the position (a first page) of the pre-log 220A acquired first after storage of the snapshot 210, and the position (a first page) of the post-log 220B acquired first after storage of the snapshot 210.

The snapshot 210, the pre-log 220A, the post-log 220B, and the pointer 230 are stored in different blocks. The snapshot 210 is stored in a block for snapshot storage. The snapshot 210 includes the logical NAND management information 42 and the intra-NAND logical-physical conversion information 43 as nonvolatile tables in the management information storage area 126 of the NAND memory 12. When a new snapshot 210 is to be stored, it is stored in a block different from that of the snapshot 210 stored before.

The pre-log 220A and the post-log 220B are stored in log storing blocks, respectively. The pre-log 220A and the post-log 220B are written from top pages of new log storing blocks when a generation of the snapshot 210 changes.

Figure 9:
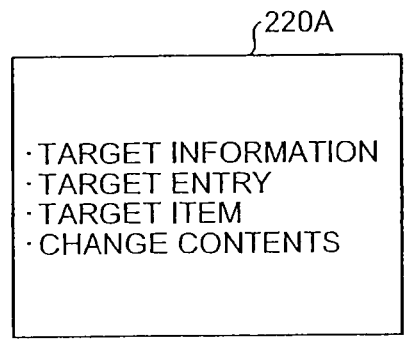
FIG. 9 depicts an example of a log.

FIG. 9 illustrates an example of a log. Because the pre-log 220A and the post-log 220B have the same information, the pre-log 220A is explained as an example of the log. The pre-log 220A includes target information to be management information of a change target, a target entry as an entry to be a change target in the target information, a target item as an item to be a change target in the target entry, and change contents as contents of a change of the target item.

The pointer 230 is stored in an instruction information storage block. The pointer 230 only has to be a pointer that indicates a top address of a block indicating storage positions of the snapshot 210, the pre-log 220A, and the post-log 220B. However, a portion indicating a storage position of the snapshot 210 in the pointer 230 can be a portion that indicates top addresses of respective kinds of management information included in the snapshot 210. The pointer 230 is updated when the snapshot 210 is stored anew or when a snapshot storing block or a log storing block is changed. Pointers of the pre-log 220A and the post-log 220B can be stored in the snapshot 210 rather than in the instruction information storing block.

Figure 10:
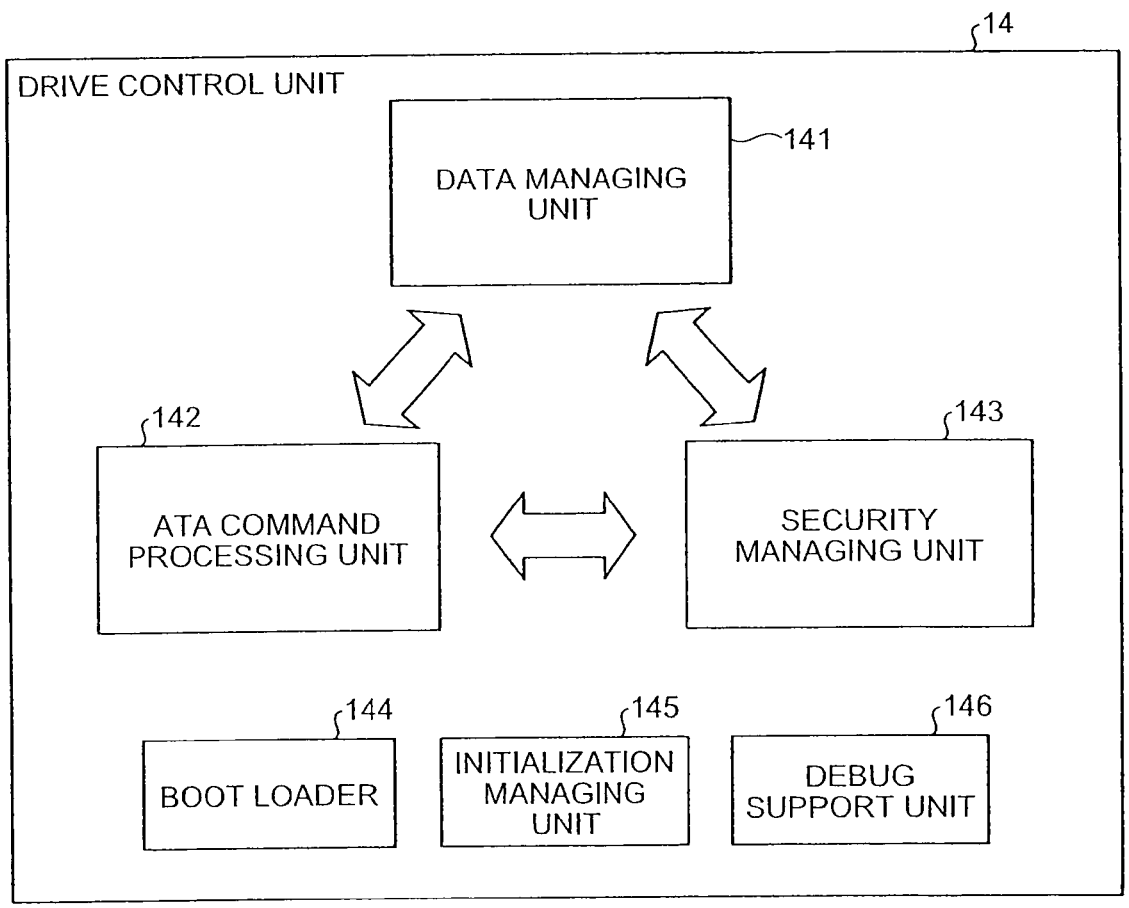
FIG. 10 is a block diagram of an example of a functional configuration of a drive control circuit shown in FIG. 1.

Functions of the drive control unit 14 are explained below. FIG. 10 is a block diagram of an example of a functional configuration of the drive control circuit 14. The drive control unit 14 includes a data managing unit 141, an ATA command processing unit 142, a security managing unit 143, a boot loader 144, an initialization managing unit 145, and a debug support unit 146. The data managing unit 141 performs data transfer between the DRAM 11 and the NAND memory 12 and control of various functions concerning the NAND memory 12. The ATA command processing unit 142 performs data transfer processing in cooperation with the data managing unit 141 based on an instruction received from the ATA interface. The security managing unit 143 manages various kinds of security information in cooperation with the data managing unit 141 and the ATA command processing unit 142. The boot loader 144 loads respective management programs (FW) from the NAND memory 12 to a not shown memory (e.g., an SRAM (Static RAM)) during power-on. The initialization managing unit 145 performs initialization of respective controllers and circuits in the drive control unit 14. The debug support unit 146 processes debug data supplied from the outside via the RS232C interface.

Figure 11:
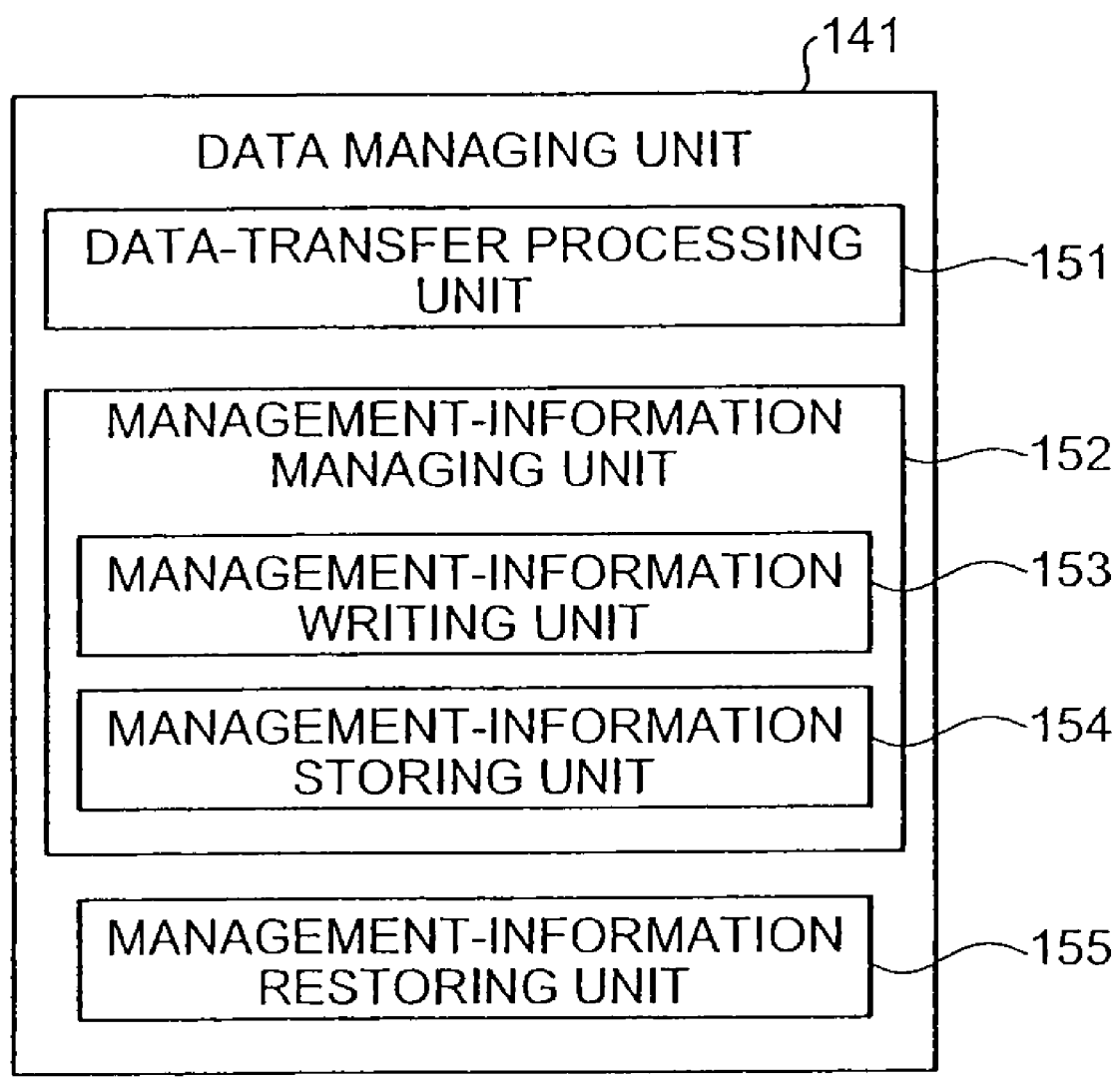
FIG. 11 is a block diagram of an example of a functional configuration of a data managing unit according to the first embodiment.

FIG. 11 is a block diagram of an example of a functional configuration of a data managing unit 141. The data managing unit 141 includes a data-transfer processing unit 151 that performs data transfer between the DRAM 11 and the NAND memory 12, a management-information managing unit 152 that performs change and storage of management information according to a change of data stored in the DRAM 11 and the NAND memory 12, and a management-information restoring unit 155 that restores latest management information based on management information stored during power-on or the like.

The management-information managing unit 152 includes a management-information writing unit 153 and a management-information storing unit 154. The management-information writing unit 153 performs update of the management information stored in the DRAM 11 when update of the management information is necessary according to the change processing for data stored in the DRAM 11 or the NAND memory 12 by the data-transfer processing unit 151. When the memory system 10 satisfies predetermined conditions, the management-information storing unit 154 stores, in the management information storage area 126 of the NAND memory 12, the management information as the snapshot 210, information to be updated in the management information as the pre-log 220A, and updated information in the management information as the post-log 220B. When a position of writing in the pointer 230 is changed according to storage of the snapshot 210, the pre-log 220A, or the post-log 220B, the management-information storing unit 154 applies update processing to the pointer 230.

The snapshot 210 stored by the management-information storing unit 154 is executed according to a predetermined condition (situation) of the memory system, for example, when a log storage area provided for storing the log 220 (the pre-log 220A and the post-log 220B) in the management information storage area 126 of the NAND memory 12 is filled (the area is filled with data).

Timing when the management-information storing unit 154 stores the pre-log 220A and the post-log 220B is data update time on the NAND memory 12 involving update of the management table (the nonvolatile table) stored in the DRAM 11 by the management-information writing unit 153 (when data writing in the NAND memory 12 is necessary). Specifically, the pre-log 220A and the post-log 220B are stored before and after processing for writing data.

When the power supply of the memory system 10 is turned on, the management-information restoring unit 155 performs restoration processing for management information based on the management information storage information 200 stored in the management information storage area 126 of the NAND memory 12. Specifically, the management-information restoring unit 155 traces the pointer 230, the snapshot 210, the pre-log 220A, and the post-log 220B in order and determines whether the pre-log 220A and the post-log 220B corresponding to the latest snapshot 210 are present. When the pre-log 220A and the post-log 220B are not present, the management-information restoring unit 155 determines that the end of the memory system 10 is a normal end and restores, in the DRAM 11, the snapshot 210 of the snapshot storing block as management information. When the pre-log 220A and the post-log 220B are present, the management-information restoring unit 155 acquires the snapshot 210 from the snapshot storing block, acquires the pre-log 220A or the post-log 220B from the log storing block, and performs restoration of the management information (the nonvolatile table) reflecting the pre-log 220A or the post-log 220B on the snapshot 210 on the DRAM 11.

Figure 12:
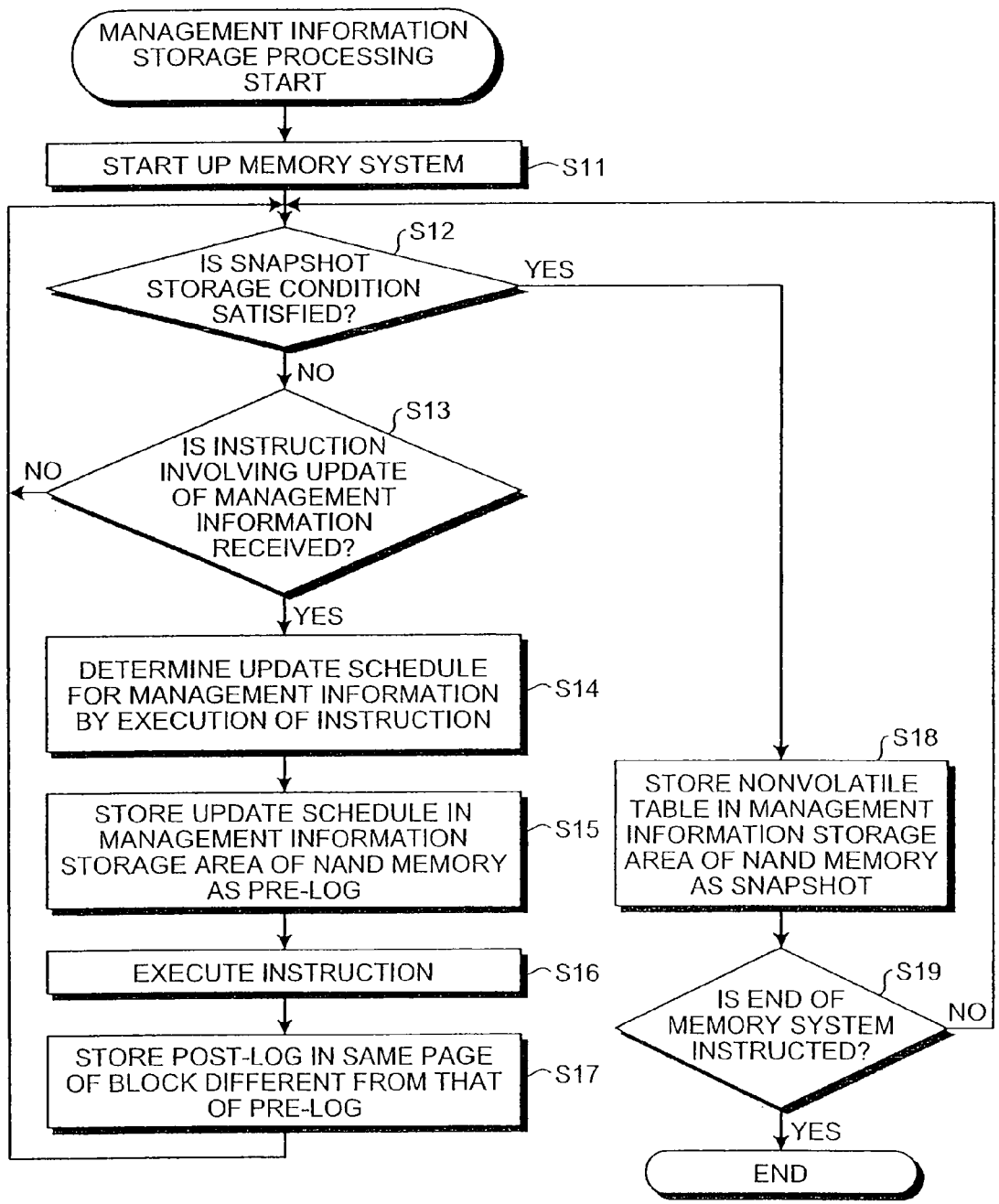
FIG. 12 is a flowchart of an example of a storage processing procedure for management information performed by the memory system according to the first embodiment.
Figure 13:
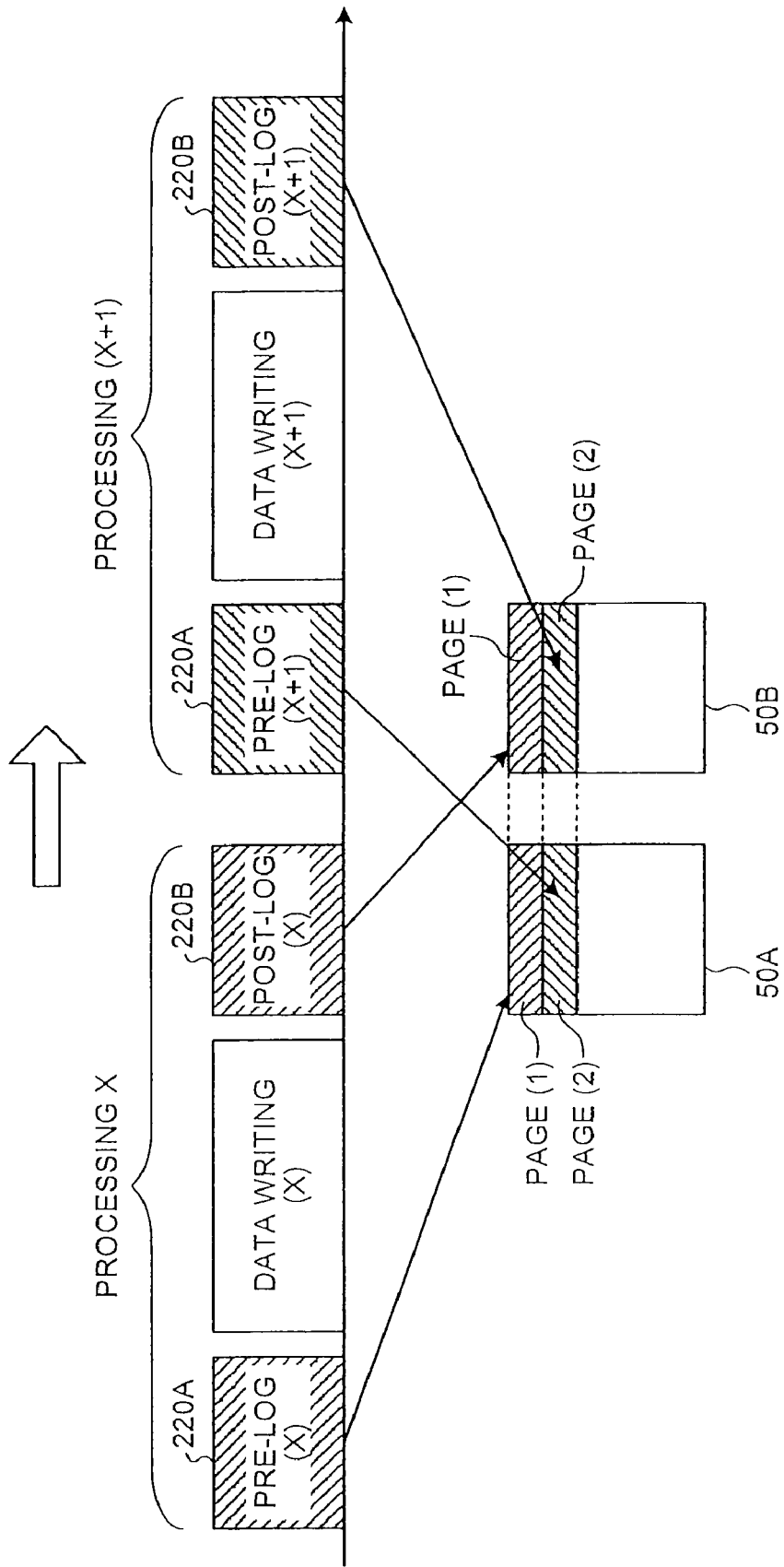
FIG. 13 is a diagram for explaining storage processing for a pre-log and a post-log performed by of the memory system according to the first embodiment.

The storage processing for management information of the memory system 10 performed by the management-information managing unit 152 is explained below. FIG. 12 is a flowchart of an example of a storage processing procedure for management information of the memory system 10. FIG. 13 is a diagram for explaining storage processing for the pre-log and the post-log of the memory system 10 according to the first embodiment. The memory system 10 is connected to the host apparatus and operates as a secondary storage device of the host apparatus. The host apparatus (the memory system 10) is in a started state. The snapshot 210 is stored before the stop of the memory system 10 before the startup state of the host apparatus.

First, the host apparatus (the memory system 10) is in a started state based on the snapshot 210 stored at the last end of the host apparatus (the memory system 10) (Step S11). Thereafter, writing of data in the NAND memory 12 is performed from the host apparatus when necessary. The management-information managing unit 152 determines whether a snapshot storage condition is satisfied (for example, whether the log storage area is full) (Step S12). When the snapshot storage condition is not satisfied ("No" at Step S12), the management-information managing unit 152 determines whether an instruction involving update of the management information (writing of data, etc.) is received (Step S13). When the instruction involving update of the management information is not received ("No" at Step S13), the management-information managing unit 152 returns to Step S12.

When the instruction involving update of the management information is received ("Yes" at Step S13), the management-information managing unit 152 determines an update schedule indicating how the management information is to be updated by execution of the instruction (Step S14). The management-information managing unit 152 stores the update schedule in the log storing block of the management information storage area 126 of the NAND memory 12 as the pre-log 220A (Step S15).

When the pre-log 220A has not been stored in the log storing block, the update schedule (the pre-log) is difference information between the nonvolatile table at the time when the management information is updated and the snapshot 210 stored in the snapshot storing block. When the pre-log 220A (the pre-log 220A in the past) is already stored in the log storing block, the update schedule (the pre-log) is difference information between the nonvolatile table at the time when the management information is updated and a combination of the snapshot 210 and the pre-log 220A in the past. For example, as shown in FIG. 13, before data writing (X) is performed as writing processing for Xth data, a pre-log (X) corresponding to the data writing (X) is stored in the NAND memory 12 as the pre-log 220A. The pre-log (X) is a log at the time when the pre-log 220A in the past is not stored in the log storing block and is difference information between the nonvolatile table at the time when the management information is updated and the snapshot 210. In other words, the pre-log (X) is a first pre-log after the snapshot 210 is taken. In this case, the pre-log (X) is stored in a page (1) (a top page) in a block 50A (a block for a pre-log). The pre-log 220A is stored in the management information storage area 126 of the NAND memory 12, for example, after the pre-log 220A (the update schedule) is stored on the DRAM 11.

Subsequently, the management-information writing unit 153 executes the instruction received at Step S13 (Step S16). As an example of such an instruction, there is writing processing for user data in a predetermined block of the data storage area of the NAND memory 12. Specifically, data writing (X) in the data storage area 125 in the NAND memory 12 is performed.

Thereafter, the management information stored in the DRAM 11 is updated according to the executed processing. The management-information storing unit 154 stores the updated information in the management information in the management information storage area 126 of the NAND memory 12 as the post-log 220B (Step S17). When the post-log 220B has not been stored in the log storing block, the post-log 220B is difference information between the nonvolatile table at the present point and the snapshot 210 stored in the snapshot storing block. When the post-log 220B (the post-log 220B in the past) is already stored in the log storing block, the post-log 220B is difference information between the non volatile table at the present point and a combination of the snapshot 210 and the post-log 220B in the past.

Consequently, a post-log 220B(X) corresponding to the data writing (X) is stored in the NAND memory 12 as the post-log 220B. The post-log 220B is stored in a page (1) (a top page same as that of the pre-log 220A) in a block 50B (a block different from the block 50A). In this way, the post-log 220B is stored in the block different from that of the pre-log 220A and in a page same as the page in which the log 220A is stored. Further, information stored as the post-log 220B is information same as the information stored as the pre-log 220A. The post-log 220B is stored in the management information storage area 126 of the NAND memory 12, for example, after the post-log 220B is recorded on the DRAM 11. Thereafter, the management-information managing unit 152 returns to Step S12.

When the snapshot storage condition is not satisfied ("No" at Step S12) and the instruction involving update of the management information is received ("Yes" at Step S13), the processing at Steps S14 to S17 is repeated. Specifically, in the same manner as the writing processing for the Xth data, writing processing for (X+1)th data is performed. In other words, before data writing (X+1) is performed as the writing processing for the (X+1)th data, a pre-log (X+1) corresponding to the data writing (X+1) is stored in the NAND memory 12 as the pre-log 220A. The pre-log 220A is stored in a page (2) in the block 50A.

The data writing (X+1) is performed in the data storage area 125 in the NAND memory 12. Further, a post-log (X+1) corresponding to the data writing (X+1) is stored in the NAND memory 12 as the post-log 220B. The post-log 220B is stored in the position of a page (2) in the block 50B. In this way, the post-log 220B is stored in a block different from that of the pre-log 220A and in a page same as the page in which the pre-log 220A is stored. Further, information stored as the post-log 220B and information stored as the pre-log 220A are the same information.

When the snapshot storage condition is satisfied at Step S12 ("Yes" at Step S12), the management information including at least the nonvolatile table in the management information storage area 111 of the DRAM 11 is stored in the management information storage area 126 of the NAND memory 12 as the snapshot 210 (Step S18). In this time, the management-information storing unit 154 stores the position (an address) of the first page of the block 50A and the position (an address) of the first page of the block 50B in the pointer 230 as storage positions of the first pre-log and the first post-log. The management-information storing unit 154 stores, for example, an ID of the block 50A and an ID of the first page (a valid top page ID) in the pointer 230 and an ID of the block 50B and an ID of the first page (a valid top page ID) in the pointer 230.

The management-information managing unit 152 determines whether the end of the memory system 10 is instructed (Step S19). When the end of the memory system 10 is not instructed, the management-information managing unit 152 returns to Step S12. When the end of the memory system 10 is instructed, the processing is finished.

Figure 14:
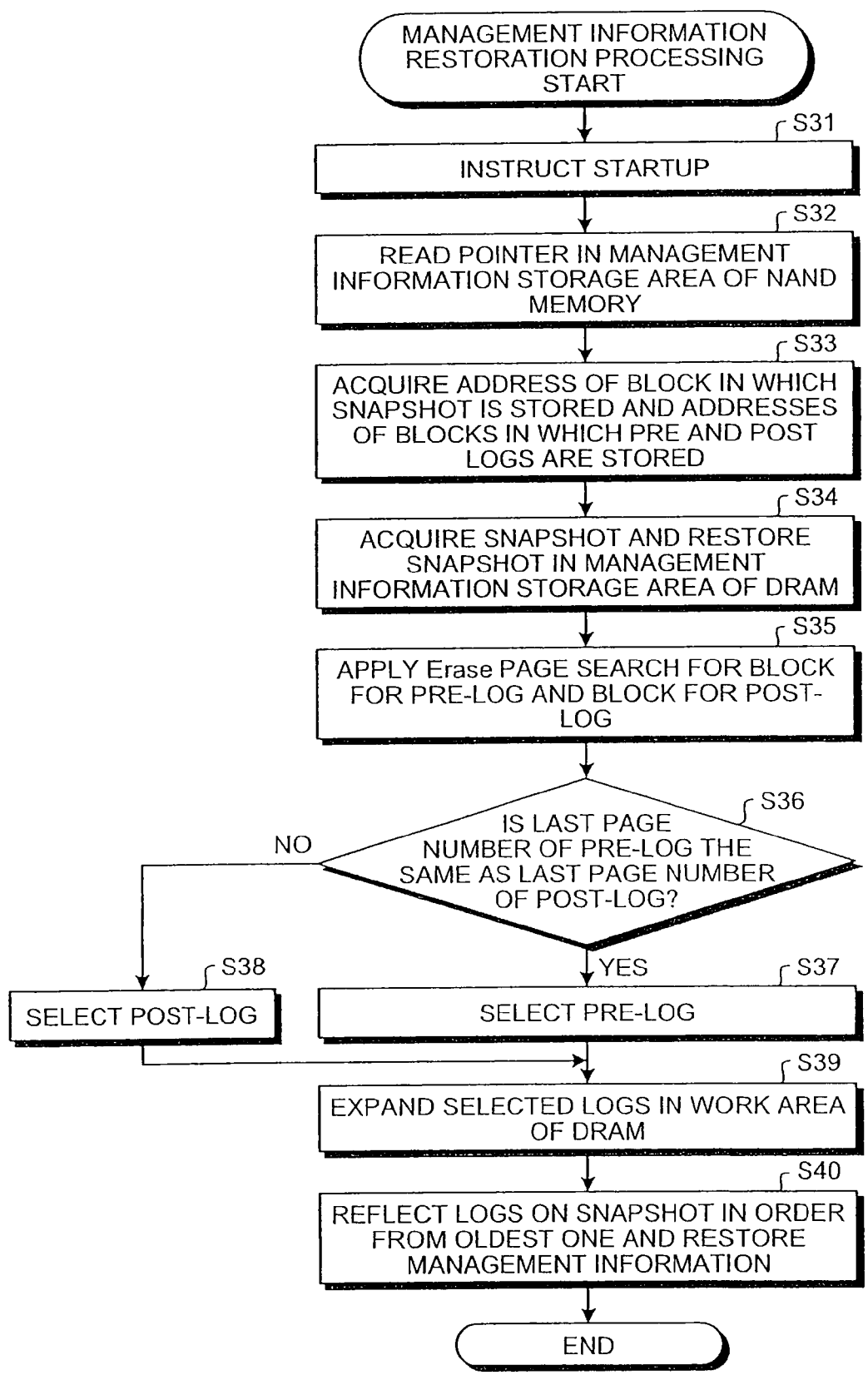
FIG. 14 is a flowchart of an example of a restoration processing procedure for management information performed by the memory system according to the first embodiment.
Figure 15:
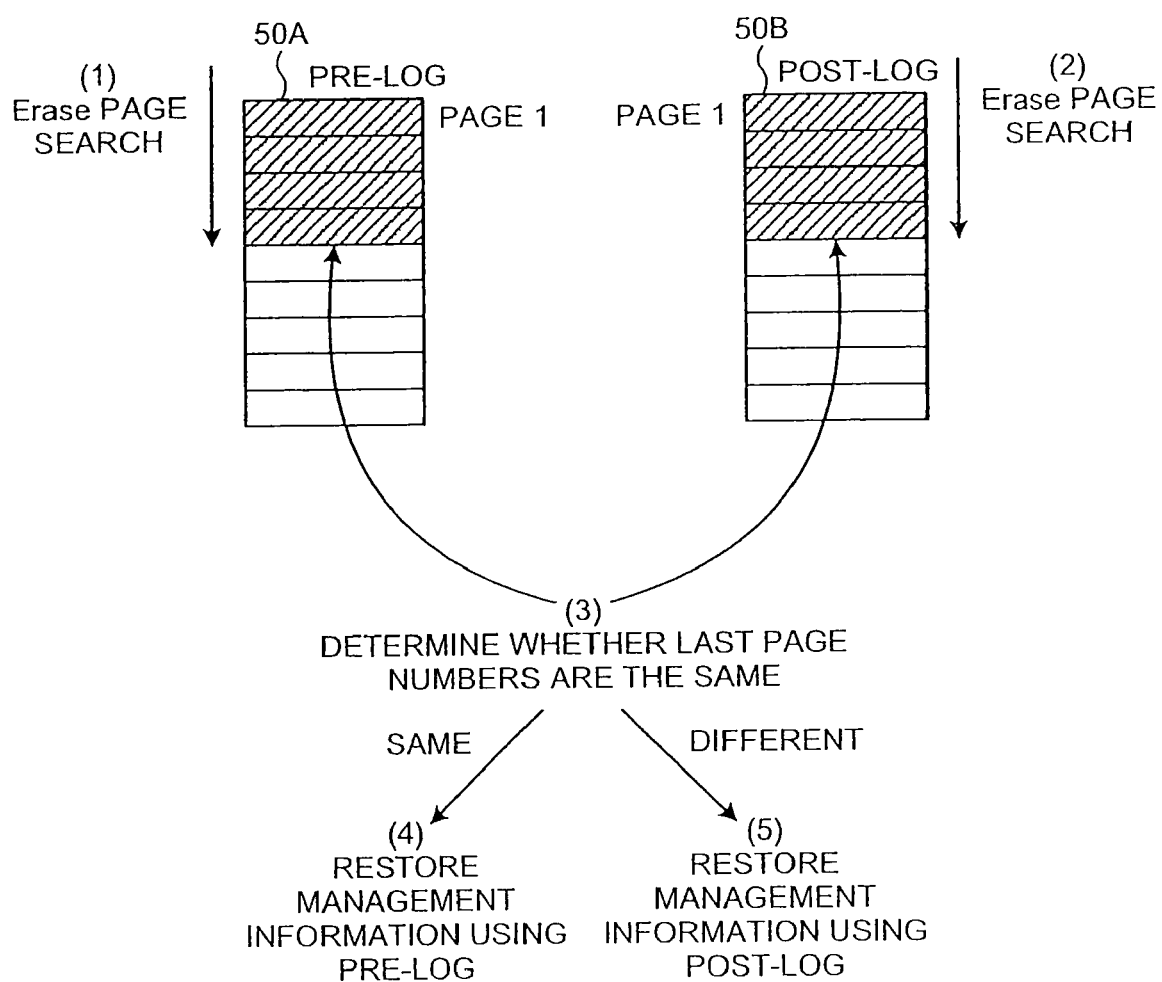
FIG. 15 is a diagram for explaining restoration processing for management information according to the first embodiment.

Restoration processing for management information of the memory system 10 performed by the management-information restoring unit 155 is explained below. FIG. 14 is a flowchart of an example of a restoration processing procedure for management information of the memory system 10 according to the first embodiment. FIG. 15 is a diagram for explaining restoration processing for management information of the memory system according to the first embodiment. The memory system 10 is connected to the host apparatus and operates as the secondary storage device of the host apparatus.

The power supply of the host apparatus is turned on according to, for example, recovery from a short break and a startup instruction is issued to the memory system 10 (Step S31). The management-information restoring unit 155 reads the pointer 230 in the management information storage area 126 of the NAND memory 12 (Step S32) and acquires an address of a block in which the snapshot 210 is stored and addresses of blocks in which the pre and post logs (the pre-log 220A and the post-log 220B) are stored (Step S33).

Thereafter, the management-information restoring unit 155 acquires the snapshot 210 from the snapshot storing block and restores the snapshot 210 in the management information storage area 111 of the DRAM 11 (Step S34).

The management-information restoring unit 155 applies Erase page search to a block for a pre-log and a block for a post-log in the NAND memory 12 (Step S35). The Erase page search is a method of searching, in order from a valid top page in a block, which page is a page in which data is not written in the block (an Erase page) and is a method of determining that, for example, a page having an ECC error and having "0"s (The "0" indicates a no-erase condition") equal to or fewer than a predetermined number as the Erase page. In other words, at Step S35, the management-information restoring unit 155 searches for a page written last in the block.

The management-information restoring unit 155 determines which page a last page (a page immediately preceding the Erase page) is among pages in which the pre-log 220A is stored. The management-information restoring unit 155 determines which page a last page is among pages in which the post-log 220B is stored. The management-information restoring unit 155 determines whether the last page in which the pre-log 220A is stored is the same as the last page in which the post-log 220B is stored (Step S36). The management-information restoring unit 155 according to the first embodiment selects, based on a result of the determination on whether the last page in which the pre-log 220A is stored is the same as the last page in which the post-log 220B is stored, one of the pre-log 220A and the post-log 220B as a log used for restoration of the management information. When the Erase page is not present in the blocks in which the logs 220A and 220B are stored, the management-information restoring unit 155 determines that last pages of the blocks are the last logs.

When a short break occurs during storage of the post-log 220B, the pre-log 220A corresponding to the post-log 220B and the post-log 220B being stored are stored in the block for a pre-log and the block for a post-log. In this case, in the first embodiment, the pre-log 220A and the post-log 220B are stored in the same page of the different blocks. Therefore, the last page in which the pre-log 220A is stored and the last page in which the post-log 220B is stored are the same. Because the short break has occurred during storage of the post-log 220B, the post-log 220B may be broken because of the short break. Therefore, when the short break occurs during storage of the post-log 220B, it is necessary to restore the management information using the pre-log 220A.

Therefore, when the management-information restoring unit 155 according to the first embodiment determines that the last page (the number of pages) in which the pre-log 220A is stored is the same as the last page (the number of pages) in which the post-log 220B is stored ("Yes" at Step S36), the management-information restoring unit 155 selects the pre-log as a log to be used for restoration of the management information (Step S37).

On the other hand, when a short break occurs during storage of the pre-log 220A corresponding to data writing, only the pre-log 220A corresponding to the data writing is stored in the block for a pre-log. The post-log 220B corresponding to the data writing is not stored in the block for a post-log. In this case, in the first embodiment, the pre-log 220A and the post-log 220B are stored in the same page of the different blocks. Therefore, the last page in which the pre-log 220A is stored and the last page in which the post-log 220B is stored are different. Because the short break has occurred during storage of the pre-log 220A, the pre-log 220A may be broken due to the short break. Therefore, when the short break occurs during storage of the pre-log 220A, it is necessary to restore the management information using the post-log 220B.

Therefore, when the management-information restoring unit 155 according to the first embodiment determines that the last page in which the pre-log 220A is stored is different from the last page in which the post-log 220B is stored ("No" at Step S36), the management-information restoring unit 155 selects the post-log 220B as a log used for restoration of the management information (Step S38).

Thereafter, the management-information restoring unit 155 acquires a first log to a latest log of the selected one of the pre-log 220A and the post-log 220B from the log storing block and expands the logs in the work area 112 of the DRAM 11 (Step S39). The management-information restoring unit 155 reflects the logs on the snapshot 210 in order from an oldest one and restores the management information (the nonvolatile table) (Step S40). The restoration processing for the management information is finished.

Specifically, as shown in FIG. 15, the Erase page search is applied to the block 50A in which the pre-log 220A is stored (1) and the Erase page search is applied to the block 50B in which the post-log 220B is stored (2).

It is determined whether the last pages (the numbers of pages) of the pre-log 220A and the post-log 220B are the same (3). When the last pages of the pre-log 220A and the post-log 220B are the same, the management information is restored by using the pre-log 220A (4). When the last pages of the pre-log 220A and the post-log 220B are different, the management information is restored by using the post-log 220B (5).

Figure 16A:
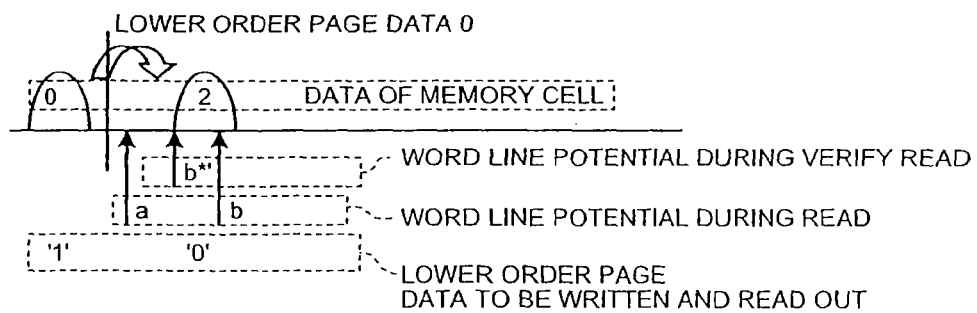
FIGS. 16A to 16D are diagrams of examples of a relation between data in a memory cell and a threshold voltage of the memory cell and order of writing in a NAND memory.
Figure 16B:
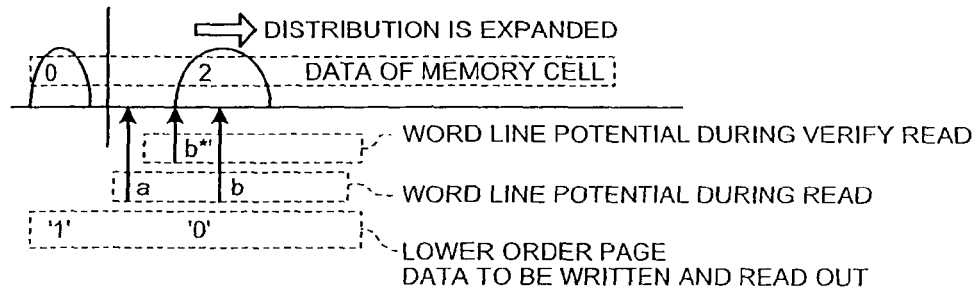
Figure 16C:
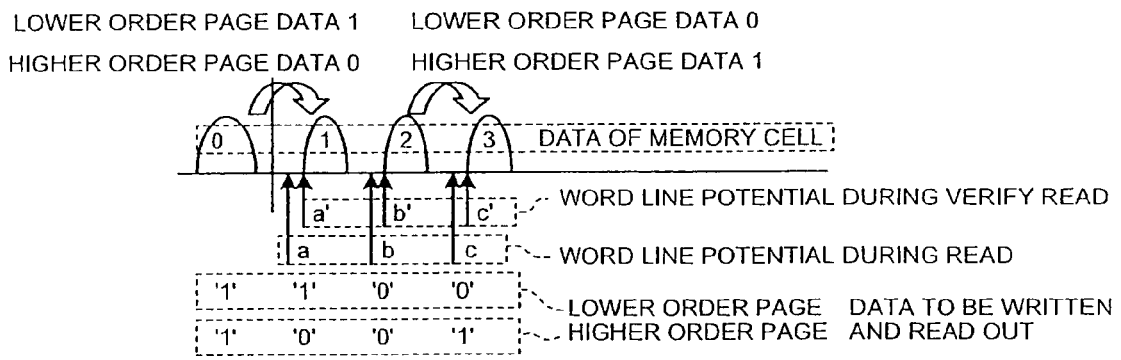

FIGS. 16A to 16D are diagrams of an example of a relation between data in a memory cell and a threshold voltage of the memory cell and order of writing in the NAND memory. First, the data in the memory cell is set to "0" when an erasing operation is performed. Subsequently, as shown in FIG. 16A, when writing in a lower order page is performed, the data in the memory cell changes to data "0" and data "2". As shown in FIG. 16B, before writing in a higher order page, data equal to or lower than a threshold voltage of actual data is written in an adjacent cell. Then, a distribution of a threshold of the data "2" is expanded by the data written in the cell. Thereafter, when data of the higher order page is written, the data in the memory cell changes to data "0" to "3" having an original threshold voltage as shown in FIG. 16C. In the first embodiment, the data in the memory cell is defined from low to high threshold voltages.

Figure 16D:
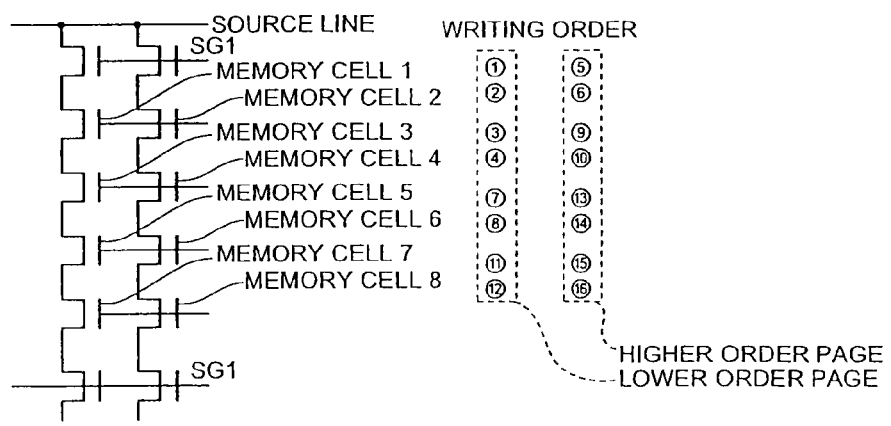

Writing processing in the NAND memory 12 is explained. As shown in FIG. 16D, a writing operation is performed for each of pages from a memory cell close to a source line in a block. In FIG. 16D, for convenience of explanation, four word lines are shown.

In first writing (indicated by encircled 1), 1-bit data is written in a lower order page of a memory cell 1. In second writing (indicated by encircled 2), 1-bit data is written in a lower order page of a memory cell 2 adjacent to the memory cell 1 in a word direction. In third writing (indicated by encircled 3), 1-bit data is written in a lower order page of a memory cell 3 adjacent to the memory cell 1 in a bit direction. In fourth writing (indicated by encircled 4), 1-bit data is written in a lower order page of a memory cell 4 diagonally adjacent to the memory cell 1.

In fifth writing (indicated by encircled 5), 1-bit data is written in a higher order page of the memory cell 1. In sixth writing (indicated by encircled 6), 1-bit data is written in a higher order page of the memory cell 2 adjacent to the memory cell 1 in the word direction. In seventh writing (indicated by encircled 7), 1-bit data is written in a lower order page of a memory cell 5 adjacent to the memory cell 3 in the bit direction. In eighth writing (indicated by encircled 8), 1-bit data is written in a lower order page of a memory cell 6 diagonally adjacent to the memory cell 3.

In ninth writing (indicated by encircled 9), 1-bit data is written in a higher order page of the memory cell 3. In tenth writing (indicated by encircled 10), 1-bit data is written in a higher order page of the memory cell 4 adjacent to the memory cell 3 in the word direction. In eleventh writing (indicated by encircled 11), 1-bit data is written in a lower order page of a memory cell 7 adjacent to the memory cell 5 in the bit direction. In the twelfth writing (indicated by encircled 12), 1-bit data is written in a lower order page of a memory cell 8 diagonally adjacent to the memory cell 5.

In thirteenth writing (indicated by encircled 13), 1-bit data is written in a higher order page of the memory cell 5. In fourteenth writing (indicated by encircled 14), 1-bit data is written in a higher order page of the memory cell 6 adjacent to the memory cell 5 in the word direction. In fifteenth writing (indicated by encircled 15), 1-bit data is written in a higher order page of the memory cell 7. In sixteenth writing (indicated by encircled 16), 1-bit data is written in a higher order page of the memory cell 8 adjacent to the memory cell 7 in the word direction.

A specific example of a selection method for logs used for restoration of management information is explained next. FIGS. 17A to 19I are diagrams for explaining the selection method for logs used for restoration of management information. In FIGS. 17A to 19I, a pre-log and a post-log are stored for each of pages in the block for a pre-log (a block on the left side of each of the figures) and the block for a post-log (a block on the right side of each of the figures). A page in one physical block in FIGS. 17A to 19I corresponds to FIGS. 16A to 16D. In other words, pages 1 to 4, 7 to 8, and 11 to 12 are the lower order page shown in FIGS. 16A to 16D. Pages 5 to 6, 9 to 10, and 13 to 16 are the higher order page shown in FIGS. 16A to 16D. In the block for a pre-log and the block for a post-log, each of the rows in the blocks corresponds to one page. In FIGS. 17A to 19I, the pages are separated into lower order pages and higher order pages for convenience of explanation. A combination of the lower order pages and the higher order pages form one physical block.

In FIGS. 17A to 19I, a normally-saved log is indicated by a log x1, a log broken because of a short break is indicated by a log y1, and a log that is currently being written is indicated by a log z1. Because a short break occurs during writing of the log z1 and the log y1 is broken, a memory cell corresponding to a page of the log z1 and a memory cell corresponding to a page of the log y1 are the same. The page of the log y1 is a page on a lower order side (a lower order page) and the page of the log z1 is a page on a higher order side (a higher order page). Among logs (pages) of each of the blocks, encircled logs are logs selected as logs used for restoration of management information.

FIG. 17A is a diagram of the pre-log and the post-log at normal time (when abnormal isolation of the power supply does not occur and the power supply is turned off). FIGS. 17B to 18G are diagrams of the pre-log and the post-log at the time when the short break has occurred.

In FIG. 17A, the pre-log and the post-log stored in the NAND memory 12 when the power supply of the memory system 10 is turned off without storing the snapshot 210 are shown. In the case of FIG. 17A, because data is written in only the lower order pages (pages 1 to 4), even if a short break occurs during writing in the lower order pages, lower order page data breakage does not occur. As shown in FIG. 17A, in the first embodiment, the pre-log and the post-log are stored in the same page of the different blocks. Therefore, when the power supply is turned off at the normal time, the last page of the pre-log and the last page of the post-log are in the same page position. Therefore, in this case, the management information is restored by using the pre-log. At the normal time shown in FIG. 17A, the management information can be restored by using the post-log instead of the pre-log.

In FIG. 17B, a short break occurs while "log writing (1)" is performed as the pre-log. As shown in FIG. 17B, when the short break occurs during writing in the higher order page (page 6) of the pre-log, lower order page data breakage occurs in the lower order page (page 2 of the pre-log) corresponding to the higher order page being written. In other words, in the case of FIG. 17B, because the short break occurs during storage of the pre-log, the log y1 is generated in the block on the pre-log side. In this case, the log z1 (the log that is currently being stored) corresponding to "log writing (1)" is stored in the block on the pre-log side. On the other hand, the post-log corresponding to "log writing (1)" is not stored in the block on the post-log side. Therefore, the last page of the pre-log and the last page of the post-log contain different information. In this case, the management information is restored by using the post-log.

In FIG. 17C, a short break occurs while "log writing (1)" is performed as the post-log. As shown in FIG. 17C, when the short break occurs during writing in the higher order page (page 6) of the post-log, lower order page data breakage occurs in the lower order page (page 2 of the post-log) corresponding to the higher order page being written. In other words, in the case of FIG. 17C, because the short break occurs during storage of the post-log, the log y1 is generated in the block on the post-log side. In this case, the log z1 corresponding to "log writing (1)" is stored in the block on the post-log side. The pre-log corresponding to "log writing (1)" is already stored in the block on the pre-log side. Therefore, the last page of the pre-log and the last page of the post-log are the same. In this case, the management information is restored by using the pre-log.

In FIG. 17D, after "log writing (1)" is performed as the pre-log, an error occurs during data writing corresponding to the pre-log. A short break occurs while "log writing (2)" is performed as the pre-log corresponding to rewriting processing of data writing. As shown in FIG. 17D, when the short break occurs during writing in the higher order page (page 6) of the pre-log, lower order page data breakage occurs in the lower order page (page 2 of the pre-log) corresponding to the higher order page being written. In other words, in the case of FIG. 17D, because the short break occurs during storage of the pre-log, the log y1 occurs in the block on the pre-log side. In this case, the log x1 corresponding to "log writing (1)" and the log z1 corresponding to "log writing (2)" are stored in the block on the pre-log side. On the other hand, the post-log corresponding to "log writing (1)" and the post-log corresponding to "log writing (2)" are not stored in the block on the post-log side. Therefore, the last page of the pre-log and the last page of the post-log contain different information. In this case, the management information is restored by using the post-log.

In FIG. 18E, after "log writing (1)" is performed as the pre-log, an error occurs during data writing corresponding to the pre-log and "log writing (2)" is performed as the pre-log corresponding to rewriting processing of data writing. Further, in FIG. 18E, after "log writing (2)" is performed as the post-log corresponding to rewriting processing of data writing, a short break occurs while "log writing (1)" is performed as the post-log corresponding to first data writing. As shown in FIG. 18E when the short break occurs during writing in the higher order page (page 6) of the post-log, lower order page data breakage occurs in the lower order page (page 2 of the post-log) corresponding to the higher order page being written. In other words, in the case of FIG. 18E, because the short break occurs during storage of the post-log, the log y1 is generated in the block on the post-log side. In this case, the log x1 corresponding to "log writing (1)" and the log x1 corresponding to "log writing (2)" are stored in the block on the pre-log side. On the other hand, the log x1 corresponding to "log writing (2)" and the log z1 corresponding to "log writing (1)" are stored in the block on the post-log side. Therefore, the last page of the pre-log and the last page of the post-log are the same. The management information is restored by using the pre-log.

In FIG. 18F, a short break occurs while "log writing (1)" over two pages is performed as the pre-log. As shown in FIG. 18F, when the short break occurs during writing in the higher order pages (page 5 and page 6) of the pre-log, lower order page data breakage occurs in the lower order pages (page 1 and page 2 of the post-log) corresponding to the higher order pages being written. In other words, in the case of FIG. 18F, because the short break occurs during storage of the pre-log, the log y1 (e.g., page 2) occurs in the block on the pre-log side. In this case, the log x1 (a pre-stage page) and the log z1 (a post-stage page) corresponding to "log writing (1)" are stored in the block on the pre-log side. On the other hand, the post-log corresponding to "log writing (1)" is not stored in the block on the post-log side. Therefore, the last page of the pre-log and the last page of the post-log are different. The management information is restored by using the post-log.

In FIG. 18G, a short break occurs while "log writing (1)" over two pages is performed as the post-log. As shown in FIG. 18G, when a short break occurs during writing in the higher order pages (page 6 and page 7) of the post-log, lower order page data breakage occurs in the lower order pages (page 1 and page 2 of the post-log) corresponding to the higher order pages being written. In other words, in the case of FIG. 18G, because the short break has occurred during storage of the post-log, the log y1 (e.g., page 2) is generated in the block on the post-log side. In this case, the log x1 and the log z1 corresponding to "log writing (1)" are stored in the block on the post-log side. The post-log corresponding to "log writing (1)" is already stored over two pages in the block on the pre-log side. Therefore, the last page of the pre-log and the last page of the post-log are the same. The management information is restored by using the pre-log.

In FIG. 19H, a short break occurs while log writing in a second block is performed in "log writing (1)" over two blocks as the pre-log. In this case, although the short break has occurred during storage of the pre-log, the log y1 is not generated in the block on the pre-log side because the second block is a first page (a lower order page). In this case, in the block on the pre-log side, the log x1 corresponding to "log writing (1)" is stored in a last page of a first block and the log z1 corresponding to "log writing (1)" is stored in the first page of the second block. On the other hand, the post-log corresponding to "log writing (1)" is not stored in the block on the post-log side. Therefore, the last page of the pre-log and the last page of the post-log are different. The management information is restored by using the post log.

In FIG. 19I, after log wiring in the second block is performed in "log writing (1)" over two blocks (two pages) as the pre-log, an error occurs during data writing corresponding to this log and a short break occurs while "log writing (2)" is performed as rewriting processing of "log writing (1)". In this case, although the short break has occurred during storage of the pre-log, the log y1 is not generated in the block on the pre-log side because a second page of the second block is a lower order page. In this case, in the block on the pre-log side, the log x1 corresponding to the pre-stage page of "log writing (1)" is stored in the last page of the first block and the log x1 of the post-stage page corresponding to "log writing (1)" is stored in the first page of the second block. Further, the log z1 corresponding to "log writing (2)" is stored in the second page of the second block on the pre-log side. On the other hand, the post-log corresponding to "log writing (1)" and the post-log corresponding to "log writing (2)" are not stored in the block on the post-log side. Therefore, the last page of the pre-log and the last page of the post-log are different. The management information is restored by using the post-log.

In the first embodiment, the NAND memory 12 is explained to be a multi-value memory. However, the NAND memory 12 can be a memory of a binary mode. In this case, because the pre-log and the post-log are not broken by the short break, information stored as the post-log 220B does not need to be the same as information stored as the pre-log 220A. Therefore, when the NAND memory 12 is the memory of the binary mode, the post-log 220B can be information for approving that data is updated after data is actually updated (update approval information).

When the NAND memory 12 is the memory of the binary mode and the post-log 220B is the update approval information, as in the case explained above, the management-information restoring unit 155 determines, in restoring the management information, whether the last page in which the pre-log 220A is stored is the same as the last page in which the post-log 220B is stored. When the last page in which the pre-log 220A is stored is the same as the last page in which the post-log 220B is stored, the management-information restoring unit 155 restores the management information using the pre-log. When the last page in which the pre-log 220A is stored is different from the last page in which the post-log 220B is stored, the management-information restoring unit 155 restores the management information using the pre-log overlapping the post-log (the pre-log in a page same as a page in which the post-log is stored). For example, when the post-log is stored from a first page to a tenth page, the management-information restoring unit 155 restores the management information using the pre-log from the first page to the tenth page.

When the NAND memory 12 is the memory of the binary mode, information stored as the post-log 220B can be the same as the pre-log 220A. In this case, the management-information restoring unit 155 restores the management information according to processing same as the processing performed when the NAND memory 12 is the multi-value memory. In this case, when the last page in which the pre-log 220A is stored is different from the last page in which the post-log 220B is stored, the management-information restoring unit 155 can restore the management information using the pre-log overlapping the post-log.

As explained above, in the first embodiment, the management-information restoring unit 155 selects one of the pre-log and the post-log based on a result of comparison concerning whether the last page in which the pre-log 220A is stored and the last page in which the post-log 220B is stored are the same. Further, the management-information restoring unit 155 extracts, based on the comparison result, logs (a normal portion) used for restoration of the management information in the selected pre-log or post-log from the NAND memory 12. Finally, the management-information restoring unit 155 restores the management information using the extracted log.

The pre-log or the post-log extracted by the management-information restoring unit 155 when the NAND memory 12 is the multi-value memory, or the memory of the binary mode, is explained below. FIG. 20 is a diagram for explaining the pre-log or the post-log extracted in this case. When a short break (g1) occurs during storage of the post-log (X−1) corresponding to the processing (X−1), because the data writing (X−1) is completed, the management-information restoring unit 155 determines that the processing (X−1) is completed. The management-information restoring unit 155 selects the pre-log (X−1) as a normal latest pre-log. Thereafter, the management-information restoring unit 155 restores the management information using the pre-logs from the first pre-log to the pre-log (X−1) after the snapshot 210 is taken (process h1).

When a short break (g2) occurs during a period after the storage of the post-log (X−1) until the start of storage of the post-log (X), because the data writing (X) is not completed, the management-information restoring unit 155 determines that the processing X is not completed. The management-information restoring unit 155 selects the post-log (X−1) as a latest post-log completed to be stored. Thereafter, the management-information restoring unit 155 restores the management information using the post-logs from the first post-log to the post-log (X−1) after the snapshot 210 is taken (process h2). When the NAND memory 12 is the memory of the binary mode, the management-information restoring unit 155 can select the pre-log (X−1) as a latest pre-log completed to be stored. In this case, the management-information restoring unit 155 restores the management information using the pre-logs from the first pre-log to the pre-log (X−1) after the snapshot 210 is taken (h3).

Similarly, when a short break (g3) occurs during storage of the post-log (X) corresponding to the processing X, because the data writing (X) is completed, the management-information restoring unit 155 determines that the processing X is completed. The management-information restoring unit 155 selects the pre-log (X) as a normal latest pre-log. Thereafter, the management-information restoring unit 155 restores the management information using the pre-logs from the first pre-log to the pre-log (X) after the snapshot 210 is taken (process h4).

When a short break (g4) occurs in a period after the storage of the post-log (X) until the start of storage of the post-log (X+1), because the data writing (X+1) is not completed, the management-information restoring unit 155 determines that the processing (X+1) is not completed. The management-information restoring unit 155 selects the post-log (X) as a latest post-log completed to be stored. Thereafter, the management-information restoring unit 155 restores the management information using the post-logs from the first post-log to the post-log (X) after the snapshot 210 is taken (process h5). When the NAND memory 12 is the memory of the binary mode, the management-information restoring unit 155 can select the pre-log (X) as a latest pre-log completed to be stored. In this case, the management-information restoring unit 155 restores the management information using the pre-logs from the first pre-log to the pre-log (X) after the snapshot 210 is taken (process h6).

In the first embodiment, the pre-log 220A and the post-log 220B are written from top pages of a new log storing block when a generation of the snapshot 210 has changed. However, the pre-log 220A and the post-log 220B can be continuously written in the same log storing block even if the generation of the snapshot 210 has changed. In the example explained above, the DRAM is used as the first storing unit. However, other volatile semiconductor storage devices and nonvolatile semiconductor storage device can be used.

As explained above, according to the first embodiment, even when a short break occurs in the memory system 10, the pre-log 220A and the post-log 220B are stored in the same page of different blocks. Therefore, it is possible to easily determine, based on the last page of the pre-log 220A and the last page of the post-log 220B, which timing is timing when the short break occurs. It is also possible to easily determine which log of the pre-log and the post-log can be used to restore the management information (a restoration point). Therefore, the memory system 10 can be easily and quickly reset to a state before abnormal isolation occurs.

Because the pre-log and the post-log are stored from the top pages of the different blocks, it is easily to perform log management for the pre-log and the post-log and management of the blocks. When the NAND memory 12 is the multi-value memory, at least one of the pre-log 220A and the post-log 220B is not broken because of a short break. Therefore, whichever timing the short break occurs, it is possible to easily reset the memory system 10 to a state before the short break occurs by using one of the pre-log 220A and the post-log 220B.

Because the pre-log 220A and the post-log 220B are stored in the same page of the different blocks, it is possible to easily adjust timing for acquiring the block for a pre-log and the block for a post-log as blocks for logs and timing for opening the block for a pre-log and the block for a post-log. Therefore, it is easy to manage the block for a pre-log and the block for a post-log.

Second Embodiment

A second embodiment of the present invention is explained below with reference to FIGS. 21 and 22. In the second embodiment, when a log length (a size) of a post-log exceeds a predetermined length, blocks in which the post-log is stored are opened by a predetermined number of blocks in order from an oldest block.

Figure 21:
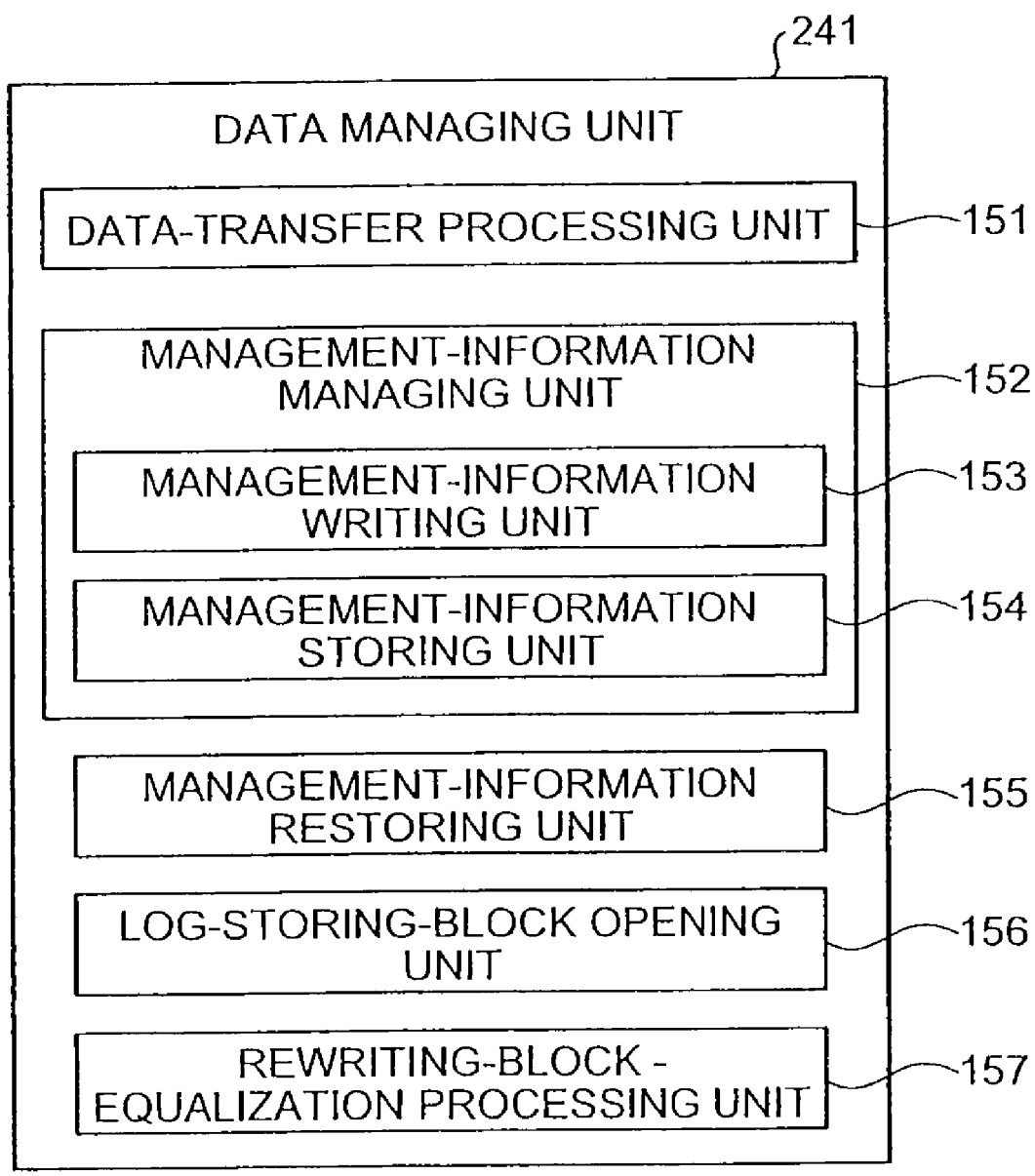
FIG. 21 is a block diagram of an example of a functional configuration of a data managing unit according to a second embodiment of the present invention.

FIG. 21 is a block diagram of an example of a functional configuration of a data managing unit 241 according to the second embodiment. The data managing unit 241 can be employed in place of the data managing unit 141. The data managing unit 241 further includes a log-storing-block opening unit 156 and a rewriting-block-equalization processing unit 157, in addition to components of the data managing unit 141, i.e., the data-transfer processing unit 151, the management-information managing unit 152, and the management-information restoring unit 155.

The log-storing-block opening unit 156 determines whether a log length (size) of a post-log exceeds a predetermined length. When the log length of the post-log exceeds the predetermined length, the log-storing-block opening unit 156 opens an oldest block (a block that stores the post-log for a longest period) among blocks in which the post-log is stored.

The rewriting-block-equalization processing unit 157 executes leveling processing in order to set the numbers of times of erasing of respective blocks the same. When a block in the data storage area 125 and a block in the management information storage area 126 are rewritten to other blocks, the rewriting-block-equalization processing unit 157 selects a block at a rewriting destination such that the numbers of rewritable times of the respective blocks are equalized. The rewriting-block-equalization processing unit 157 instructs the data-transfer processing unit 151 and the management-information storing unit 154 of the management-information managing unit 152 to perform rewriting of data using the selected block at the rewriting destination.

When the snapshot 210, the pre-log 220A, the post-log 220B, the pointer 230, and the like are written in a new block, the rewriting-block-equalization processing unit 157 selects a block at a writing destination such that the numbers of writable times of the respective blocks are equalized. The rewriting-block-equalization processing unit 157 instructs the data-transfer processing unit 151, the management-information managing unit 152, and the management-information storing unit 154 to rewrite data using the selected block at the rewriting destination. In this case, if the block can be used, the rewriting-block-equalization processing unit 157 can designate a block at a writing destination regardless of whether the block is a block used as the data storage area 125 in the past or a block in which the management information storage area 126 is stored.

Figure 22A:
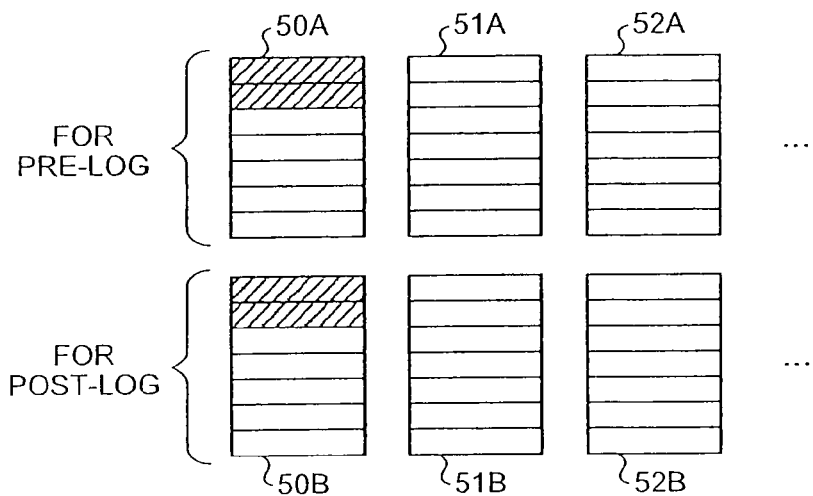
FIGS. 22A to 22C are diagrams for explaining order of storing pre and post logs in respective blocks and order of opening the post-log.
Figure 22B:
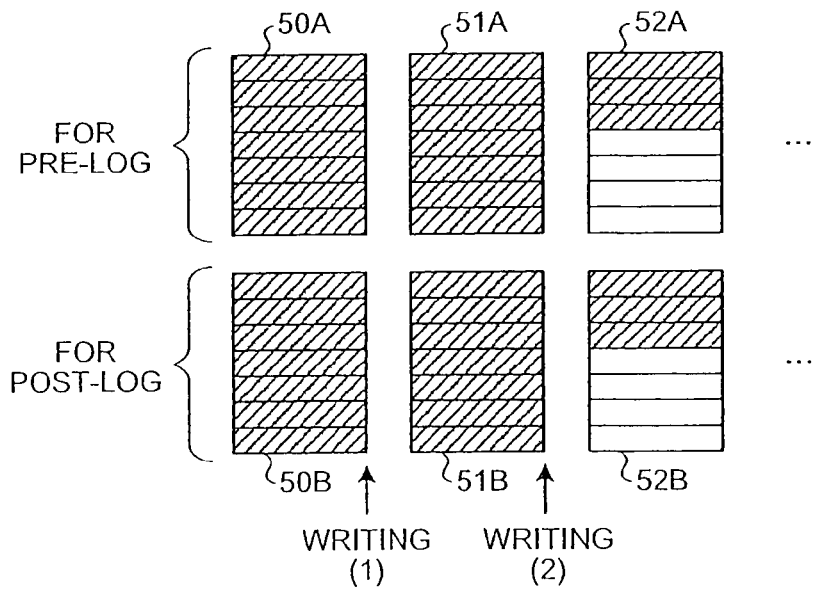
Figure 22C:
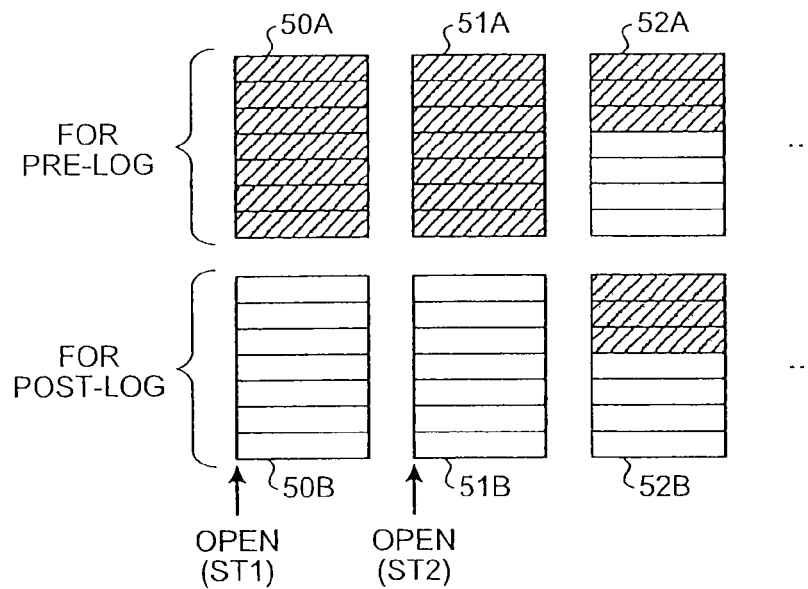

FIGS. 22A to 22C are diagrams for explaining storing order for pre and post logs in the respective blocks and opening order for the post-log. The pre-log is stored in the respective blocks in order of the block 50A, a block 51A, and a block 52A and the post-log is stored in the respective blocks in order of the block 50B, a block 51B, and a block 52B.

As shown in FIG. 22A, the pre-log is stored in order from a top page in the block 50A. The post-log is stored in order from a top page in the block 50B. Thereafter, as shown in FIG. 22B, when the pre-log is written in all pages in the block 50A (1), the pre-log is stored by using the next block 51A (2). When the post-log is written in all pages in the block 50B (1), the post-log is stored by using the next block 51B (2). The pre-log is stored in order from a top page in the block 51A and the post-log is stored in order from a top page in the block 51B.

When the pre-log is written in all pages in the block 51A, the pre-log is stored by using the next block 52A. When the post-log is written in all pages in the block 51B, the post-log is stored by using the next block 52B. The pre-log is stored in order from a top page in the block 52A and the post-log is stored in order from a top page in the block 52B.

When the log length (size) of the post-log exceeds a predetermined length (e.g., 1 block), as shown in FIG. 22C, the log-storing-block opening unit 156 opens an oldest block among the blocks in which the post-log is stored. The log-storing-block opening unit 156 checks whether the post-log in the block to be opened stores information same as that in the pre-log. Only when the post-log in the block to be opened stores the information same as that in the pre-log, the log-storing-block opening unit 156 sets the block in which the post-log is stored as a block of an opening target.

For example, when the log-storing-block opening unit 156 is set to open an oldest block when the log length of the post-log has exceeded 1 block, the log-storing-block opening unit 156 opens the block 50B after writing in the block 51B is started (ST1). The log-storing-block opening unit 156 opens the block 51B after writing in the block 52B is started (ST2).

When the log-storing-block opening unit 156 is set to open the blocks in order from an oldest block when the log length of the post-log exceeds 2 blocks, because the block 50B is the oldest as a block for a post-log, the log-storing-block opening unit 156 opens the block 50B after writing in the block 52B is started (ST1). Subsequently, the log-storing-block opening unit 156 opens the block 51B (ST2). When the log length of the post-log exceeds 2 blocks, the log-storing-block opening unit 156 can open only an oldest one block. In this case, the log-storing-block opening unit 156 opens only the block 50B (ST1).

In the memory system 10, the rewriting-block-equalization processing unit 157 executes leveling processing (wear leveling) as processing for setting the numbers of times of erasing of the respective blocks the same. Consequently, in the memory system 10, it is possible to prevent erasing processing from concentrating on a part of the blocks. Therefore, it is possible to extend the durable life of the NAND memory 12. In the second embodiment, efficiency of the leveling processing is improved because a block as a target of the leveling processing is opened.

In the above explanation of the second embodiment, a block is opened when the log length of the post-log exceeds 1 block, or 2 blocks. However, timing of opening a block is not limited to those timings and only has to be timing when the log length of the post-log is equal to or larger than 1 block. For example, an old block can be opened when the log length of the post-log exceeds 1.5 blocks or can be opened when the log length of the post-log exceeds 1 block and a predetermined number of pages.

After opening the old block, the memory system 10 can erase the opened block at any timing. The memory system 10 erases the old block, for example, at timing when load is not applied to processing in the memory system 10. Instead of opening the old block for a post-log, the memory system 10 can open an old block for a pre-log. When the NAND memory 12 is the memory of the binary mode and the post-log 220B is the data update approval information, an opening target at the time when the log length exceeds the predetermined length is the old block for a post-log and is not the block for a pre-log.

In the above explanation of the second embodiment, the blocks are opened in order from the oldest block. However, the blocks can be opened in order from a block having a smallest number of times of erasing. Consequently, a block having a small number of times of erasing is more easily opened than a block having a large number of times of erasing.

As explained above, according to the second embodiment, the old block in which the post-log is stored is opened when the log length of the post-log exceeds the predetermined length. Therefore, the number of open blocks increases and, as a result, it is possible to efficiently perform the leveling processing.

Because the pre-log and the post-log are stored from the top pages of the different blocks, it is easy to manage a block as an opening target. Because the blocks are opened in order from an oldest block, it is possible to average time from erasing until writing among the blocks. Consequently, in the NAND memory 12, time for performing relaxation can be sufficiently secured.

Third Embodiment

A third embodiment of the present invention is explained below with reference to FIGS. 23A and 23B. In the third embodiment, a block group in which a pre-log is stored and a block group in which a post-log is stored are different block groups. The respective block groups are block groups (logical blocks) that are accessible at high speed.

As shown in FIG. 1 in the first embodiment, in the memory system 10, the NAND memory 12 includes the four channels 120A to 120D. The channels 120A to 120D are connected to one another via the drive control unit 14 and the buses 15A to 15D.

With such a configuration, the memory system 10 can actuate the four channels 120A to 120D in parallel. For example, when the busses 15A to 15D are 8-bit buses, the memory system 10 can access the NAND memory 12 in 32-bit units by actuating the four channels 120A to 120D in parallel.

When the memory system 10 accesses the NAND memory 12 through the 8-bit buses, an address is designated for each of blocks to be accessed. When the memory system 10 accesses the NAND memory 12 through 32-bit buses, an address is designated for each of block groups to be accessed.

Each of the channels 120A to 120D has two planes. For example, the channel 120A has a block for a plane 0 and a block for a plane 1. The block corresponding to the plane 0 is accessed in 8-bit units via a buffer for the plane 0 (data reading and writing for every 8 bits). The block corresponding to the plane 1 is accessed in 8-bit units via a buffer for the plane 1.

In the channel 120A, while data stored in the buffer for the plane 1 is written in the block on the plane 1 side, data is written in the buffer for the plane 0 from the host apparatus or the like. While data stored in the buffer for the plane 0 is written in the block on the plane 0 side, data is written in the buffer for the plane 1 from the host apparatus or the like. In the channel 120A, by alternately repeating such kinds of processing, it is possible to perform data reading and writing at speed twice as high as speed of data reading and writing performed by using one plane.

Similarly, in the channels 120B to 120D, by performing data reading and writing using the two planes, it is possible to perform data reading and writing at speed twice as high as speed of data reading and writing performed by using one plane.

Therefore, in the third embodiment, the channels 120A to 120D are actuated in parallel and, in each of the channels 120A to 120D, the pre-log and the post-log are stored in logical blocks (block groups) in which data reading and writing can be performed by using the two planes. In the third embodiment, a logical block in which the pre-log is stored and a logical block in which the post-log is stored are different. The logical block is a block group including eight blocks, each of which is collected from each of the planes in the channels 120A to 120D. For example, when one block has a size of 512 K, the logical block has a size of 4 M.

Figure 23A:
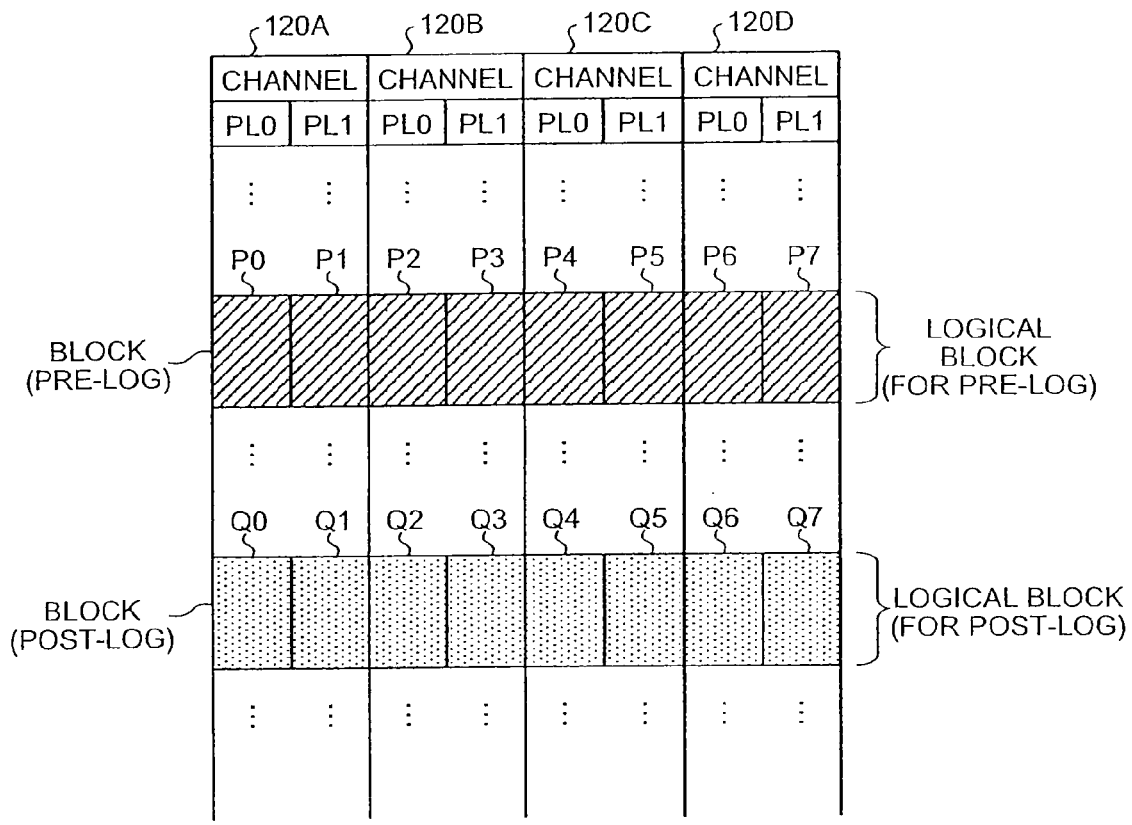
FIGS. 23A and 23B are diagrams for explaining a logical block for a pre-log and a logical block for a post-log according to a third embodiment of the present invention.
Figure 23B:
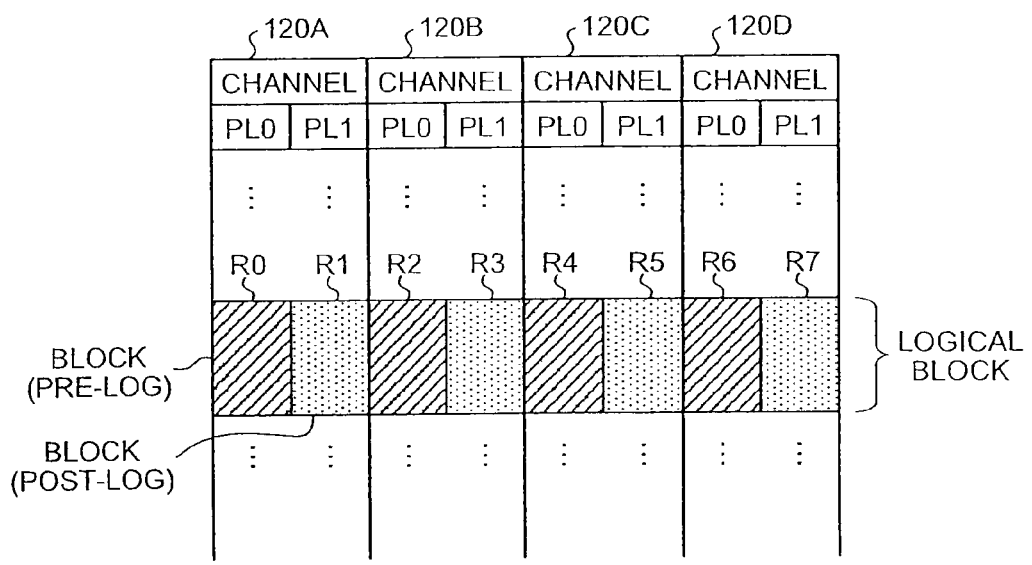

As shown in FIGS. 23A and 23B, each of the channels 120A to 120D has the plane 0 (PL0) and the plane 1 (PL1). Blocks P0, Q0, and R0 are the plane 0 of the channel 120A and blocks P1, Q1, and R1 are the plane 1 of the channel 120A. Blocks P2, Q2, and R2 are the plane 0 of the channel 120B and blocks P3, Q3, and R3 are the plane 1 of the channel 120B. Blocks P4, Q4, and R4 are the plane 0 of the channel 120C and blocks P5, Q5, and R5 are the plane 1 of the channel 120C. Blocks P6, Q6, and R6 are the plane 0 of the channel 120D and blocks P7, Q7, and R7 are the plane 1 of the channel 120D.

In the example illustrated in FIG. 23A, one logical block is configured by the blocks P0 to P7 and one logical block is configured by the blocks Q0 to Q7. In the example illustrated in FIG. 23B, one logical block is configured by the blocks R0 to R7.

In this case, in the third embodiment, as shown in FIG. 23A, the logical block including the blocks P0 to P7 is allocated to the block for a pre-log and the logical block including the blocks Q0 to Q7 is allocated to the block for a post-log.

In this manner, a logical block in which the pre-log is stored and a logical block in which the post-log is stored are separate blocks. Blocks (a storage start block, etc.) in the logical block in which the pre-log is stored and blocks (a storage start block, etc.) in the logical block in which the post-log is stored are blocks on the same plane in the same channel. Moreover, an area (a page position) in the block in which the pre-log is stored and an area (a page position) in the block in which the post-log is stored are the same area.

For example, when information stored as the pre-log and information stored as the post-log are the same, if it can be confirmed that the information in the pre-log and information in the post-log is the same, it is possible to open (erase) one of the pre-log and the post-log. For example, when the logical block for a post-log is entirely filled with the post-log, by storing the logical block for the pre-log it is possible to open the logical block for a post-log. When the logical block for a pre-log is entirely filled with the pre-log, by storing the logical block for the post-log is stored it is possible to open the logical block for a pre-log can be opened.

As explained above, the logical block for a pre-log and the logical block for a post-log are logical blocks that can actuate the channels 120A to 120D in parallel and perform data reading and writing using two channels among the channels 120A to 120D. Therefore, it is possible to perform opening and erasing of the blocks at high speed.

On the other hand, as shown in FIG. 23B, when the blocks for a pre-log and a post-log are stored in one logical block in a mixed state, each of the blocks needs to be opened when opening (erasing) of the logs is performed. Therefore, opening processing cannot be performed at high speed.

When the NAND memory 12 is the memory of the binary mode and the post-log 220B is the data update approval information, an opening target to be opened when the log length exceeds the predetermined length is the logical block for a post-log and is not the logical block for a pre-log.

In the above explanation of the third embodiment, the blocks in the logical block in which the pre-log is store and the blocks in the logical block in which the post-log is stored are the blocks on the same plane in the same channel. However, the blocks in the logical block in which the pre-log is store and the blocks in the logical block in which the post-log is stored can be blocks on different planes in different channels.

In the above explanation of the third embodiment, the NAND memory 12 includes the four channels 120A to 120D. However, the number of channels of the NAND memory 12 can be equal to or smaller than three or can be equal to or larger than five.

In the above explanation of the third embodiment, each of the channels 120A to 120D has the two planes. However, each of the channels can have three or more planes or have only one plane.

As explained above, according to the third embodiment, because the logical block in which the pre-log is stored and the logical block in which the post-log is stored are different, it is possible to perform opening and erasing of a logical block using a plurality of planes while actuating a plurality of channels in parallel. Therefore, it is possible to open and erase an unnecessary logical block at high speed.

Because the pre-log and the post-log are stored in the same page of the different blocks, timing when blocks or logical blocks can be opened is the same in the block for a pre-log and the block for a post-log. Because the pre-log and the post-log are stored from top pages in the same block in the different logical blocks, it is easy to manage the blocks and the logical blocks.

In the example explained above, the memory cell transistor MT configuring the NAND memory 12 is the multi-value memory of 2 bits. However, a multi-value memory of 2 or more bit can be applied to any memory cell transistor MT. When the multi-value memory is applied to the memory cell transistor MT, because pages include three or more pages such as a high order page, an intermediate page, and a low order page, it is likely that lower order page data breakage occurs in the intermediate page and the low order page when data is written in the high order page.

The charge accumulating layer is not limited to the floating gate type and can be a charge trap type including a silicon nitride film such as the MONOS (Metal-Oxide-Nitride-Oxide-Semiconductor) structure and other systems.

Fourth Embodiment

A fourth embodiment of the present invention is explained below with reference to FIGS. 24 to 29I. In the fourth embodiment, a pre-log and a post-log have the same size and are stored in order from the same page (position) of different blocks. For example, the pre-log and the post-log are the same information.

Figure 24:
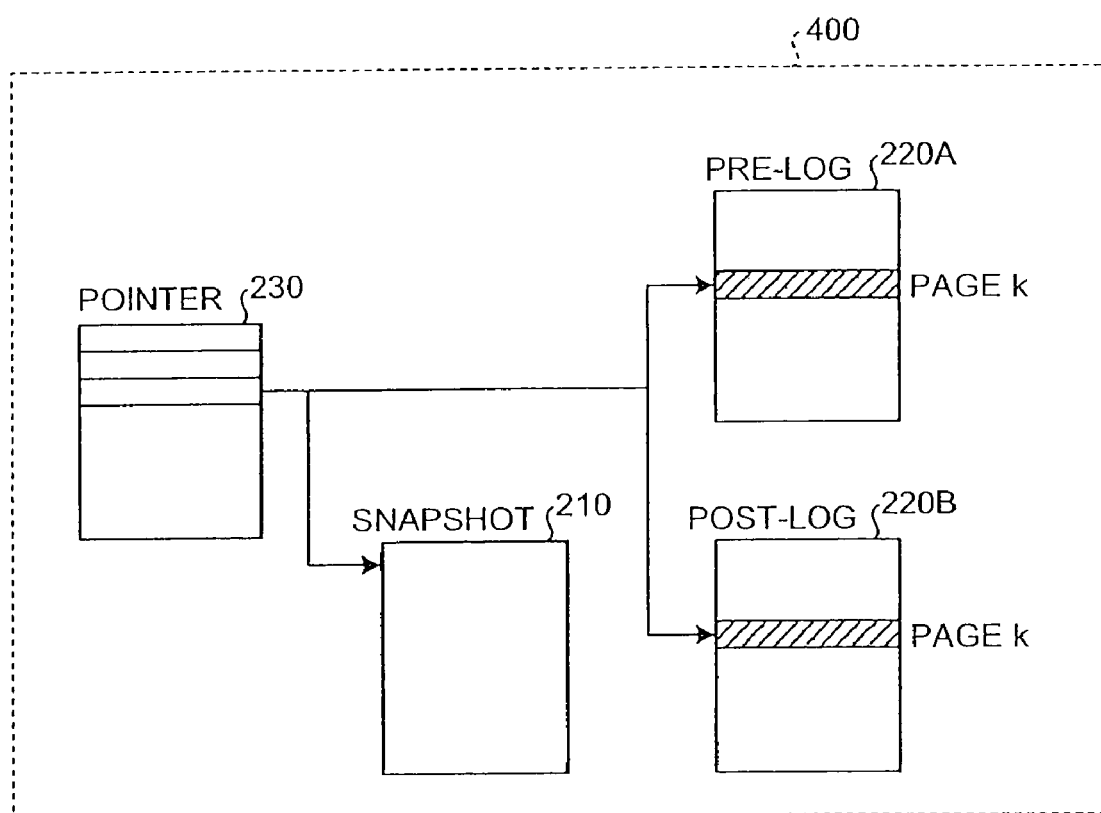
FIG. 24 is a schematic diagram of an example of contents of management information storage information stored in a management information storage area according to a fourth embodiment of the present invention.

FIG. 24 is a schematic diagram of an example of contents of management information storage information 400 stored in a management information storage area according to the fourth embodiment. In the fourth embodiment, a data size of the pre-log 220A and a data size of the post-log 220B are the same. The pre-log 220A and the post-log 220B are stored in the same page of different blocks by storing, in order, the pre-log 220A and the post-log 220B in the same position of the different blocks (following positions of the pre-log 220A and the post-log 220B corresponding to the snapshot 210 in the last time).

The pointer 230 indicates the position of the snapshot 210, the position (a kth page) (k is a natural number) acquired first after storage of the snapshot 210, and the position (kth page) of the post-log 220B acquired first after storage of the snapshot 210. When the pre-log 220A acquired first after storage of the snapshot 210 is stored in the kth page in the block for a pre-log, the post-log 220B acquired first after storage of the snapshot 210 is stored in the kth page in the block for a post-log. The pointer 230 indicates the kth page in the block for a pre-log as the position of the pre-log and indicates the kth page in the block for a post-log as the position of the post-log.

In FIG. 24, the snapshot 210, the pre-log 220A, the post-log 220B, and the pointer 230 are stored in different blocks. The snapshot 210 is stored in a snapshot storing block.

The pre-log 220A and the post-log 220B are stored in log storing blocks, respectively. The pre-log 220A and the post-log 220B are continuously written in the same log storing blocks even if a generation of the snapshot 210 changes. In other words, in the fourth embodiment, the pre-log 220A corresponding to a latest snapshot 210 is stored in order from an area (a position) following the pre-log 220A corresponding to the snapshot 210 stored immediately preceding the latest snapshot 210. The post-log 220B corresponding to the latest snapshot 210 is stored in order from an area (a position) following the post-log 220B corresponding to the snapshot 210 stored immediately preceding the latest snapshot 210.

Figure 25:
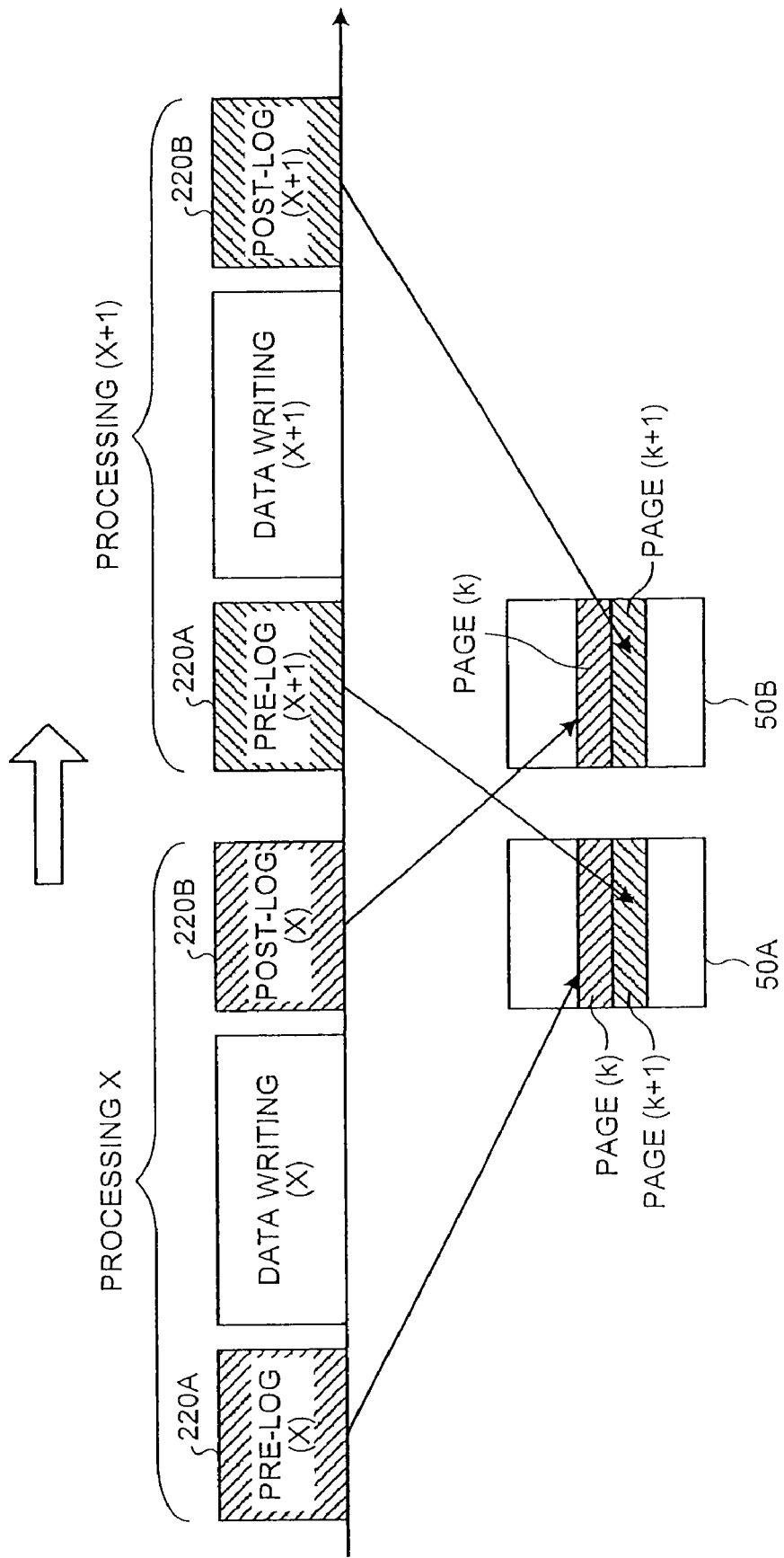
FIG. 25 is a diagram for explaining storage processing for a pre-log and a post-log of a memory system according to the fourth embodiment.

Storage processing for management information of the memory system 10 by the management-information managing unit 152 is explained below. The management-information managing unit 152 according to the fourth embodiment stores management information according to a procedure same as the storage processing procedure for management information explained with reference to FIG. 12 in the first embodiment. Therefore, the storage processing for management information is explained with reference to FIG. 12. FIG. 25 is a diagram for explaining storage processing for a pre-log and a post-log of the memory system according to the fourth embodiment. The memory system 10 is connected to a host apparatus and operates as a secondary storage device of the host apparatus. The host apparatus (the memory system 10) is in a started state. The snapshot 210 is stored before the stop of the memory system 10 before the startup state of the host apparatus.

First, the host apparatus (the memory system 10) is in a started state based on the snapshot 210 stored at the last end of the host apparatus (the memory system 10) (Step S11). Thereafter, writing of data in the NAND memory 12 is performed from the host apparatus when necessary. The management-information managing unit 152 determines whether a snapshot storage condition is satisfied (for example, whether the log storage area is full) (Step S12). When the snapshot storage condition is not satisfied ("No" at Step S12), the management-information managing unit 152 determines whether an instruction involving update of the management information (writing of data, etc.) is received (Step S13). When the instruction involving update of the management information is not received ("No" at Step S13), the management-information managing unit 152 returns to Step S12.

When the instruction involving update of the management information is received ("Yes" at Step S13), the management-information managing unit 152 determines an update schedule indicating how the management information is to be updated by execution of the instruction (Step S14). The management-information managing unit 152 stores the update schedule in the log storing block of the management information storage area 126 of the NAND memory 12 as the pre-log 220A (Step S15).

When the pre-log 220A has not been stored in the log storing block, the update schedule (the pre-log) is difference information between the nonvolatile table at the time when the management information is updated and the snapshot 210 stored in the snapshot storing block. When the pre-log 220A (the pre-log 220A in the past) is already stored in the log storing block, the update schedule (the pre-log) is difference information between the nonvolatile table at the time when the management information is updated and a combination of the snapshot 210 and the pre-log 220A in the past.

For example, as shown in FIG. 25, before data writing (X) is performed as writing processing for Xth data, a pre-log (X) corresponding to the data writing (X) is stored in the NAND memory 12 as the pre-log 220A. The pre-log (X) is a log at the time when the pre-log 220A in the past is not stored in the log storing block and is difference information between the nonvolatile table at the time when the management information is updated and the snapshot 210. In other words, the pre-log (X) is a first pre-log after the snapshot 210 is taken. In this case, the pre-log (X) is stored in the next page (the kth page) of a page in which a log and the like in the immediately preceding generation is stored in the block 50A (the block for a pre-log). The management-information storing unit 154 stores the position (an address) of the kth page of the block 50A in the pointer 230 as a storage position of the first pre-log. The management-information storing unit 154 stores, for example, an ID of the block 50A and an ID of the kth page (a valid top page ID) in the pointer 230. Consequently, the first page to a (k−1) page of the block 50A are set as invalid pages. The pre-log 220A is stored in the management information storage area 126 of the NAND memory 12, for example, after the pre-log 220A (the update schedule) is stored on the DRAM 11.

Subsequently, the logical NAND management layer 32 executes the instruction received at Step S13 (Step S16). As an example of such an instruction, there is writing processing for user data in a predetermined block of the data storage area of the NAND memory 12. Specifically, data writing (X) in the data storage area 125 in the NAND memory 12 is performed.

Consequently, a post-log 220B(X) corresponding to the data writing (X) is stored in the NAND memory 12 as the post-log 220B. The post-log 220B is stored in a kth page (a page same as that of the pre-log 220A) in the block 50B (a block different from the block 50A). The management-information storing unit 154 stores the position (an address) of the kth page of the block 50B in the pointer 230 as a storage position of a first post-log. The management-information storing unit 154 stores, for example, an ID of the block 50B and an ID of the kth page (a valid top page ID) in the pointer 230. Consequently, the first page to a (k−1)th page of the block 50B are set as invalid pages. In this way, the post-log 220B is stored in the block different from that of the pre-log 220A and in a page same as the page in which the log 220A is stored. Further, information stored as the post-log 220B is information same as the information stored as the pre-log 220A. The post-log 220B is stored in the management information storage area 126 of the NAND memory 12, for example, after the post-log 220B is recorded on the DRAM 11. Thereafter, the management-information managing unit 152 returns to Step S12.

When the snapshot storage condition is not satisfied ("No" at Step S12) and the instruction involving update of the management information is received ("Yes" at Step S13), the processing at Steps S14 to S17 is repeated. Specifically, in the same manner as the writing processing for the Xth data, writing processing for (X+1)th data is performed. In other words, before data writing (X+1) is performed as the writing processing for the (X+1)th data, a pre-log (X+1) corresponding to the data writing (X+1) is stored in the NAND memory 12 as the pre-log 220A. The pre-log 220A is stored in a page (k+1) in the block 50A.

The data writing (X+1) is performed in the data storage area 125 in the NAND memory 12. Further, a post-log (X+1) corresponding to the data writing (X+1) is stored in the NAND memory 12 as the post-log 220B. The post-log 220B is stored in the position of a page (k+1) in the block 50B. In this way, the post-log 220B is stored in a block different from that of the pre-log 220A and in a page same as the page in which the pre-log 220A is stored. Further, information stored as the post-log 220B and information stored as the pre-log 220A are the same information.

When the snapshot storage condition is satisfied at Step S12 ("Yes" at Step S12), the management information including at least the nonvolatile table in the management information storage area 111 of the DRAM 11 is stored in the management information storage area 126 of the NAND memory 12 as the snapshot 210 (Step S18). The management-information managing unit 152 determines whether the end of the memory system 10 is instructed (Step S19). When the end of the memory system 10 is not instructed, the management-information managing unit 152 returns to Step S12. When the end of the memory system 10 is instructed, the processing is finished.

Figure 26:
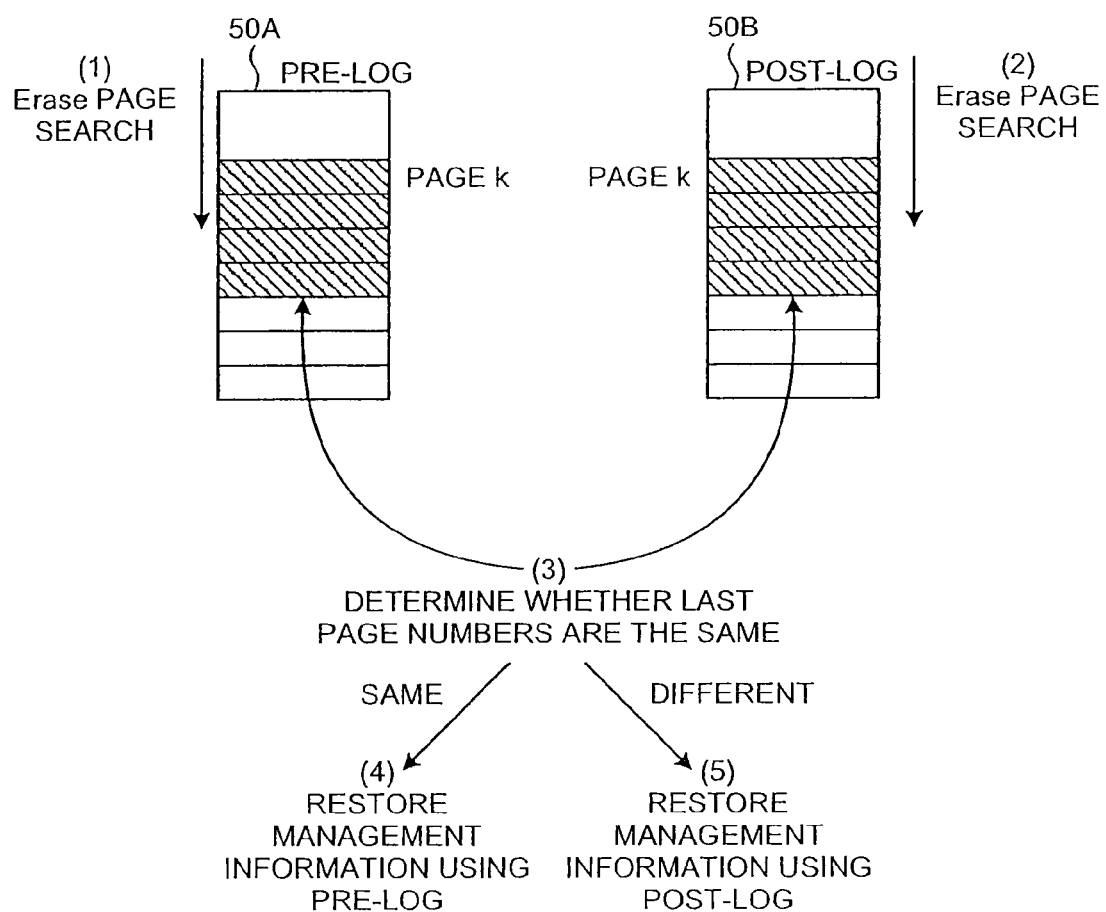
FIG. 26 is a diagram for explaining restoration processing for management information of the memory system according to the fourth embodiment.

Restoration processing for management information of the memory system 10 performed by the management-information restoring unit 155 is explained below. The management-information restoring unit 155 according to the fourth embodiment restores management information according to a procedure same as the restoration processing procedure for management information explained with reference to FIG. 14 in the first embodiment. Therefore, the restoration processing for management information is explained with reference to FIG. 14. FIG. 26 is a diagram for explaining restoration processing for management information of the memory system 10 according to the fourth embodiment. The memory system 10 is connected to the host apparatus and operates as the secondary storage device of the host apparatus.

The power supply of the host apparatus is turned on according to, for example, recovery from a short break and a startup instruction is issued to the memory system 10 (Step S31). The management-information restoring unit 155 reads the pointer 230 in the management information storage area 126 of the NAND memory 12 (Step S32) and acquires an address of a block in which the snapshot 210 is stored and addresses of blocks in which the pre and post logs (the pre-log 220A and the post-log 220B) are stored (Step S33).

Thereafter, the management-information restoring unit 155 acquires the snapshot 210 from the snapshot storing block and restores the snapshot 210 in the management information storage area 111 of the DRAM 11 (Step S34).

The management-information restoring unit 155 applies Erase page search to a block for a pre-log and a block for a post-log in the NAND memory 12 (Step S35). In the fourth embodiment, the first page to the (k−1) page of the block 50A are set as invalid pages (the ID of the kth page is stored in the pointer 230 as the valid top page ID). Therefore, the management-information restoring unit 155 performs the Erase page search from the kth page of the block for a pre-log and performs the Erase page search from the kth page of the block for a post-log.

The management-information restoring unit 155 determines which page a last page (a page immediately preceding the Erase page) is among pages in which the pre-log 220A is stored. The management-information restoring unit 155 determines which page a last page is among pages in which the post-log 220B is stored. The management-information restoring unit 155 determines whether the last page in which the pre-log 220A is stored is the same as the last page in which the post-log 220B is stored (Step S36). The management-information restoring unit 155 according to the fourth embodiment selects, based on a result of the determination on whether the last page in which the pre-log 220A is stored is the same as the last page in which the post-log 220B is stored, one of the pre-log 220A and the post-log 220B as a log used for restoration of the management information. Thereafter, the management information is restored according to a procedure same as the restoration processing procedure for management information explained with reference to FIG. 14 in the first embodiment (Steps S36 to S40).

Specifically, as shown in FIG. 26, the Erase page search is applied to, starting from the kth page, the block 50A in which the pre-log 220A is stored (1) and the Erase page search is applied to, starting from the kth page, the block 50B in which the post-log 220B is stored (2).

It is determined whether the last pages (the numbers of pages) of the pre-log 220A and the post-log 220B are the same (3). When the last pages of the pre-log 220A and the post-log 220B are the same, the management information is restored by using the pre-log 220A (4). When the last pages of the pre-log 220A and the post-log 220B are different, the management information is restored by using the post-log 220B (5).

A specific example of a selection method for logs used for restoration of management information according to the fourth embodiment is explained next. FIGS. 27A to 29I are explanatory diagrams same as FIGS. 17A to 19I in the first embodiment. Redundant explanation is omitted.

Encircled normally-stored logs among the logs (the pages) of the respective blocks are logs selected as logs used for restoration of management information. FIG. 27A is a diagram of the pre-log and the post-log at normal time (when abnormal isolation of the power supply does not occur and the power supply is turned off). FIGS. 27B to 228G are diagrams of the pre-log and the post-log at the time when the short break has occurred.

In FIG. 27A, the pre-log and the post-log stored in the NAND memory 12 when the power supply of the memory system 10 is turned off without storing the snapshot 210 are shown. In the case of FIG. 27A, because data is written in only the lower order pages (pages 2 to 4), even if a short break occurs during writing in the lower order pages, lower order page data breakage does not occur. In the case of FIG. 27A, as in the case of FIG. 17A, the management information is restored by using the pre-log.

In the case of FIG. 27B, as in the case of FIG. 17B, the last page of the pre-log and the last page of the post-log are different. The management information is restored by using the post-log.

In the case of FIG. 27C, as in the case of FIG. 17C, the last page of the pre-log and the last page of the post-log are the same. The management information is restored by using the pre-log.

In the case of FIG. 27D, as in the case of FIG. 17D, the last page of the pre-log and the last page of the post-log are different. The management information is restored by using the post-log.

In the case of FIG. 28E, as in the case of FIG. 18E, the last page of the pre-log and the last page of the post-log are the same. The management information is restored by using the pre-log.

In the case of FIG. 28F, as in the case of FIG. 18F, the last page of the pre-log and the last page of the post-log are different. The management information is restored by using the post log.

In the case of FIG. 28G, as in the case of FIG. 18G, the last page of the pre-log and the last page of the post-log are the same. The management information is restored by using the pre-log.

In the case of FIG. 29H, as in the case of FIG. 19H, the last page of the pre-log and the last page of the post-log are different. The management information is restored by using the post-log.

In the case of FIG. 29I, as in the case of FIG. 19I, the last page of the pre-log and the last page of the post-log are different. The management information is restored by using the post-log.

In the fourth embodiment, as in the first embodiment, the NAND memory 12 is the multi-value memory. However, the NAN memory 12 can be a memory of a binary mode. When the NAND memory 12 is the memory of the binary mode and the post-log 220B is update approval information, as in the case explained above, when the management-information restoring unit 15 restores the management information, the management-information restoring unit 155 determines whether a last page in which the pre-log 220A is stored is the same as a last page in which the post-log 220B is stored. For example, when the post-log is stored from a second page to a tenth page, the management-information restoring unit 155 restores the management information using the pre-log from the second page to the tenth page.

When the block for a pre-log changes to a bad block, a new block is set as the block for a pre-log. The block for a pre-log is stored from a certain page of the new block. For example, when the block for a pre-log changes to a bad block in the tenth page, the block for a pre-log is stored from an eleventh page of the new block. When the block for a post-log changes to a bad block, in the same manner, a new block is set as the block for a post-log. The block for a post-log is stored from a certain page of the new block. Consequently, even when a bad block occurs in the block for a pre-log or the block for a post-log, it is possible to store the pre-log and the post-log in the same page of different blocks.

As explained above, according to the fourth embodiment, even when a short break occurs in the memory system 10, the pre-log 220A and the post-log 220B are stored in the same page of different blocks. Therefore, it is possible to easily determine, based on the last page of the pre-log 220A and the last page of the post-log 220B, which timing is timing when the short break occurs. It is also possible to easily determine which log of the pre-log and the post-log can be used to restore the management information (a restoration point). Therefore, the memory system 10 can be easily and quickly reset to a state before abnormal isolation occurs.

The pre-log 220A and the post-log 220B are continuously written in the same log storing blocks even if a generation of the snapshot 210 changes. Therefore, when abnormal isolation of the power supply occurs, it is possible to easily and quickly reset the memory system 10 to a state before the abnormal isolation occurs while efficiently using the block for a pre-log and the block for a post-log.

When the NAND memory 12 is the multi-value memory, at least one of the pre-log 220A and the post-log 220B is not broken because of a short break. Therefore, whichever timing the short break occurs, it is possible to easily reset the memory system 10 to a state before the short break occurs by using one of the pre-log 220A and the post-log 220B.

Because the pre-log 220A and the post-log 220B are stored in the same page of the different blocks, it is possible to easily adjust timing for acquiring the block for a pre-log and the block for a post-log as blocks for logs and timing for opening the block for a pre-log and the block for a post-log. Therefore, it is easy to manage the block for a pre-log and the block for a post-log.

Fifth Embodiment

A fifth embodiment of the present invention is explained below with reference to FIGS. 30A to 30C. In the fifth embodiment, as in the second embodiment, when a log length (size) of a post-log exceeds a predetermined length, blocks in which the post-log is stored are opened by a predetermined number of blocks in order from an oldest block. The data managing unit 241 according to the fifth embodiment has the same configuration as that of the data managing unit 241 explained with reference to FIG. 21 in the second embodiment. Therefore, explanation of the data managing unit 241 is omitted.

FIGS. 30A to 30C are diagrams for explaining storing order for pre and post logs and opening order for the post-log according to the fifth embodiment. FIGS. 30A to 30C are explanatory diagrams same as FIGS. 22A to 22C in the second embodiment. Redundant explanation is omitted.

FIGS. 30A to 30C are diagrams for explaining storing order for pre and post logs in the respective blocks and opening order for the post-log according to the fifth embodiment. The pre-log is stored in the respective blocks in order of the block 50A, the block 51A, and the block 52A and the post-log is stored in the respective blocks in order of the block 50B, the block 51B, and the block 52B.

As shown in FIG. 30A, the pre-log is stored in order from a kth page in the block 50A. The post-log is stored in order from a kth page in the block 50B. Thereafter, as shown in FIG. 30B, when the pre-log is written in all pages in the block 50A (1), the pre-log is stored by using the next block 51A (2). When the post-log is written in all pages in the block 50B (1), the post-log is stored by using the next block 51B (2). The pre-log is stored in order from a top page in the block 51A and the post-log is stored in order from a top page in the block 51B.

When the pre-log is written in all pages in the block 51A, the pre-log is stored by using the next block 52A. When the post-log is written in all pages in the block 51B, the post-log is stored by using the next block 52B. The pre-log is stored in order from a top page in the block 52A and the post-log is stored in order from a top page in the block 52B.

After the post-log is stored in a last page of the block for a post-log and when the log length (size) of the post-log exceeds predetermined length (e.g., 1 block), the log-storing-block opening unit 156 opens an oldest block among the blocks in which the post-log is stored. For example, after the post-log is stored in a last page of a first block for a post-log (a first block after a snapshot) or after the post-log is stored in a last page of a second block for a post log, as shown in FIG. 30C, the log-storing-block opening unit 156 opens an oldest block among the blocks in which the post-log is stored. The log-storing-block opening unit 156 checks whether the post-log in the block to be opened stores information same as that in the pre-log. Only when the post-log in the block to be opened stores the information same as that in the pre-log, the log-storing-block opening unit 156 sets the block in which the post-log is stored as a block of an opening target.

For example, when the log-storing-block opening unit 156 is set to open an oldest block after the post-log is stored in the last page of the block for a post-block and when the log length of the post-log exceeds 1 block, the log-storing-block opening unit 156 opens the block 50B after writing of a first page in the block 51B is started (ST1). The log-storing-block opening unit 156 opens the block 51B after writing of the first page in the block 52B is completed (ST2).

When the log-storing-block opening unit 156 is set to open the blocks in order from an oldest block after the post-log is stored in the last page of the first block for a post-log and when the log length of the post-log exceeds 1 block and 1 page, because the block 50B is the oldest as a block for a post-log, the log-storing-block opening unit 156 opens the block 50B after writing of the first page in the block 52B is completed (ST1). Subsequently, the log-storing-block opening unit 156 opens the block 51B (ST2). When the log length of the post-log exceeds 1 block and 1 page, the log-storing-block opening unit 156 can open only an oldest one block. In this case, the log-storing-block opening unit 156 opens only the block 50B after writing of the first page in the block 52B is completed (ST1).

When data not desired to be opened is stored in the first block for a post-log, this first block for a post-log can be excluded from the block as the opening target. In this case, when the post-log is stored in the last page of the second block for a post-log and the log length (size) of the post-log exceeds predetermined length (e.g., 1 page), the blocks in which the post-log is stored are opened by a predetermined number of blocks in order from an oldest block (the second block for a post-log).

As explained above, according to the fifth embodiment, the old block in which the post-log is stored is opened when the log length of the post-log exceeds the predetermined length. Therefore, opened blocks increase and, as a result, it is possible to efficiently perform the leveling processing.

Sixth Embodiment

A sixth embodiment of the present invention is explained below with reference to FIGS. 31A and 31B. In the sixth embodiment, as in the third embodiment, a block group in which a pre-log is stored and a block group in which a post-log is stored are different block groups. The respective block groups are block groups (logical blocks) that are accessible at high speed.

Figure 31A:
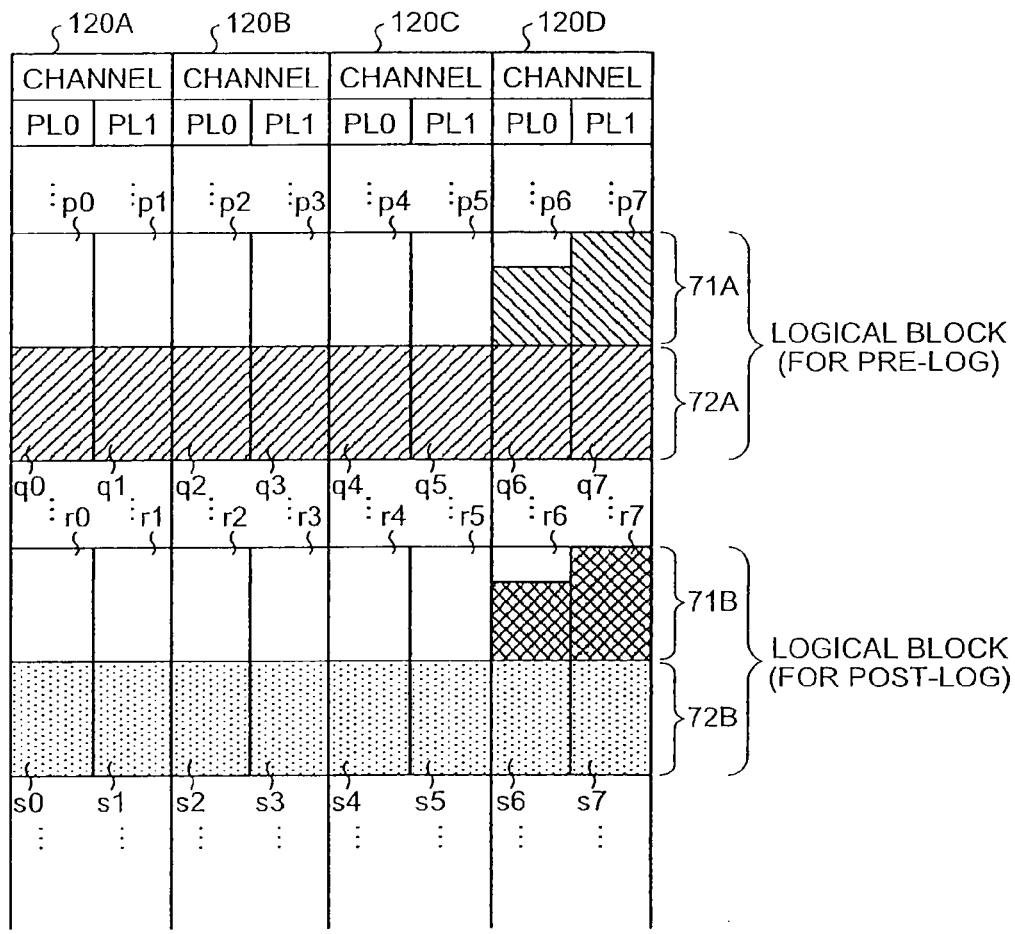
FIGS. 31A and 31B are diagrams for explaining a logical block for a pre-log and a logical block for a post-log.
Figure 31B:
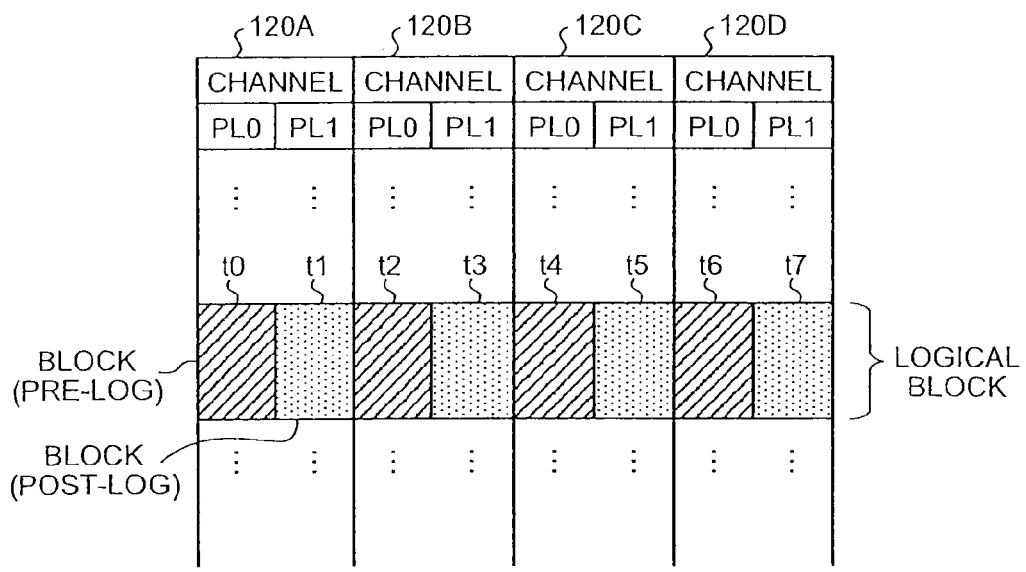

As shown in FIGS. 31A and 31B, each of the channels 120A to 120D has a plane 0 (PL0) and a plane 1 (PL1). Blocks p0, q0, s0, and t0 are the plane 0 of the channel 120A and blocks p1, q1, r1, s1, and t1 are the plane 1 of the channel 120A. Blocks p2, q2, r2, s2, and t2 are the plane 0 of the channel 120B and blocks p3, q3, r3, s3, and t3 are the plane 1 of the channel 120B. Blocks p4, q4, r4, s4, and t4 are the plane 0 of the channel 120C and blocks p5, q5, r5, s5, and t5 are the plane 1 of the channel 120C. Blocks p6, q6, r6, s6, and t6 are the plane 0 of the channel 120D and blocks p7, q7, r7, s7, and t7 are the plane 1 of the channel 120D.

In the example illustrated in FIG. 31A, one logical block is configured by each set of blocks p0 to p7, blocks q0 to q7, blocks r0 to r7, and blocks s0 to s7. In the example illustrated in FIG. 31B, one logical block is configured by blocks t0 to t7.

In this case, in the sixth embodiment, as shown in FIG. 31A, a logical block 71A including the blocks p0 to p7 and a logical block 72A including the blocks q0 to q7 are allocated to the block for a pre-log and a logical block 71B including the blocks r0 to r7 and a logical block 72B including the including the blocks s0 to s7 are allocated to the block for a post-log.

In this manner, a logical block in which the pre-log is stored and a logical block in which the post-log is stored are separate blocks. Blocks (a storage start block, etc.) in the logical block in which the pre-log is stored and blocks (a storage start block, etc.) in the logical block in which the post-log is stored are blocks on the same plane in the same channel. Moreover, an area (a page position) in the block in which the pre-log is stored and an area (a page position) in the block in which the post-log is stored are the same area.

Specifically, for example, the pre-log is stored in order from a kth page in the block p6 of the logical block 71A and the post-log is stored in order from a kth page in the block r6 of the logical block 71B. Thereafter, when the pre-log is written in all pages in the block p6, the pre-log is stored by using the next block p7. When the post-log is written in all pages in the block r6, the post-log is stored by using the next block r7. The pre-log is stored in order from a top page in the block p7 and the post-log is stored in order from a top page in the block r7.

Further, when the pre-log is written in all pages in the block p7, the pre-log is stored by using the block q0 as a first block of the next logical block 72A for a pre-log. When the post-log is written in all pages in all pages in the block r7, the post-log is stored by using the block s0 as a first block of the next logical block 72B for a post-log. The pre-log is stored in order from a top page in the block q0 and the post-log is stored in order from a top page in the block s0.

Further, the pre-log is stored in the logical block 72A for a pre-log and the post-log is stored in the logical block 72B for a post-log. When the pre-log is written in all pages in the logical block 72A and the post-log is written in all pages in the logical block 72B, the pre-log and the post-log are stored by using the next block for a pre-log (not shown) and the next logical block for a post log (not shown).

In this case, for example, when information stored as the pre-log and information stored as the post-log are the same, if it can be confirmed that the information in the pre-log and information in the post-log is the same, it is possible to open (erase) one of the pre-log and the post-log. For example, when the logical blocks 71B and 72B for a post-log are entirely filled with the post-log, by storing the logical blocks 71A and 72A for the pre-log it is possible to open the logical blocks 71B and 72B for the post-log. When the logical blocks 71A and 72A for a pre-log are entirely filled with the pre-log, by storing the logical blocks 71B and 72B for the post-log it is possible to open the logical blocks 71A and 72A for the pre-log.

As explained above, the logical blocks 71A and 72A for a pre-log and the logical blocks 71B and 72B for a post-log are logical blocks that can actuate the channels 120A to 120D in parallel and perform data reading and writing using two channels among the channels 120A to 120D. Therefore, it is possible to perform opening and erasing of the blocks at high speed.

On the other hand, as shown in FIG. 31B, when the blocks for a pre-log and a post-log are stored in one logical block in a mixed state, each of the blocks needs to be opened when opening (erasing) of the logs is performed. Therefore, opening processing cannot be performed at high speed.

As explained above, according to the sixth embodiment, because the logical block in which the pre-log is stored and the logical block in which the post-log is stored are different, it is possible to perform opening and erasing of a logical block using a plurality of planes while actuating a plurality of channels in parallel. Therefore, it is possible to open and erase an unnecessary logical block at high speed.

Seventh Embodiment

A seventh embodiment of the present invention is explained below with reference to FIGS. 32 to 36. In the seventh embodiment, information stored as a pre-log and information stored as a post-log by a memory system are the same information. When abnormal isolation (e.g., a short break) of a power supply or the like occurs, the memory system is restored to a state before the abnormal isolation of the power supply by using a log not broken by the abnormal isolation of the power supply of the stored pre-log and post-log. In the following explanation of the seventh embodiment, the abnormal isolation of the power supply is a short break).

Figure 32:
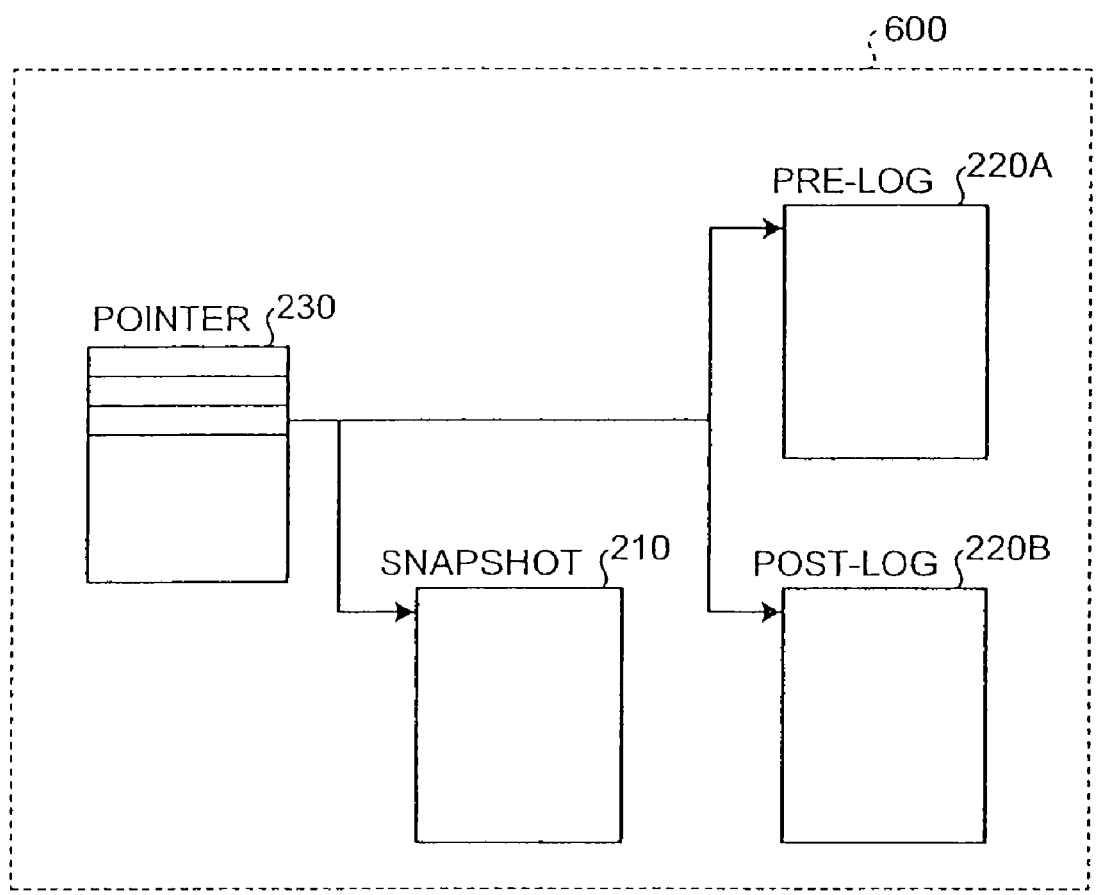
FIG. 32 is a schematic diagram of an example of contents of management information storage information stored in a management information storage area according to a seventh embodiment of the present invention.

FIG. 32 is a schematic diagram of an example of contents of management information storage information 600 stored in a management information storage area according to the seventh embodiment. Among components shown in FIG. 32, components same as those of the management information storage information 200 according to the first embodiment shown in FIG. 8 are denoted by the same reference numerals and signs. Redundant explanation is omitted.

The pointer 230 indicates the position of the snapshot 210, the position of the pre-log 220A acquired first after storage of the snapshot 210, and the position of the post-log 220B acquired first after storage of the snapshot 210.

The pre-log 220A and the post-log 220B are stored in log storing blocks, respectively. The pre-log 220A and the post-log 220B are continuously written in the same log storing blocks even if a generation of a snapshot changes.

Figure 33:
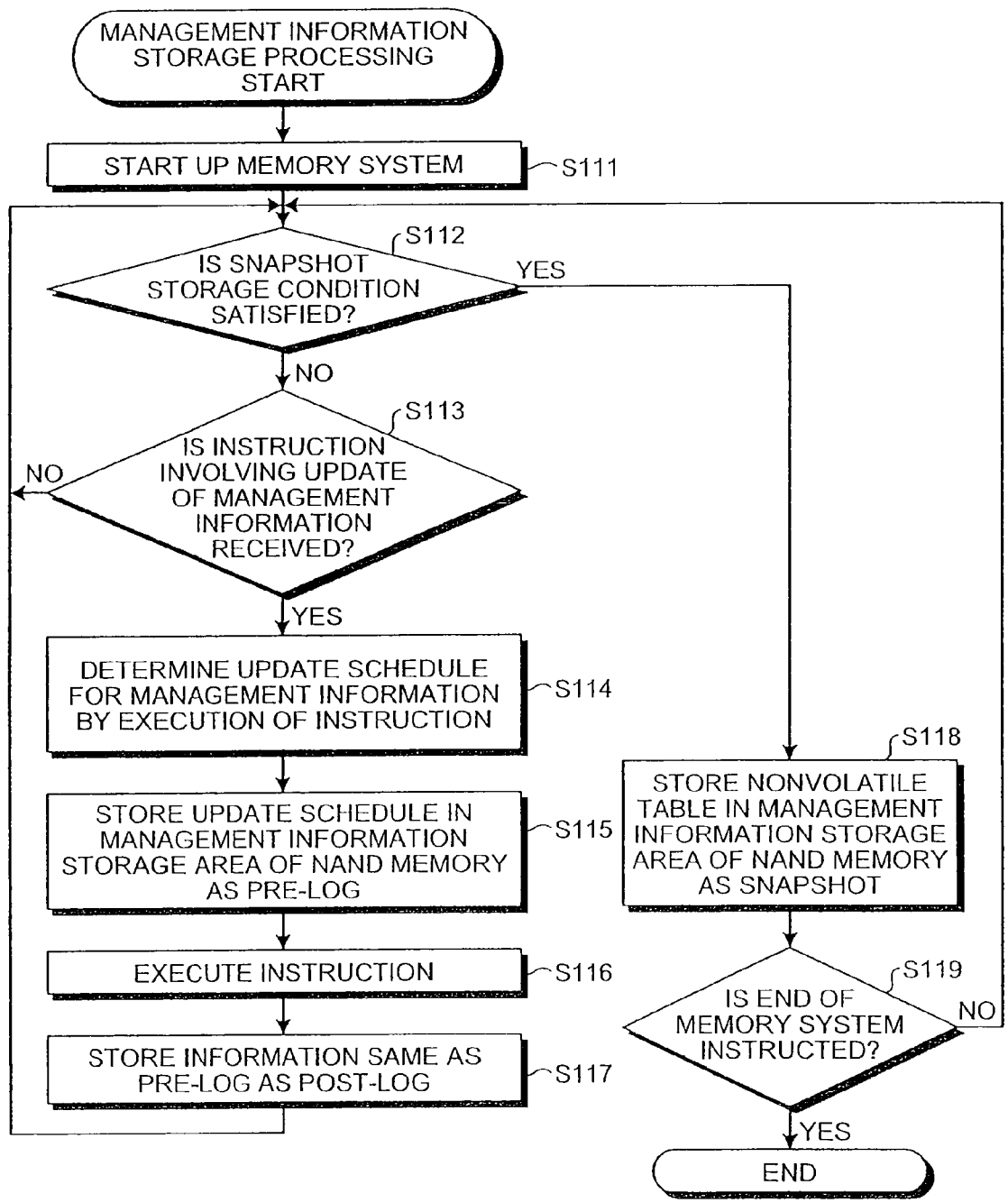
FIG. 33 is a flowchart of an example of a storage processing procedure for management information performed by a memory system according to the seventh embodiment.
Figure 34:
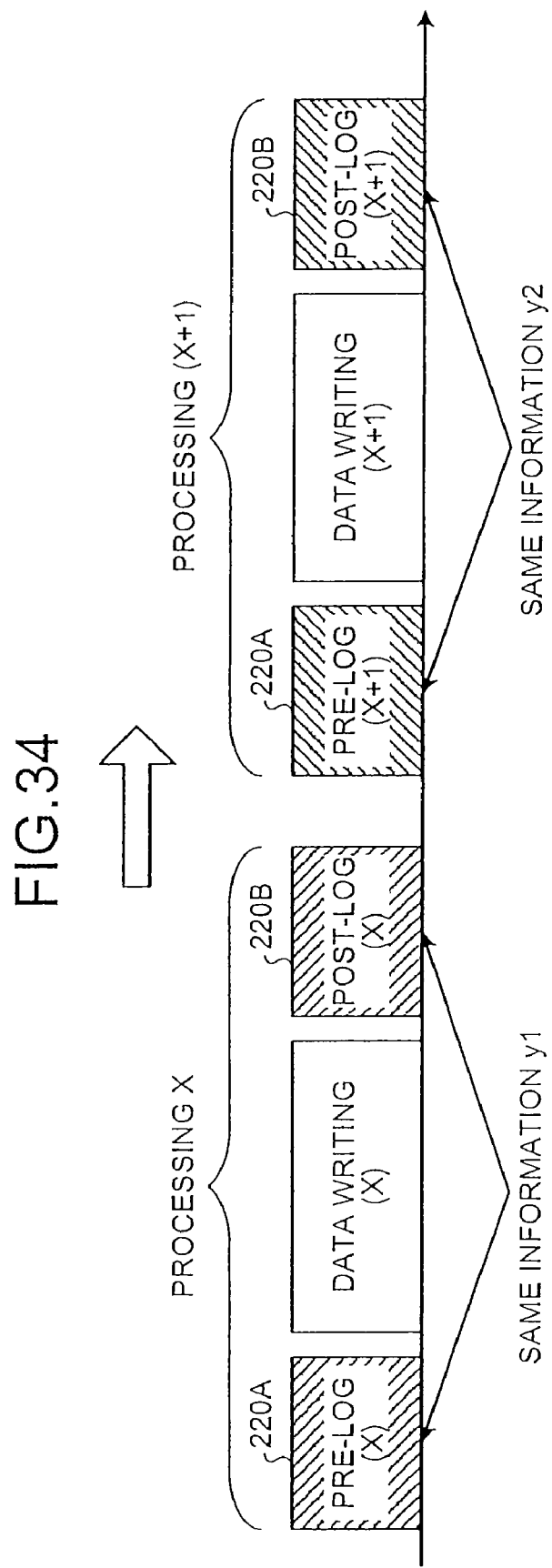
FIG. 34 is a diagram for explaining a storage processing for a pre-log and a post-log performed by the memory system according to the seventh embodiment.

Storage processing for management information of the memory system 10 performed by the management-information managing unit 152 is explained below. FIG. 33 is a flowchart of an example of a storage processing procedure for management information of the memory system 10 according to the seventh embodiment. FIG. 34 is a diagram for explaining storage processing for a pre-log and a post-log of the memory system 10 according to the seventh embodiment. The memory system 10 is connected to a host apparatus and operates as a secondary storage device of the host apparatus. The host apparatus (the memory system 10) is a startup state. The snapshot 210 is stored before the stop of the memory system 10 before the startup state.

First, the host apparatus (the memory system 10) is in a started state based on the snapshot 210 stored at the last end of the host apparatus (the memory system 10) (Step S111). Thereafter, writing of data in the NAND memory 12 is performed from the host apparatus when necessary. The management-information managing unit 152 determines whether the snapshot storage condition explained in (1) to (3) above is satisfied (Step S112). When the snapshot storage condition is not satisfied ("No" at Step S112), the management-information managing unit 152 determines whether an instruction involving update of the management information (writing of data, etc.) is received (Step S113). When the instruction involving update of the management information is not received ("No" at Step S113), the management-information managing unit 152 returns to Step S112.

When the instruction involving update of the management information is received ("Yes" at Step S113), the management-information managing unit 152 determines an update schedule indicating how the management information is to be updated by execution of the instruction (Step S114). The management-information managing unit 152 stores the update schedule in the log storing block of the management information storage area 126 of the NAND memory 12 as the pre-log 220A (Step S115).

When the pre-log 220A has not been stored in a log storing block, the update schedule (the pre-log) is difference information between a nonvolatile table at the time when the management information is updated and the snapshot 210 stored in a snapshot storing block. When the pre-log 220A (the pre-log 220A in the past) is already stored in the log storing block, the update schedule (the pre-log) is difference information between the nonvolatile table at the time when the management information is updated and a combination of the snapshot 210 and the pre-log 220A in the past. For example, as shown in FIG. 34, before data writing (X) is performed as writing processing for Xth data, a pre-log (X) corresponding to the data writing (X) is stored in the NAND memory 12 as the pre-log 220A. For example, information y1 is stored as the pre-log 220A. The pre-log 220A is stored in the management information storage area 126 of the NAND memory 12, for example, after the pre-log 220A (the update schedule) is recorded on the DRAM 11.

Subsequently, a logical NAND management layer 32 executes the instruction received at Step S113 (Step S116). As an example of such an instruction, there is writing processing for user data in a predetermined block of the data storage area of the NAND memory 12. Specifically, data writing (X) in the data storage area 125 in the NAND memory 12 is performed.

Thereafter, the management information stored in the DRAM 11 is updated according to the executed processing. The management-information storing unit 154 stores the updated information in the management information in the management information storage area 126 of the NAND memory 12 as the post-log 220B (Step S117). When the post-log 220B is not stored in the log storing block, the post-log 220B is difference information between the nonvolatile table at the present point and the snapshot 210 stored in the snapshot storing block. When the post-log 220B (the post-log 220B in the past) is already stored in the log storing block, the post-log 220B is difference information between the non volatile table at the present point and a combination of the snapshot 210 and the log in the past.

Consequently, the post-log 220B(X) corresponding to the data writing (X) is stored in the NAND memory 12 as the post-log 220B. For example, information y1 is stored as the post-log 220B. The information y1 stored as the post-log 220B is the same as the information y1 stored as the pre-log 220A. The post-log 220B is stored in the management information storage area 126 of the NAND memory 12, for example, after the post-log 220B is recorded on the DRAM 11. Thereafter, the management-information managing unit 152 returns to Step S112.

When the snapshot storage condition is not satisfied ("No" at Step S112) and the instruction involving update of the management information is received ("Yes" at Step S113), the processing at Steps S114 to S117 is repeated. Specifically, in the same manner as the writing processing for the Xth data, writing processing for (X+1)th data is performed. Before data writing (X+1) is performed as the writing processing for the (X+1)th data, a pre-log (X+1) corresponding to the data writing (X+1) is stored in the NAND memory 12 as the pre-log 220A. As the pre-log 220A, for example, information y2 is stored. The data writing (X+1) is performed in the data storage area 125 in the NAND memory 12. Further, a post-log (X+1) corresponding to the data writing (X+1) is stored in the NAND memory 12 as the post-log 220B. As the post-log 220B, for example, information y2 is stored. The information y2 stored as the post-log 220B is the same as the information y2 stored as the pre-log 220A.

When the snapshot storage condition is satisfied at Step S112 ("Yes" at Step S112), the management information including at least the nonvolatile table in the management information storage area 111 of the DRAM 11 is stored in the management information storage area 126 of the NAND memory 12 as the snapshot 210 (Step S118). The management-information managing unit 152 determines whether the end of the memory system 10 is instructed (Step S119). When the end of the memory system 10 is not instructed, the management-information managing unit 152 returns to Step S112. When the end of the memory system 10 is instructed, the processing is directly finished.

Figure 35:
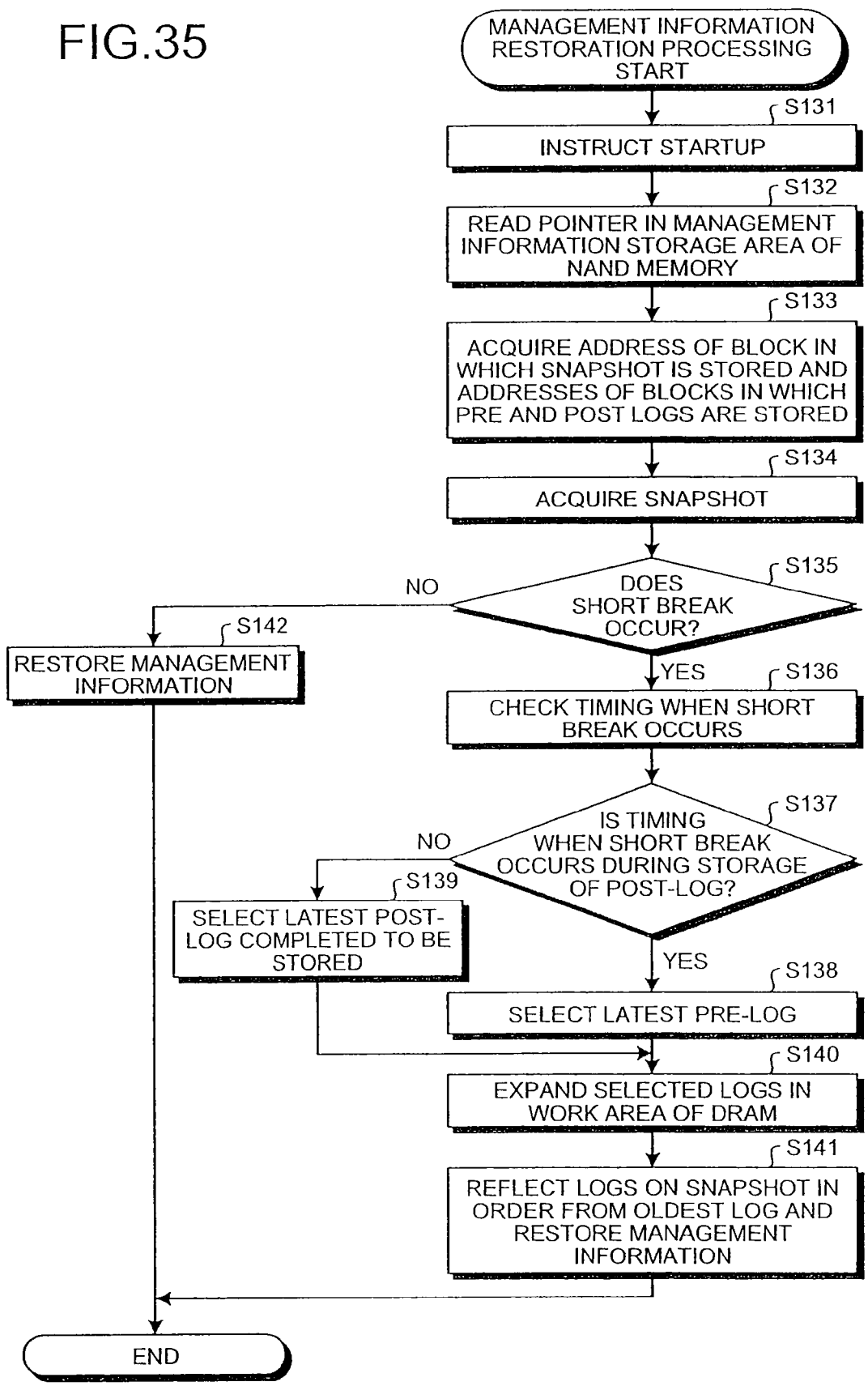
FIG. 35 is a flowchart of an example of a restoration processing procedure for management information performed by the memory system according to the seventh embodiment.
Figure 36:
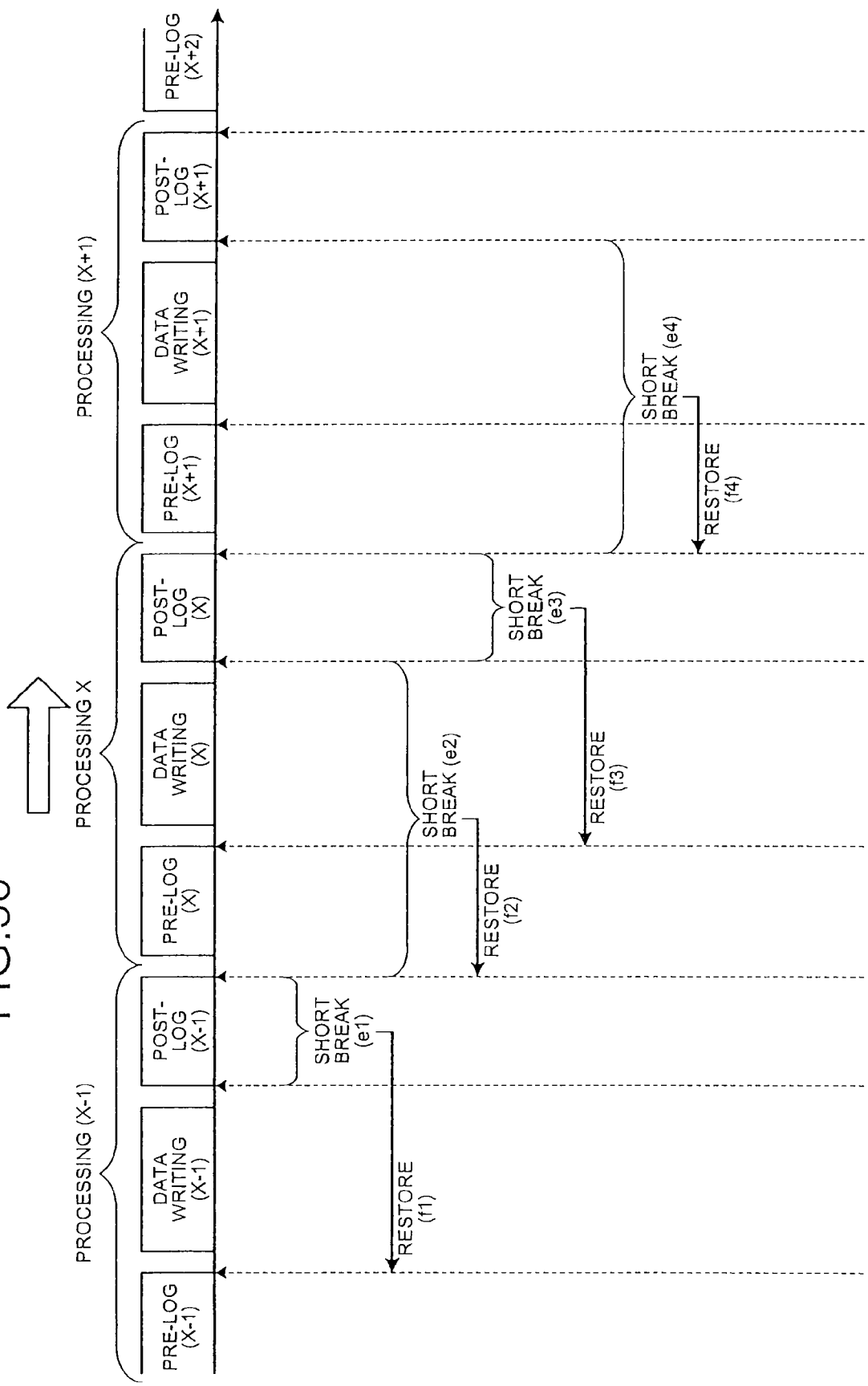
FIG. 36 is a diagram for explaining restoration processing of the memory system according to the seventh embodiment.

Restoration processing for management information of the memory system 10 performed by the management-information restoring unit 155 is explained below. FIG. 35 is a flowchart of an example of a restoration processing procedure for management information of the memory system 10 according to the seventh embodiment. FIG. 36 is a diagram for explaining restoration processing of the memory system 10 according to the seventh embodiment. The memory system 10 is connected to the host apparatus and operates as the secondary storage device of the host apparatus.

The power supply of the host apparatus is turned on according to, for example, recovery from a short break and a startup instruction is issued to the memory system 10 (Step S131). The management-information restoring unit 155 reads the pointer 230 in the management information storage area 126 of the NAND memory 12 (Step S132) and acquires an address of a block in which the snapshot 210 is stored and addresses of blocks in which the pre and post logs (the pre-log 220A and the post-log 220B) are stored (Step S133). Subsequently, the management-information restoring unit 155 reads the snapshot 210 from the address in the NAND memory 12 acquired at Step S133 and restores the snapshot 210 in the management information storage area 111 of the DRAM 11 (Step S134).

Thereafter, the management-information restoring unit 155 determines whether a short break has occurred referring to the pre-log 220A and the post-log 220B in the NAND memory 12 (Step S135). The determination on whether a short break has occurred can be performed by, for example, comparing the pre-log 220A and the post-log 220B. In the seventh embodiment, the pre-log 220A and the post-log 220B store the same information. Therefore, for example, when the number of pages stored as the pre-log 220A and the number of pages stored as the post-log 220B do not coincide with each other, it is possible to determine that a short break has occurred. The occurrence of the short break can be determined based on presence or absence of an ECC error, data of a page stored as the pre-log 220A, and data of a page stored as the post-log 220B.

When the management-information restoring unit 155 determines that the short break has occurred ("Yes" at Step S135), the management-information restoring unit 155 checks, based on a latest pre-log 220A and a latest post-log 220E in the NAND memory 12, timing when the short break has occurred (Step S136). The management-information restoring unit 155 determines whether the timing when the short break occurs is during storage of the post-log 220B (Step S137). For example, when a last page in the post-log 220B is being written, this last page cannot be read out. Therefore, it is determined that the short break occurs during storage of the post-log 220B. When a last page in the pre-log 220A is being written, this last page cannot be read out. Therefore, it is determined that the short break occurs during storage of the pre-log 220A. When a log is written in the last page in the pre-log 220A and a log is not written in the past page in the post-log 220B, it is determined that the short break occurs during writing of data.

When the management-information restoring unit 155 determines that the timing when the short break has occurred is during storage of the post-log 220B ("Yes" at Step S137), the management-information restoring unit 155 selects the latest pre-log 220A (Step S138). On the other hand, when the management-information restoring unit 155 determines that the timing when the short break has occurred is not during storage of the post-log 220B ("No" at Step S137), the management-information restoring unit 155 selects the latest post-log 220B completed to be stored (Step S139). In other words, when the last page in the pre-log 220A are being written or when a log is written in the last page in the pre-log 220A and a log is not written in the last page in the post-log 220B, the latest post-log 220B is selected.

Specifically, as shown in FIG. 36, when a short break (e1) occurs during storage of a post-log (X−1) corresponding to processing (X−1), because data writing (X−1) is completed, the management-information restoring unit 155 determines that the processing (X−1) is completed. The management-information restoring unit 155 selects a pre-log (X−1) as a latest pre-log.

When a short break (e2) occurs during a period after storage of the post-log (X−1) until the start of storage of a post-log X, because data writing X is not completed, the management-information restoring unit 155 determines that the processing X is not completed. The management-information restoring unit 155 selects the post-log (X−1) as a latest post-log completed to be stored.

Similarly, when a short break (e3) occurs during storage of the post-log X corresponding to the processing X, because the data writing X is completed, the management-information restoring unit 155 determines that the processing X is completed. The management-information restoring unit 155 selects a pre-log X.

Further, when a short break (e4) occurs in a period after storage of the post-log X until the start of storage of a post-log (X+1), because data writing (X+1) is not completed, the management-information restoring unit 155 determines that processing (X+1) is not completed. The management-information restoring unit 155 selects the post-log X as a latest post-log completed to be stored.

Thereafter, the management-information restoring unit 155 acquires a first log to a latest log of the selected one of the pre-log 220A and the post-log 220B from the log storing block and expands the logs in the work area 112 of the DRAM 11 (Step S140). The management-information restoring unit 155 reflects the logs on the snapshot 210 in order from an oldest one and restores the management information (the nonvolatile table) (Step S141). The restoration processing for the management information is finished.

For example, when the pre-log (X−1) is selected, the management-information restoring unit 155 reflects logs in the pre-log (X−1) on the snapshot 210 in order from an oldest log and restores the management information (process f1). When the post-log (X−1) is selected, the management-information restoring unit 155 reflects logs in the post-log (X−1) on the snapshot 210 in order from an oldest log and restores the management information (process f2).

When the log X is selected, the management-information restoring unit 155 reflects a first pre-log to the pre-log X on the snapshot 210 in order from an oldest log and restores the management information (t3). When the post-log X is selected, the management-information restoring unit 155 reflects a first post-log to the post-log X on the snapshot 210 in order from an oldest log and restores the management information (process f4).

On the other hand, when the management-information restoring unit 155 determines that a short break has not occurred ("No" at Step S135), the management-information restoring unit 155 restores the management information from the snapshot 210 restored in the management information storage area 111 of the DRAM 11 at Step S134 (Step S142). The restoration processing is finished.

The management-information restoring unit 155 can select, regardless of presence or absence of breakage of logs due to a short break, one of the pre-log 220A and the post-log 220B and restore the management information based on the number of pages stored as the pre-log 220A and the number of pages stored as the post-log 220B. For example, when the number of pages stored as the pre-log 220A and the number of pages stored as the post-log 220B are the same, the management-information restoring unit 155 selects the pre-log 220A and restores the management information. When the number of pages stored as the pre-log 220A is larger than the number of pages stored as the post-log 220B, the management-information restoring unit 155 selects the post-log 220B and restores the management information.

In the example explained above, the DRAM is used as the first storing unit. However, other volatile semiconductor storage devices, or nonvolatile semiconductor storage devices, can be used. The post-log stored in the NAND memory 12 by the memory system 10 is not limited to a log itself and only has to be information same as the pre-log. Therefore, for example, information obtained by copying the pre-log can be stored as the post-log.

As explained above, according to the seventh embodiment, even when a short break occurs in the memory system 10 in which data is stored by the memory cell transistor of the multi-value memory, because the same information (difference information) is stored in the pre-log 220A and the post-log 220B, at least one of the pre-log 220A and the post-log 220B is not broken because of the short break. Therefore, at whichever timing the short break occurs, it is possible to easily reset the memory system 10 to a state before the short break occurs by using any one of the pre-log 220A and the post-log 220B.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A memory system comprising:
a nonvolatile memory including a plurality of blocks, each one of the plurality of blocks being a unit of data erasing and including a plurality of pages, each one of the plurality of pages being a unit of data programming;
a volatile memory capable of storing management information, the management information including a storage position of data stored in the nonvolatile memory; and
a management information writing unit configured to update, when the storage position of data is changed in the nonvolatile memory, the management information stored in the volatile memory;
a management information storing unit configured to:
before writing data to the nonvolatile memory, store a first log including an update schedule of the management information in the nonvolatile memory; and
after writing data to the nonvolatile memory, store a second log including an update result of the management information in the nonvolatile memory, wherein
the management information storing unit is configured to store the first log and the second log in the same-numbered page of two different blocks.

2. The memory system according to claim 1, wherein the management information storing unit is configured to, when a predetermined condition is satisfied, store the management information as a snapshot in the nonvolatile memory.

3. The memory system according to claim 2, wherein the predetermined condition includes that an amount of the first log and the second log is larger than a threshold.

4. The memory system according to claim 2, further comprising a management information restoring unit configured to restore the management information on the volatile memory based on the snapshot and at least one of the first log and the second log.

5. The memory system according to claim 4, further comprising a log releasing unit configured to invalidate the first log and the second log when the management information has been stored in the nonvolatile memory.

6. The memory system according to claim 1, wherein the first log and the second log are difference information before and after, respectively, updating the management information.

7. The memory system according to claim 1, wherein contents of the first log and the second log are identical to each other.

8. The memory system according to claim 1, wherein data sizes of the first log and the second log are identical to each other.

9. The memory system according to claim 1, wherein each one of the plurality of pages includes a plurality of memory cells, each one of the plurality of memory cells is capable of storing multiple bits.

10. The memory system according to claim 1, wherein the nonvolatile memory includes a plurality of memory chips, and the two different blocks belong to two different memory chips respectively.

11. A method of controlling a memory system comprising:
writing data to a nonvolatile memory, the nonvolatile memory including a plurality of blocks, each one of the plurality of blocks being a unit of data erasing and including a plurality of pages, each one of the plurality of pages being a unit of data programming;
storing management information in a volatile memory, the management information including a storage position of data stored in the nonvolatile memory;
updating, when the storage position of data is changed in the nonvolatile memory, the management information stored in the volatile memory;
before writing data to the nonvolatile memory, storing a first log including an update schedule of the management information in the nonvolatile memory; and
after writing data to the nonvolatile memory, storing a second log including an update result of the management information in the nonvolatile memory, wherein
the first log and the second log are stored in the same-numbered page of two different blocks.

12. The method according to claim 11, further comprising storing, when a predetermined condition is satisfied, the management information as a snapshot in the nonvolatile memory.

13. The method according to claim 12, the predetermined condition includes that an amount of the first log and the second log is larger than a threshold.

14. The method according to claim 13, further comprising restoring the management information on the volatile memory based on the snapshot and at least one of the first log and the second log.

15. The method according to claim 14, further comprising invalidating the first log and the second log when the management information has been stored in the nonvolatile memory.

16. The memory according to claim 11, wherein the first log and the second log are difference information before and after, respectively, updating the management information.

17. The method according to claim 11, wherein contents of the first log and the second log are identical to each other.

18. The method according to claim 11, wherein data sizes of the first log and the second log are identical to each other.

19. The method according to claim 11, wherein each one of the plurality of pages includes a plurality of memory cells, each one of the plurality of memory cells is capable of storing multiple bits.

20. The method according to claim 11, wherein the non-volatile memory includes a plurality of memory chips, and the two different blocks belong to two different memory chips respectively.

* * * * *